(12) United States Patent
Lee et al.

(10) Patent No.: US 6,784,020 B2
(45) Date of Patent: Aug. 31, 2004

(54) PACKAGE STRUCTURE AND METHOD FOR MAKING THE SAME

(75) Inventors: Chengkuo Lee, Hsinchu (TW); Yi-Mou Huang, Hsinchu (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 0 days.

(21) Appl. No.: 10/283,129

(22) Filed: Oct. 30, 2002

(65) Prior Publication Data

US 2004/0087043 A1 May 6, 2004

(30) Foreign Application Priority Data

Oct. 30, 2001 (TW) .......................................... 90126949

(51) Int. Cl.[7] .......................... H01L 21/48; H01L 21/50
(52) U.S. Cl. ........................ 438/106; 438/126; 438/974
(58) Field of Search ................................ 438/106, 107, 438/112, 118, 119, 124, 126, 974, 975

(56) References Cited

U.S. PATENT DOCUMENTS 6,455,167 B1 * 9/2002 Rigney et al.

* cited by examiner

Primary Examiner—Phuc T. Dang
(74) Attorney, Agent, or Firm—Troxell Law Office PLLC

(57) ABSTRACT

A package structure and method for making devices of system-in-a-package (SiP). Substrates with integrated and assembled elements can be aligned and pre-bonded together, and fluidic encapsulating materials is applied to seal the rest opening of pre-bonded interface of substrates. Three dimensional and protruding microstructures, elements, and MFMS devices can be accommodated and protected inside a spatial space formed by the bonded substrates. By applying the technologies of flip-chip, chip-scale-packaging, and wafer-level-packaging in conjunction with present invention, then plural elements and devices can be packaged together and become a system device in wafer-level-system-in-a-package (WLSiP) format.

63 Claims, 60 Drawing Sheets

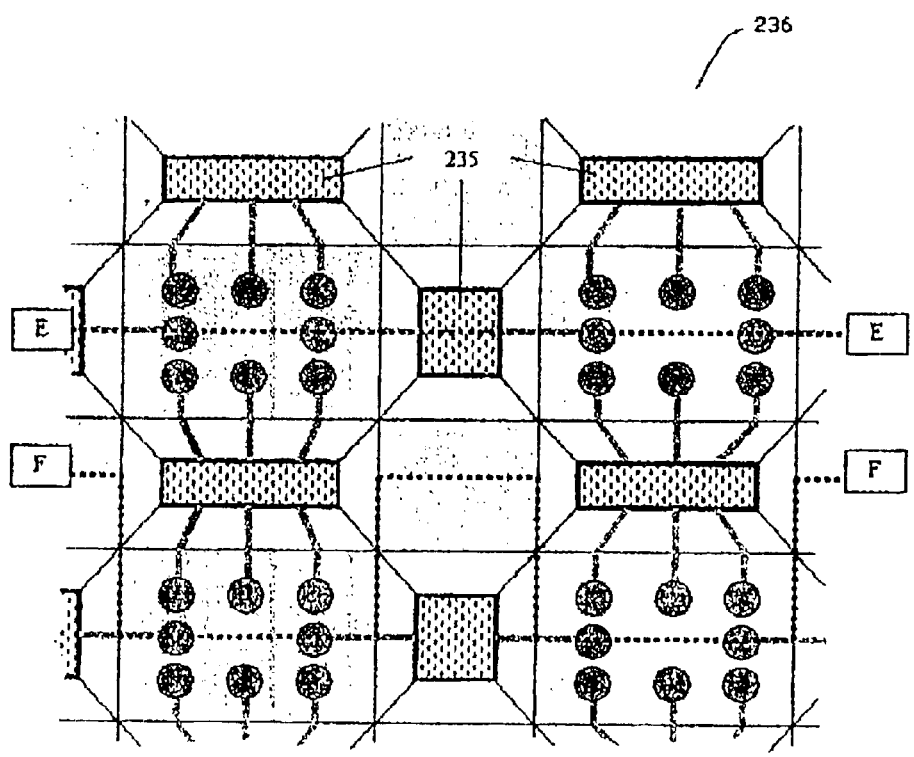
Fig. 2u-3
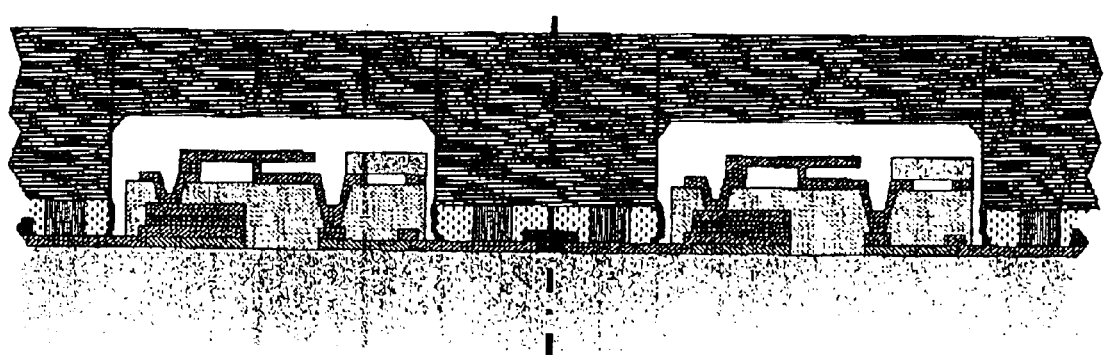
Fig. 2u-4, cross-section F-F

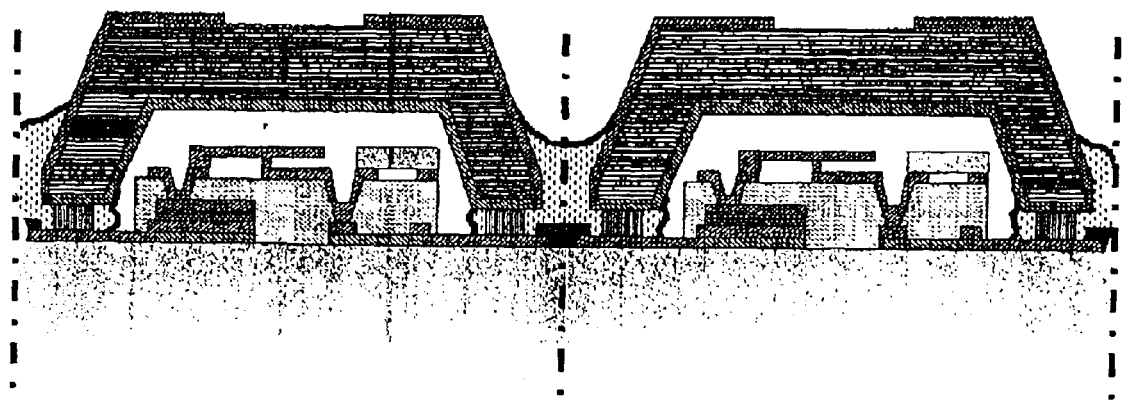
Fig. 2u-5, cross-section E-E

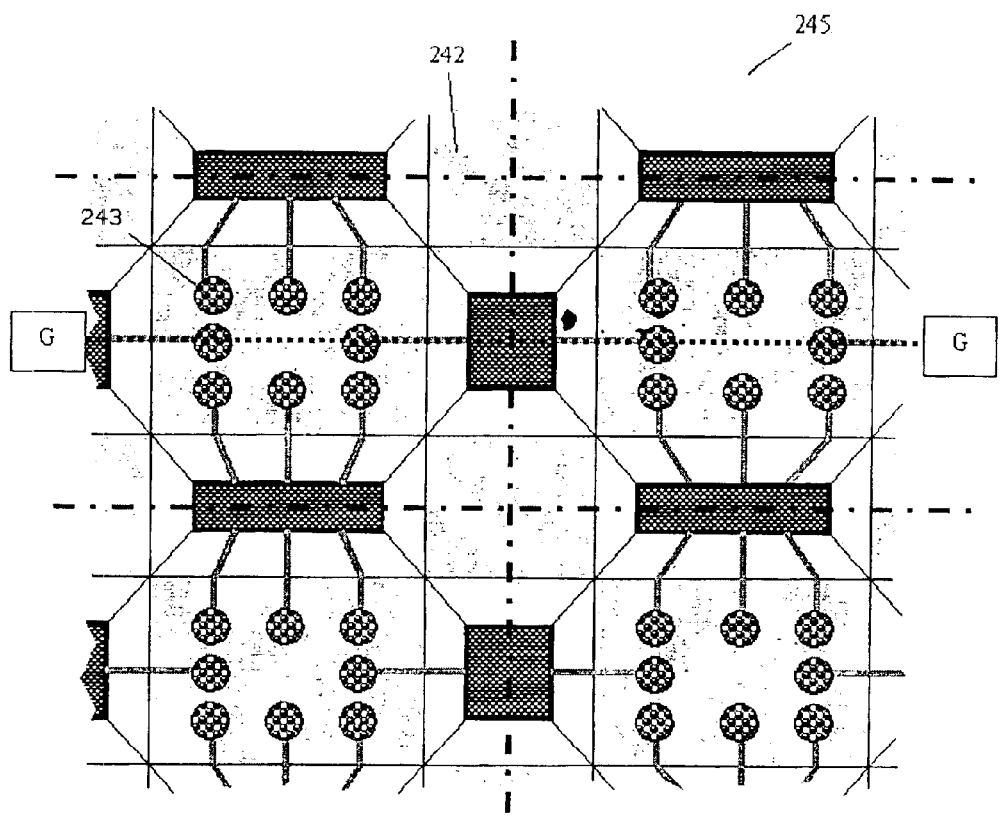
Fig. 2x
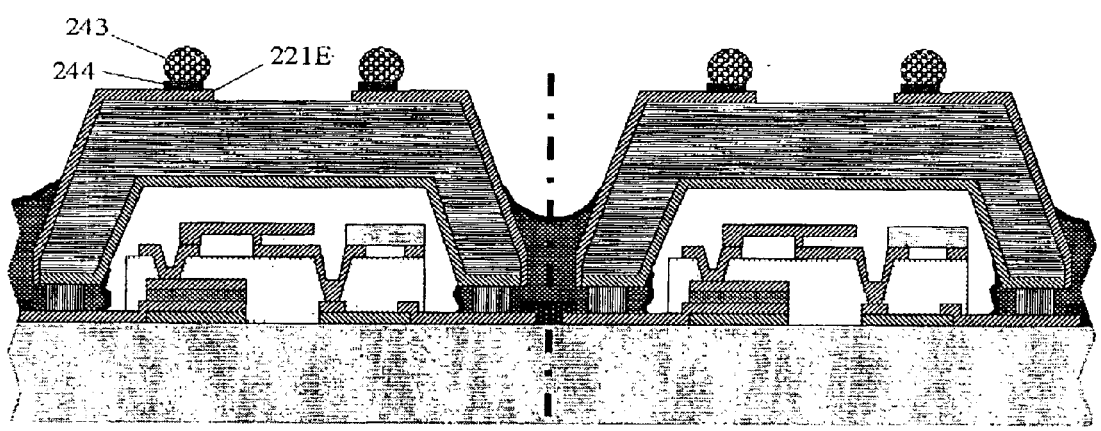
Fig. 2x-1, cross-section G-G

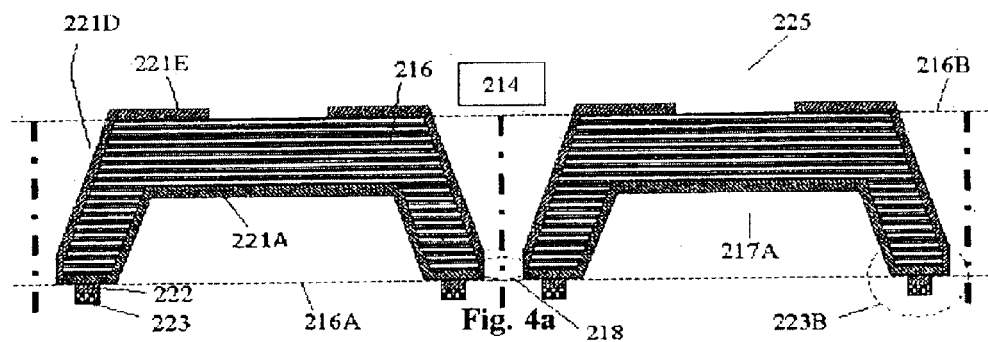
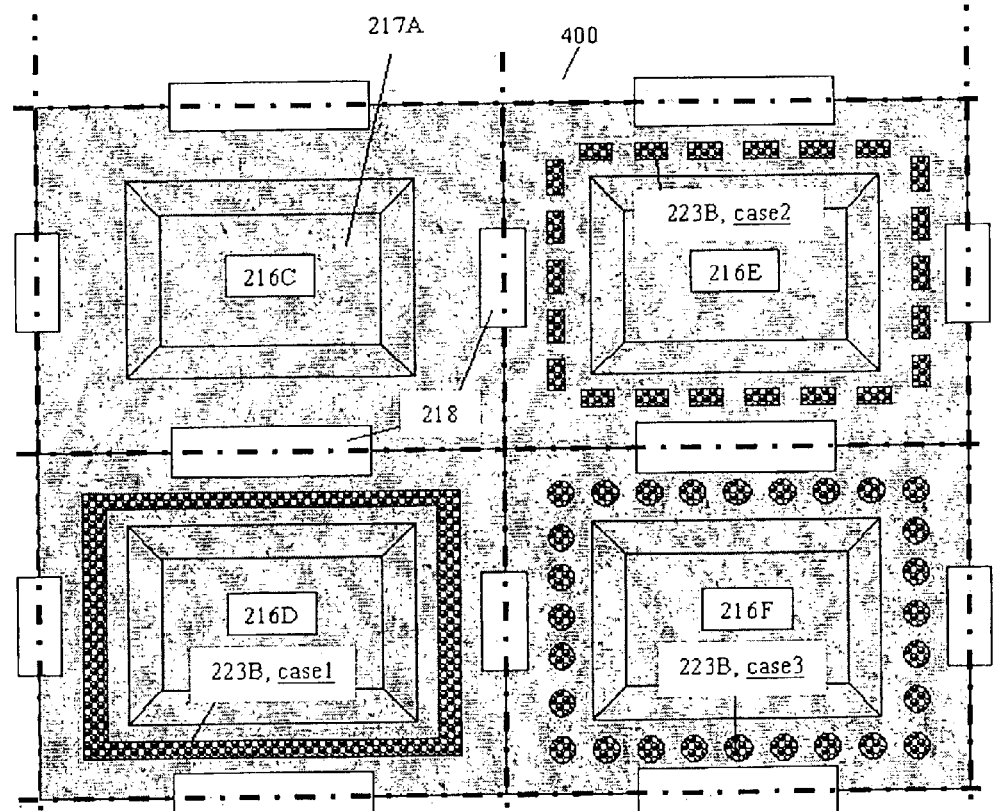
Fig. 4a
Fig. 4b

402A  Fig. 4k  402B

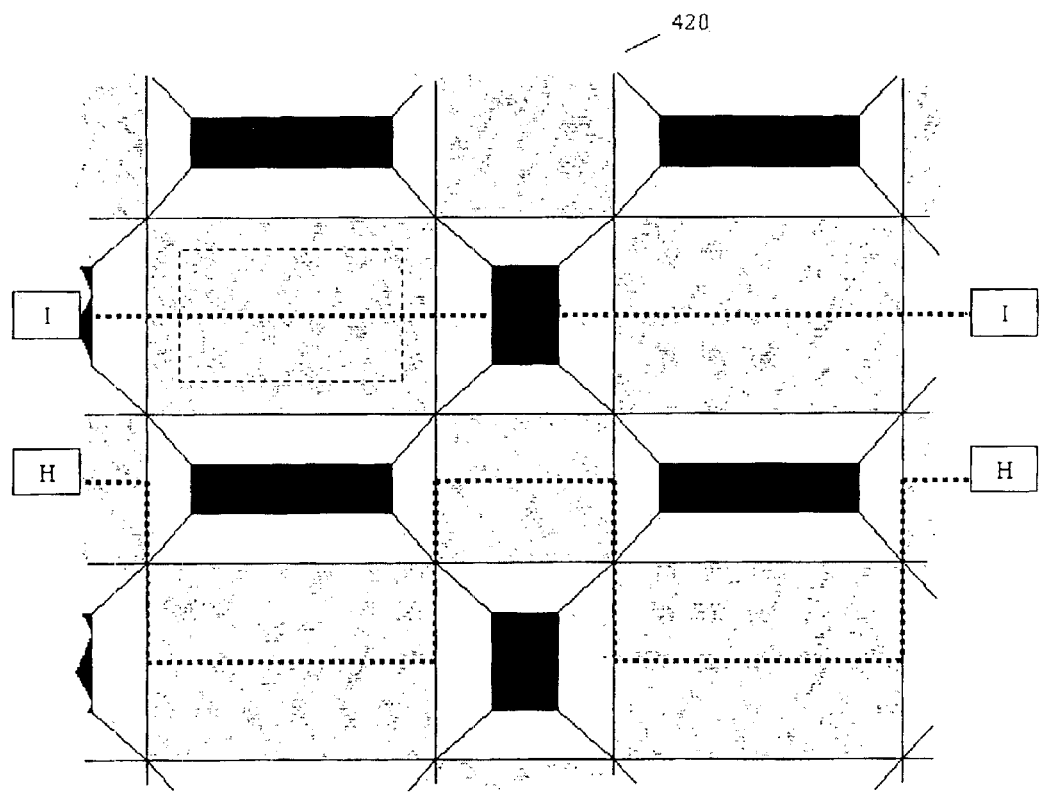
Fig. 4n-4
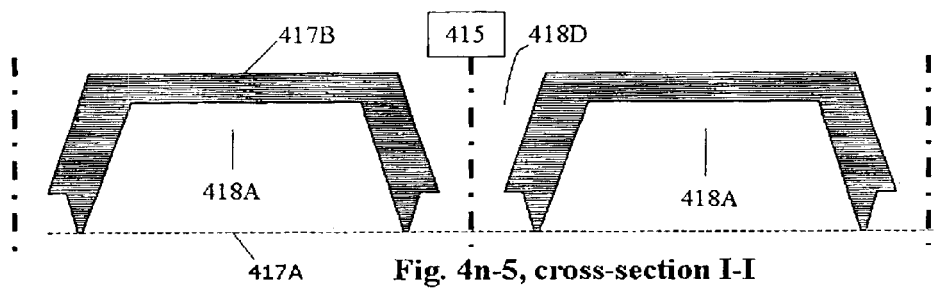
Fig. 4n-5, cross-section I-I
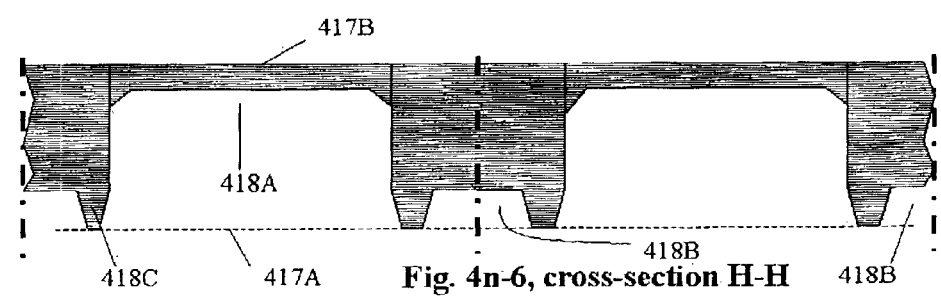
Fig. 4n-6, cross-section H-H

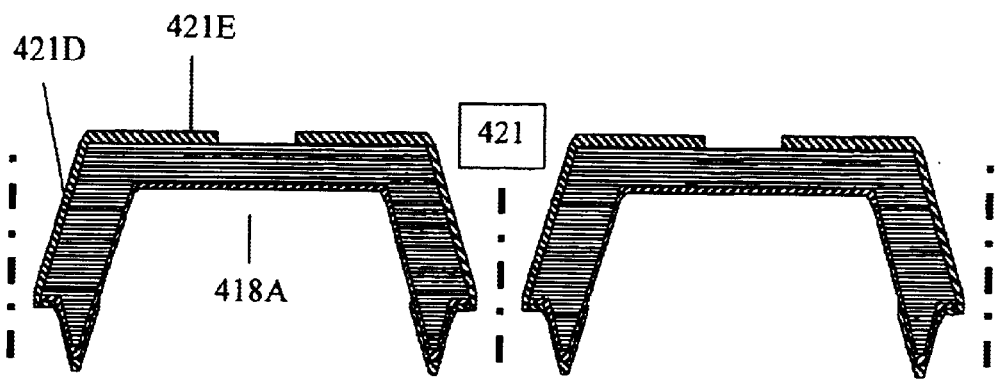
Fig. 4n-11, cross-section J-J
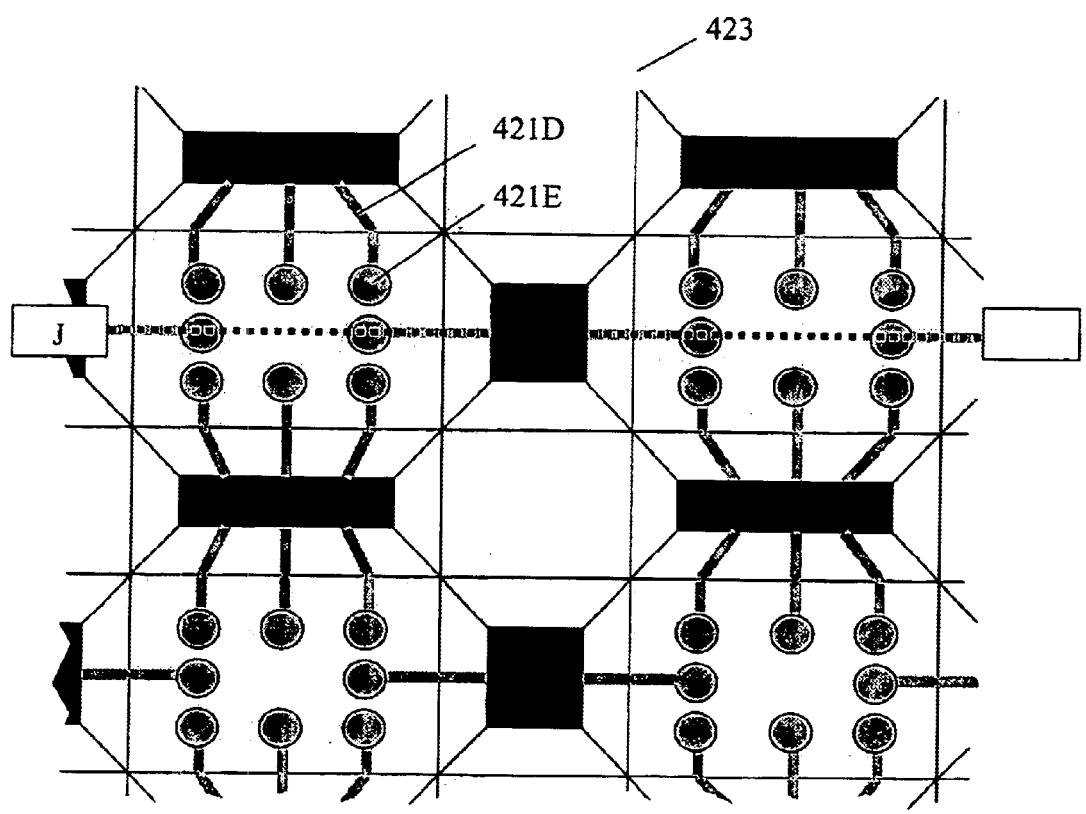
Fig. 4n-10

The cross-section of an InGaN LED

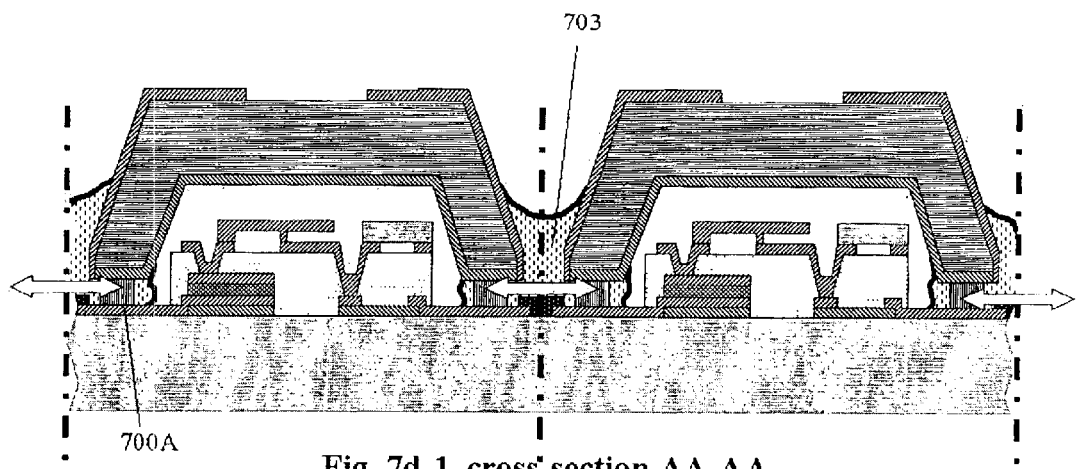
Fig. 7d-1, cross-section AA-AA
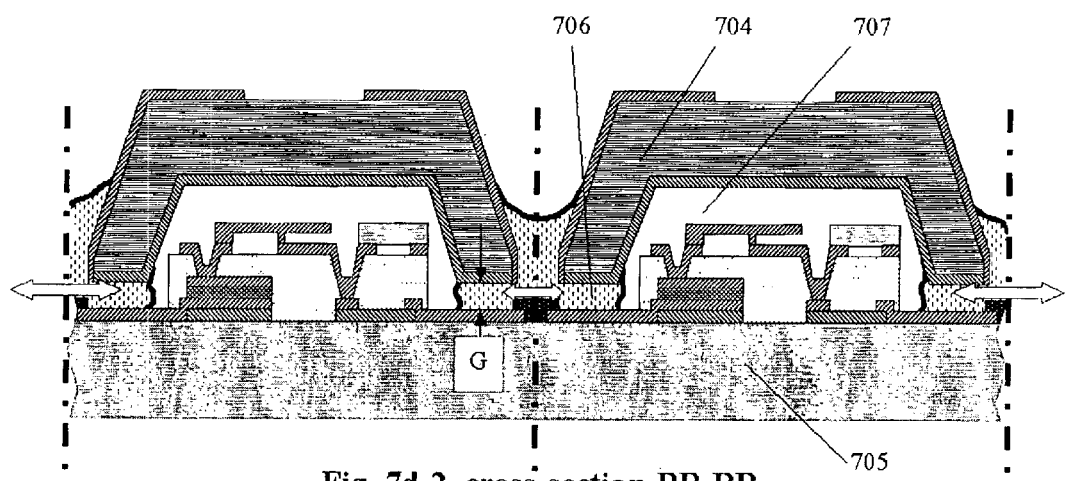
Fig. 7d-2, cross-section BB-BB

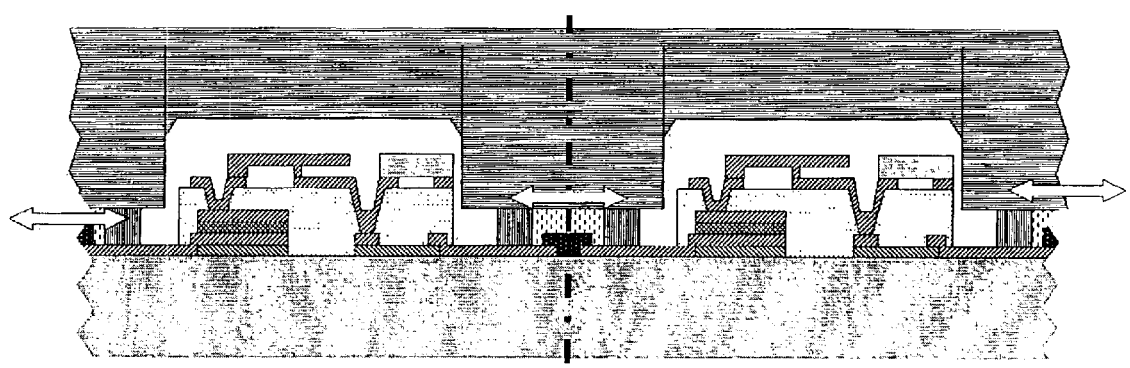
Fig. 7d-3, cross-section CC-CC
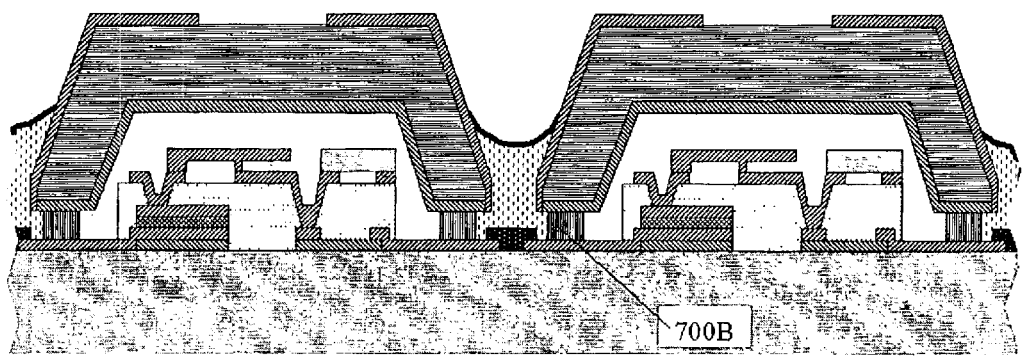
Fig. 7d-4, cross-section DD-DD

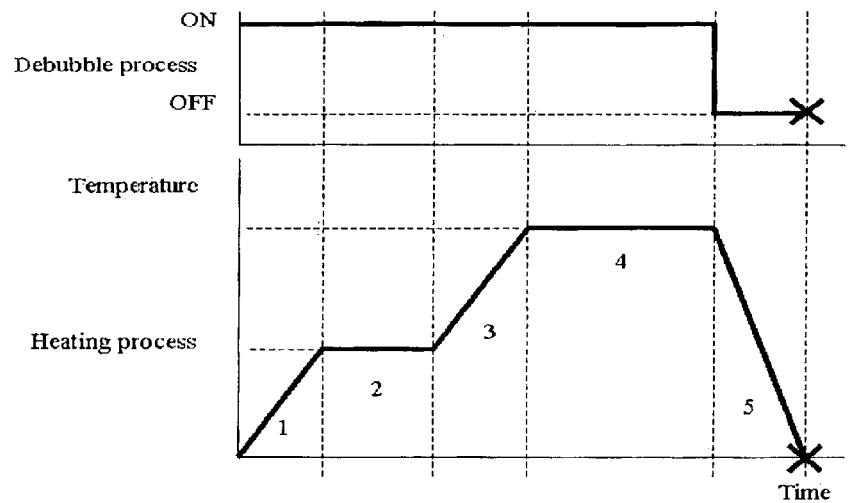
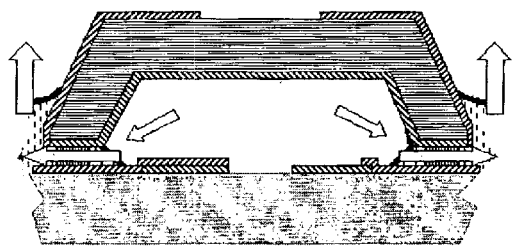
Fig. 7f-1
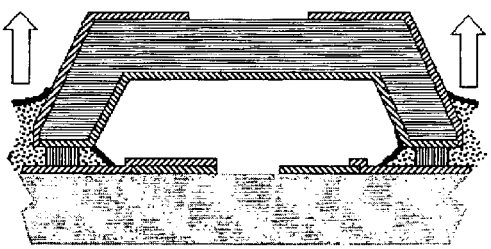
Fig. 7f-2
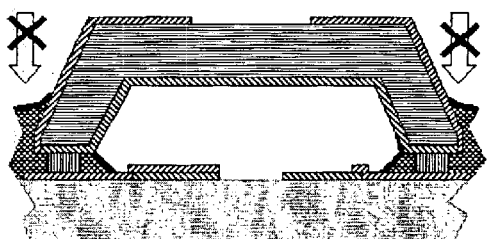
Fig. 7f-3
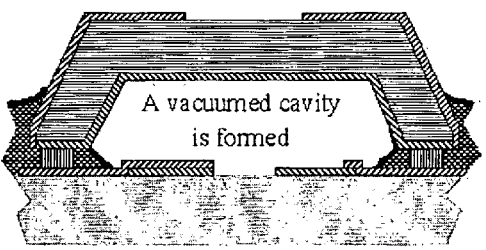
Fig. 7f-4

PACKAGE STRUCTURE AND METHOD FOR MAKING THE SAME

FIELD OF THE INVENTION

This invention relates in general to a packaged structure and method for making this structure, and more specifically to a package for devices of microelectronics, optoelectronics, microelectromechanical systems, microfluidic systems, micro-total-analysis-systems, bio-chip and micro-opto-electro-mechanical systems.

BACKGROUND OF THE INVENTION

As there is a tendency that the products are demanded to be lighter, smaller, and portable, the R&D trend of semiconductor, microelectronics, electronics and relative devices is toward miniaturization, higher integration, faster operation speed, and lower power consumption. Thus the packaging technology is required to provide devices and components to meet this trend. Among the packaging technologies, the wafer-level chip size packaging (WLCSP) or wafer-level chip scale packaging (WLCSP) is rather promising technology for fulfilling the miniaturization purpose, because the packaged CSP device size is only about 25% larger than the bare die size.

Due to the development of trend of aforementioned devices, the number of signal I/O (inputs and outputs) of device is increased, the density of interconnection is increased, and the line width of interconnection is reduced. Therefore, the surface mount technology (SMT) is developed in order to solve these problems. Such miniaturizing developments are developed from SOP, SOJ, SSOP, and to TSOP, and from QFP, LQFP, and to TQFP, etc. As the amount of the I/Os is keeping growth, the packaging size will be enlarged, and it is accompanied with many problems, such that non-wetting of soldering balls or the deformation/warpage of substrate. Reducing the packaged size as small as possible may solve these problems. Besides, the arrangement of I/Os location is moving from peripheral site only to all surface of the packaged device, it means there is more area to allocate the I/Os. The chip scale package (CSP) actually realizes these ideas.

Presently, there are over 50 kinds of chip-scale-package (CSP) products disclosed by over 16 semiconductor companies in the world. These CSPs are classified into four types base on the design concepts and package structures.

(1) Leadframe based CSPs: a package design that follows the concept of the LOC (lead on chip), of which the connection between the interposer and the dies is accomplished by wiring, and the area is reduced continuously until the size is achieved at the definition range of the CSP.

(2) CSPs with Rigid Substrate: there is a rigid substrate applied in between the bare die and the package housing structure, and it is used as a carrier; the material thereof mostly is a ceramics substrate or a rigid printed circuit board of polymer materials.

(3) CSPs with Flexible Substrate: the structure thereof is similar to the rigid substrate, but a soft substrate is used as a carrier instead; the common material is polyimide, and an elastomer is inserted between the die and the substrate in order to decrease the effect of the stress upon the devices; an arrangement—an area array—is used for rearranging the I/Os on one side of the soft carry board that opposite to the side without dies contacted thereon.

(4) Wafer-level CSPs: the external I/Os of the made devices thereof are fan-in arranged; the size of the made devices are almost the same as the size of the dies; the carrier substrate is usually a wafer; it is connected with the dies by the technique similar to that of the flip-chip, and no encapsulation process is needed, then the I/Os are rearranged as an area array on the side with dies thereon.

Besides, the flip-chip technology by die bonding or attaching chips with metal bumps onto substrate carrier, and underfilling polymer materials between the die and substrate spacing thereafter is invented to reduce the package size.

Again, as the increasing complexity of portable electronic systems, such as, mobile phone, PDA, and portable computer, etc., more functions are integrated into a single chip, thus the concept of system-on-chip (SoC) is generated. However, there are many difficulties of developing SoC, especially integrating various functions, of each are uniquely designed, having various data base, design rule, and intellectual properties (IP) from various companies, that usually takes a lot of time for integration and transformation. To have a SoC may be an ultimate goal, combining the state-of-the-art WLP and CSP technologies can make hybrid packaged ICs in rather small forms. In the other words, assembling two or more bare dies into various kinds of multichip modules (MCMs) and with final outlooks like a single packaged device, i.e., the system-in-a-package (SiP) approach. Especially the SiP approach may enable the dies to be tested in wafer-level, for example, the known good die (KGD) process. In the case of MCM and SiP, the wafer-level testing are further proceeded in order to promote the packaging yield and save the dispensable packaging cost. For the customers, by means of SiP, the cost and time for development of a system product are reduced, the performance are optimized as well.

According to the present situation of portable electronic devices, a lot of passive components are packaged into device together, these passive components or elements are like resistors, capacitors, and inductors. In order to shrink the size of packaged devices, two ways have been proposed, they are the passive devices made by low temperature co-firing ceramics (LTCC) process, and the integrated thin film passive devices (IPD). First of all, by using the conventional screen printing and sintering technology, the minimum feature size made by LTCC is around or above 50 ?m, and is hard to be controlled. It causes the made RF circuits can hardly show good high frequency performance in a repeatable and precise manner. Secondly the IPD is made normally by depositing and patterning the resistors, capacitors, and inductors materials on substrates, where these substrates are usually the wafer forms. The made RF module based on IPD will have smaller size and higher precised performance.

FIGS. 1a and 1b show an RF module in IPD (Integrated Passive Devices) format, fabricated by thin film process disclosed by Intarsia in the United States at the Systems Design Magazine on August 2000 and December 2000, respectively (see the reference materials [1], [2] and [3]). FIG. 1a shows the steps of forming the electrode. FIG. 1b shows the said RF module whose passive devices like inductor, capacitor, and resistor are made by the standard thin film process of IC industry. The formation of the thin film resistor, as shown in FIG. 1a, a resistance layer 11 is deposited and defined on the glass substrate 10, then a first conductive layer 12 is deposited and defined by etching or lift-off process. The first conductive layers 12 which are made onto both end of the resistance layer 11 are electrodes of resistor R. Thereafter a second isolation layer 15 is deposited and defined. Again, the formation of the integrated passive device is shown in FIG. 1b; a resistant layer 11 is deposited and defined on the substrate 10 firstly, then a first metal pattern 12 is deposited and defined by etching or the lift-off method. The first metal pattern 12 is the electrodes on the both ends of the resistor R. Then, a first dielectric layer 13 and a second metal pattern 14 is deposited, thus a capacitor C is formed by the first dielectric layer 13 and two patterns—which are above and under thereof respectively— the first metal pattern 12 and the second metal pattern 14. Afterwards, a second dielectric layer 15 is formed onto the resistor R and the capacitor C for isolation. The second dielectric layer 15 is required to be thick enough in order to cover the devices and to be applied uniformly onto the substrate. Then a lead guide hole is defined on the second dielectric layer 15, a buffer layer (or adhesion layer) 16 is formed for advancing the interconnection and the adhesion to the follow-up conductive layer 17. Then, while a third metal pattern 17 is being defined, the inductor L, and the metal pad of the solder bumper for interconnecting with the follow-up package are fabricated simultaneously.

The device is packaged by applying the technique of die level package, as shown in FIGS. 1c and 1d. As shown in FIG. 1c, a solder ball 18 is grown onto the conductive layer initially, then it is bonded with polymer substrate seal-lid 19 by the flip-chip bonding method, and the underfill 20 is made; thus the reliability of the solder joint is enhanced. Alternately, as shown in FIG. 1d, an active device 21 is bonded onto the glass substrate 10 by the flip-chip bonding method, then a solder ball 18 is grown onto the conductive layer, next it is bonded with macromolecule substrate seal-lid 19 by the flip-chip bonding method, and the underfill 20 is proceeded. The step of underfill is used in such package method, wherein the material thereof can flows naturally since the capillarity; although the reliability of the solder joint is enhanced, since the flow and the flow time thereof are uneasy to be controlled accurately, thus the quality rate of the process would be lowered; and the production capability would be influenced by the long solidification time thereof would.

Besides, the MOST (microspring contact on silicon technology) disclosed by the FormFactor Company in America are applied to the wafer-level chip scale package. By using this technique, it is provided with the chip-level interconnects on the wafer. The whole processes of the later packaging are accomplished at the wafer stage by using the MOST, such as the corresponding packaging, the burn-in process, the high-speed testing and the component appearance assembly. The micro-spring is applied as the internal interconnection, and it is the main, basic function of the MOST. Therefore, no leadframe, no molding process is required by using this technique, thus the cost thereof is lower than conventional chip-scale package. Since the micro-spring is provided with well compliance, so it is not required as the solder-bump flip-chip on board that needed to be applied with underfill process. Besides, the chip applied with MOST for the chip process are provided for burn-in and high-speed testing on the wafer-level state. The micro-spring consists of: the core is made of gold line, and then there is a conductive layer of nickel (or nickel alloy) coating or plating onto the surface; the outline thereof likes an PbSn solder paste is applied to the soldering point of the printed circuit board (PCB) by the screen printing method, and then the chip having the micro-spring applied as a connection pin is fetched onto the PCB exactly by a fetching apparatus that confronts automatically. After the surface adherence by the SMT reflow technique, a perfect solder-joints are formed. Various sockets are fabricated onto the PCB by the micro-spring, and then the whole PCB becomes a system integration platform. Besides, the structure of the sockets is capable of pitch transferring, and the requirements for high-density PCB by the whole package structure are lowered; thus, the package cost is reduced efficiently. Nevertheless, this technique is not practically used presently.

Microelectromechanical systems (MEMS) or Microsystems, by their nature, contains sensors, actuators, and peripheral electronics, require application specific packaging. For packaging of the MEMS devices, there are several requirements need to be fulfilled. Because the MEMS device is a three-dimentional structure, this structure has to be protected during the packaging process. MEMS normally comprise a wide variety of different functionalities, each functional elements are integrated either monolithically or hybrid, while the signals interface among each function elements and surrounding physical world has become very challenges. So most of MEMS devices cannot be packaged just as what semiconductors and microelectronics do by using the above-mentioned technologies.

However, if the knowledge and infrastructures of CSP, Filp-chip, MCMs, WLCSP, SiP technologies are applied to package MEMS devices, then progress of packaging technology for MEMS will be accelerated. Regarding to this viewpoint, there are key issues: one is how to make the signal transmission line inside the devices fabricated by the WLCSP method to be coordinated with the peripheral electronics. In other words, how to make signal transmission line or interconnection line crossing the said interface; another one is how to protect the fragile MEMS microstructures without damage during packaging.

Moreover, considering the state-of-the-art CSP, Filp-chip, MCMs, WLCSP, SiP technologies, especially from the experience of semiconductor packaging, the underfill process still remains very challenging in terms of cost, repeatability, quality control, and reliability.

In conclusion, based on micromachining, filp-chip and MCM technologies, a new technology for packaging microsystem devices with a small form factor is disclosed, and this approach is promising for making devices of system-in-a-package format. By using this disclosed technology and the concept of the system-in-a-package (SiP), the present invention provides a new structure for wafer-level-system-in-a-package (WLSiP) and the manufacturing method thereof This invention is applied to making package structure for devices of microelectronics, optoelectronics, microelectro-mechanical systems, micro-fluidic systems, micro-total-analysis-systems, bio-chip, and micro-opto-electro-mechanical systems. The process thereof is integrated with thin and thick film processes, the chip-scale packaging and flip-chip technologies, etc., and it is proceeded with a variety of wire-bonding, solder ball fabrication and solder pad in order to accomplish the external interconnection between the devices. And, the wafer-level packaging structures of the package interfaces of corresponding devices are completed during the wafer stage. The design for wafer-level testing and burn-in can also be integrated by technology of present invention for further reduction of the production cost of the devices.

SUMMARY OF THE INVENTION

Accordingly, it is an object of the present invention to provide a way to package devices of Microsystems. Therefore a package structure in system-in-a-package format is invented.

According to the new package structure of the invention, the package structure can consist elements and devices of plural functions, then the said package structure is a device and apparatus in system-in-a-package (SiP) format. Additionally, the method for making the said package structure is a wafer level approach process technology, in this case, the said package structure is a device and apparatus in wafer-level-system-in-a-package (WLSiP) format.

Another object of the present invention is applying the probes and probe cards with equipments to directly measure the system level parameters and performance corresponding to the said package structure, therefore the wafer level testing and wafer level reliability testing can be realized.?

To accomplish the above objects, substrates with integrated and assembled functional elements, and electrical conduction lines and interconnections can be aligned and pre-bonded to become a substrate of a stack of substrates. Microstructures of interposers, micro-joints, and micro-springs can act as the elements to form pre-bonding interface, the stress and impact buffers, and the alignment aids. Fluidic encapsulating materials can be guided and flown into the specified area inside the package structure via through-holes on the top substrate of the said stack of substrates. Thereafter, the solidification of encapsulating materials can be done with the heat inside a chamber with vacuum environment or ambient inert gas.

To accomplish the above objects, the said package structure is provided with both fan-out and fan-in formats of electrical interconnections, electrical conductive lines, heat-transferring paths and heat dispatching paths among the said package structure and other discrete devices; the pitch between each pair of I/O are designed, changed and made according to different application needs; the electrical signal are routed and arranged by making multilayer of electrical interconnections and insulating layers in order to make complex three-dimensional electrical interconnection structures thereof the said redistribution process. Additionally, wherein the electrical interconnection and signal I/O contacts inside the said package structure among different functional elements and dies are formed by bonding metal wires, depositing metal lines, plating metal lines, soldering, making conductive polymer and making bumping process of filp-chip technology.

To accomplish the above objects, the said package structure can be provided with the optical interconnection and signal I/O contacts of the said package structure for enabling free space optical communications.

To accomplish the above objects, the solidified and encapsulated bonded substrate can be divided into the individual packaged devices from the said package structure by using normal die separation technologies in semiconductor industry.

To accomplish the above objects, an example of the RF system-in-a-package device for wireless communication is cited in order to show the applications to the fabrication of the new package structure in accordance with the present invention. A substrate and a lid substrate are fabricated firstly, the sealing interface is accomplished by aligning, pre-bonding, and encapsulating steps.

Thus, the packaging is completed, and a package of the RF system-in-a-package device consisting of active and passive elements for wireless communication is provided.

The above objectives and advantages will become more apparent with explanation of the accompanying drawings.

BRIEF DESCRIPTION OF THE DRAWINGS

FIG. 2 is an embodiment of forming the package, wherein it is illustrated sequentially that:

FIGS. 2s-1 through 2s-3, the embodiment of forming pre-bonding interfaces.

FIGS. 2u-1 through 2u-5, the embodiment of forming sealing interfaces.

FIGS. 2v through 2z, the embodiment of forming completely sealed interface.

FIGS. 3a-1 through 3b-4 show the embodiment of forming assembled and integrated elements in accordance with the present invention.

FIGS. 4a through 4q-2 illustrate the processes of forming pre-bonding interface in accordance with the present invention, wherein;

FIGS. 4a through 4e, the micro-joint—the solder/metal bump—are used for pre-bonding the interface.

FIGS. 4f through 4l, the interposer—the three dimensional microspring is used for forming pre-bonding interface.

FIGS. 4m through 4m-9, FIGS. 4n-1 through 4n-12, FIGS. 4o through 4q-2, the microstructures are used for forming pre-bonding interface.

(a) The paths of electric-signals I/Os and heat-transfer via the solder/metal bonded interface.

(b) The said paths via the three dimensional micro-spring bonded structure.

(c) The said paths via the conductive/non-conductive microstructures.

FIGS. 6a-1 through 6g-2 show concepts of applying the microstructure in accordance with the present invention.

FIGS. 7a through 7f-4 illustrate embodiment of forming a completely sealed interface in accordance with the present invention.

DETAILED DESCRIPTION OF THE PREFERRED EMBODIMENT

EXAMPLE 1

An example of making a system-in-a-package (SiP) in accordance with the present invention is now being described as follows.

The method of making the said SiP in accordance with the present invention are described in five parts:

(a) fabrication of the device-carrier substrate;
(b) fabrication of the lid substrate;
(c) forming a pre-bonding interface;
(d) forming a completely sealed interface;
(e) processes for the back-end and final products.

These five processes mentioned above are shown in FIG. 2.

Figure 1A:
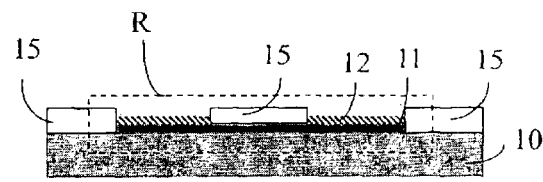
FIGS. 1a through 1d are cross-sectional views of the package structure for a RF module that integrating the passive devices in accordance with the prior art.
Figure 1B:
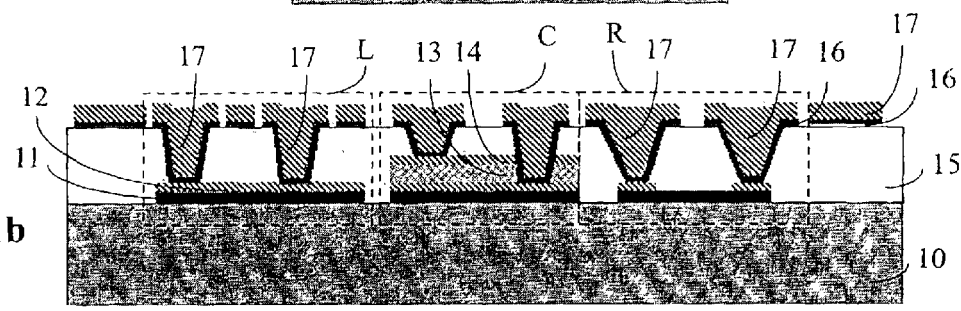
Figure 1C:
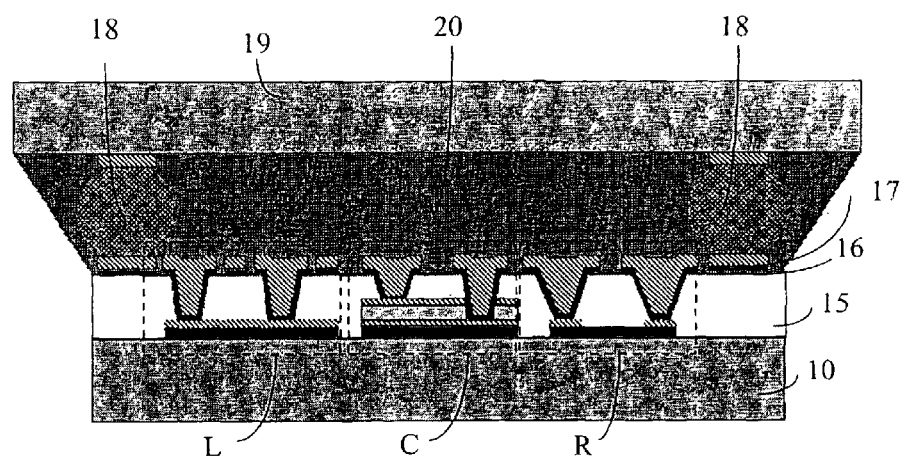
Figure 1D:
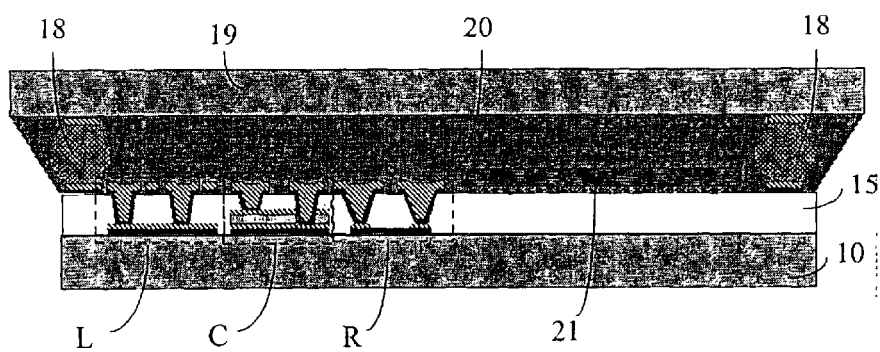
Figure 2A:
FIGS. 2a through 2j are the fabrication of the device-carrier substrate.

Then, the five parts are described in details:
(a) Fabrication Process of the Device-carrier Substrate
An example of making the assembled and integrated elements is shown in FIGS. 2a through 2h:

Firstly, as shown in FIG. 2a, a resistance layer 202 is deposited and defined on the device-carrier substrate 201.

Figure 2B:
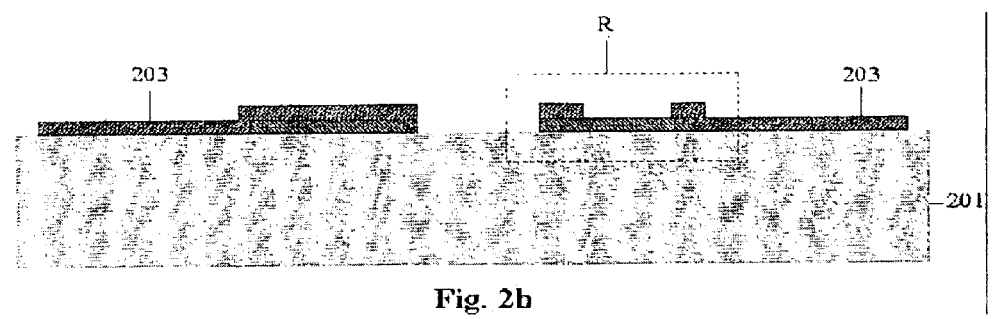

Secondly, as shown in FIG. 2b, a first conductive layer 203 is deposited, and it is defined/patterned by etching or using the lift-off method. The first conductive layer 203 is formed onto both ends of the resistance layer 202, and a resistor structure R is formed. Besides, the first conductive layer is extended onto the device-carrier substrate 201, so it is used as conductive line, a metal pad, or a UBM layer (under bump metallization layer) provided for further growing the solder/metal bumps.

Figure 2C:
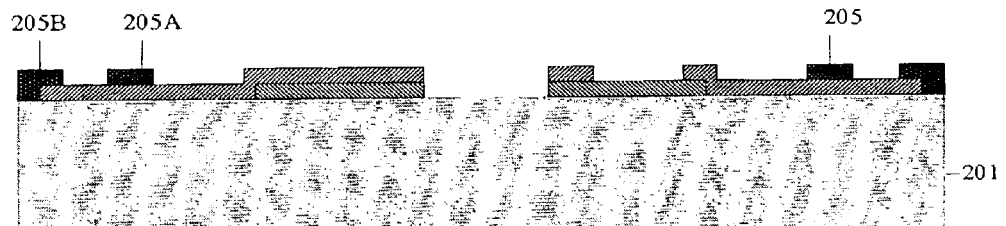

Then, as shown in FIG. 2c, a first interface layer 205 is deposited and defined. The material thereof are metallic or non-metallic, conductive or nonconductive. This fabrication example is applied with UBM 205A for providing a connection between the first conductive line and the follow-up bonding structure material on the lid substrate. And the first interface layer located on 205B is used as an isolation layer of the first conductive line.

Figure 2D:
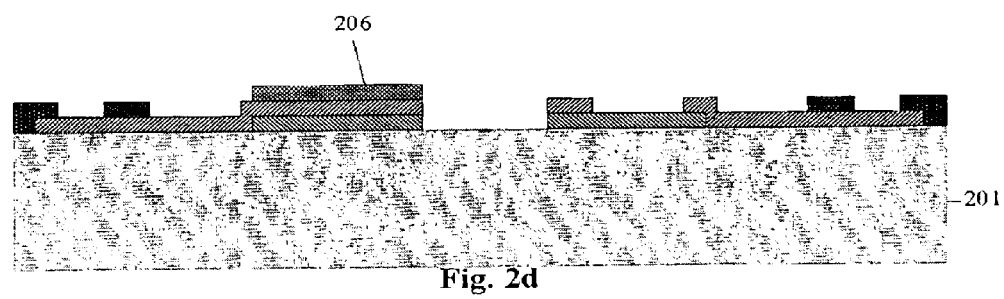
Figure 2E:
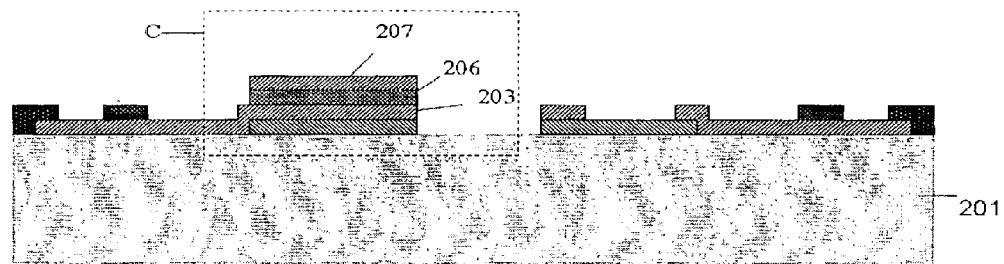

Then, as shown in FIGS. 2d and 2e, a dielectric layer 206 and a second conductive layer 207 are deposited and defined sequentially. A capacitor structure C with conductive layer/dielectric layer/conductive layer is formed by the first conductive layers 203, the second conductive layer 207, and the dielectric layer 206 between therein.

Figure 2F:
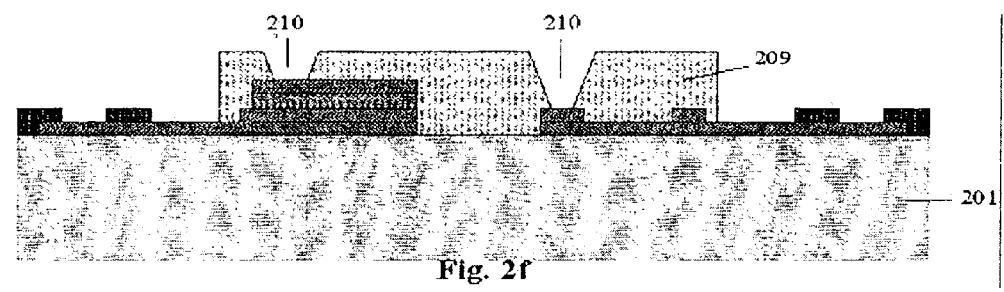

Next, as shown in FIG. 2f, a protection layer 209 is formed by using the spin-on method. The protection layer 209 is made of the dielectric material with low dielectric coefficient, which is thick enough for coating the passive devices such as resistor and capacitor, and it is applied uniformly onto the substrate 201. Afterwards, a contact window 210 is defined on the protection layer 209.

Figure 2G:
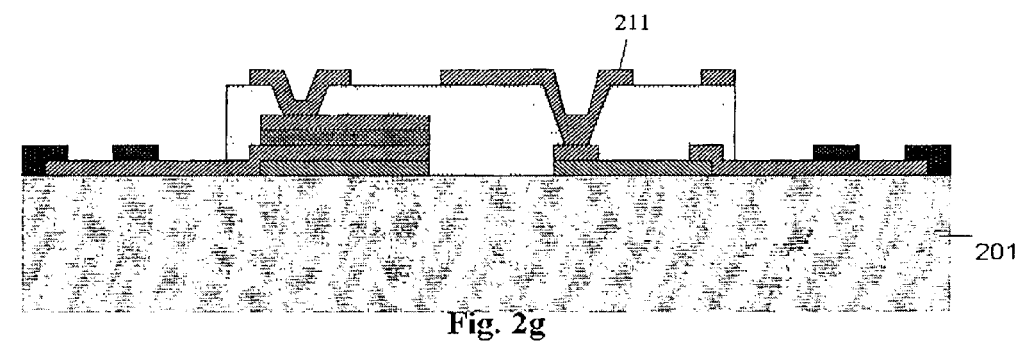
Figure 2H:
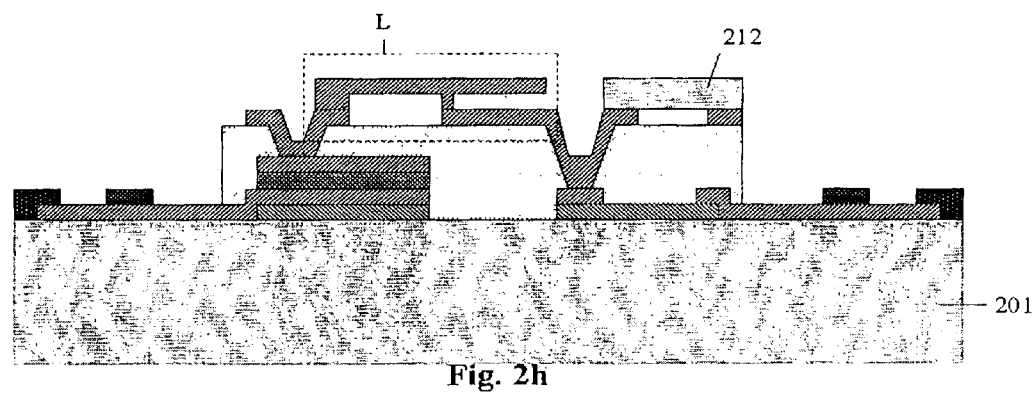

Next, as shown in FIG. 2g, a third conductive layer 211 is deposited and defined in order to form a second conductive line, and redistributed electrodes of the lower devices—the resistor and the capacitor—are accomplished.

After the third conductive layer is accomplished, various active/passive devices are fabricated onto the protection layer 209 by various techniques of bonding and assembly. For example, in plating process, the second conductive line that was defined previously are used as a bottom electrode for further plating step. Then, the passive devices, such as the MEMS three dimensional inductor (shown as L in FIG. 2h), or the active devices, such as the MEMS microwave switch can be made by using the said plating step. Besides, the active devices like integrated circuit dies of silicon 212 or the power amplifier devices of the gallium arsenide 212 etc. are flip-chip assembled onto the appropriate position of the third conductive layer 211. Here, the said assembled and integrated elements can be integrated to form a microsystem device.

Figure 2I:
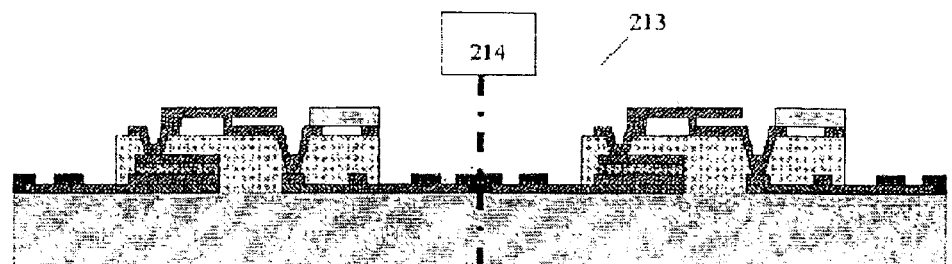

FIG. 2i shows the appearance 213 of the whole device-carrier substrate that is accomplished. A dotted line 214 exhibits a separating location for further dividing the device-carrier substrate.

Figure 2J:
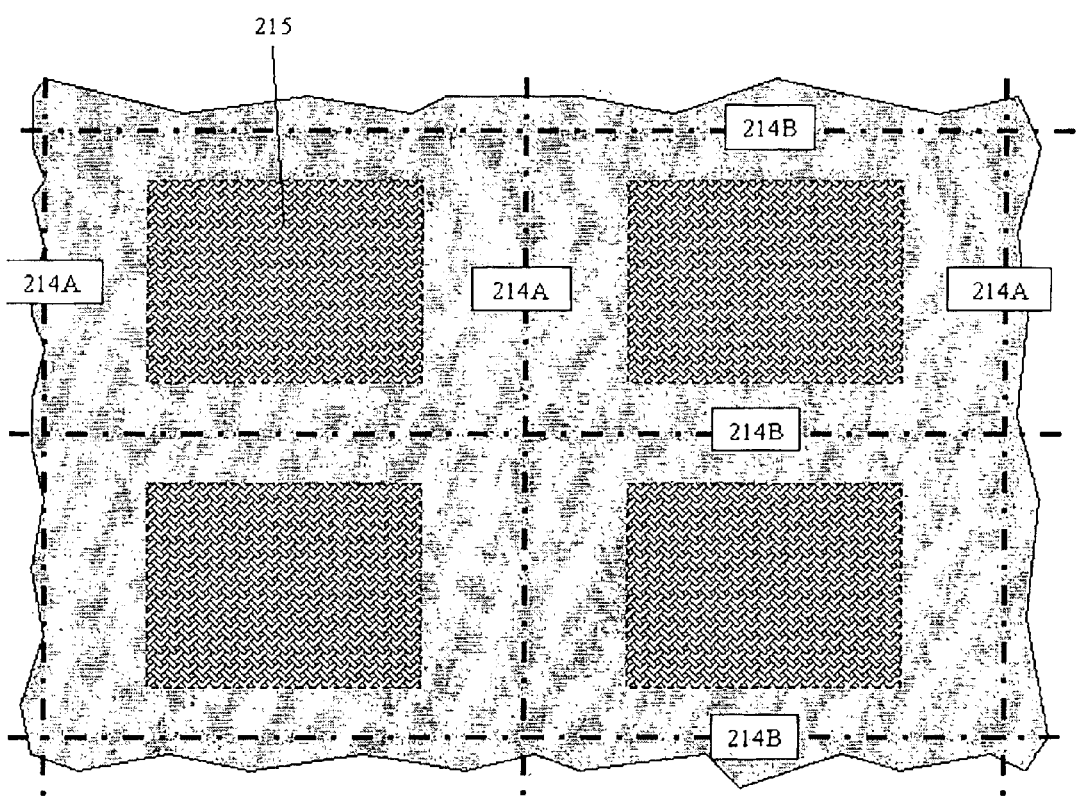

FIG. 2j shows the top view of the device-carrier substrate 201, wherein the dotted-line region exhibits the said functional elements 215. The division lines 214A and 214B are the said separating location. Accordingly, the fabrication of the device-carrier substrate is described above.

Afterwards, the fabrication process of the lid substrate is being illustrated.

(b) Fabrication Process of the Lid Substrate

Figure 2K:
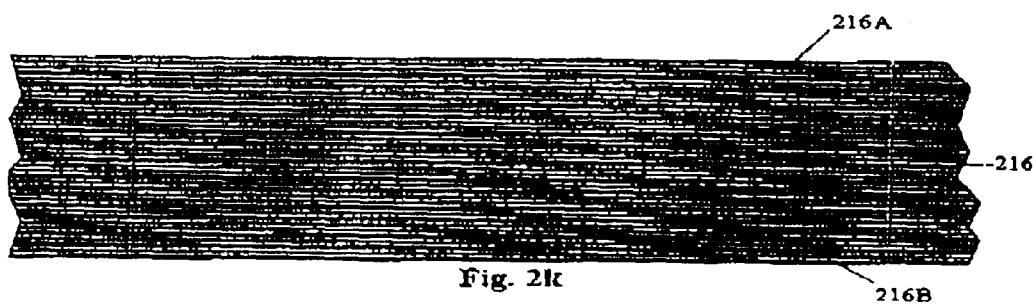
FIGS. 2k through 2r are the fabrication of the lid substrate.

Firstly, as shown in FIG. 2k, a substrate 216 is applied as the lid substrate. An example of the silicon wafer with crystalline orientation [1,0,0] is used for description. In FIG. 2k, the front-side is 216A, and the backside is 216B.

Figure 2L:
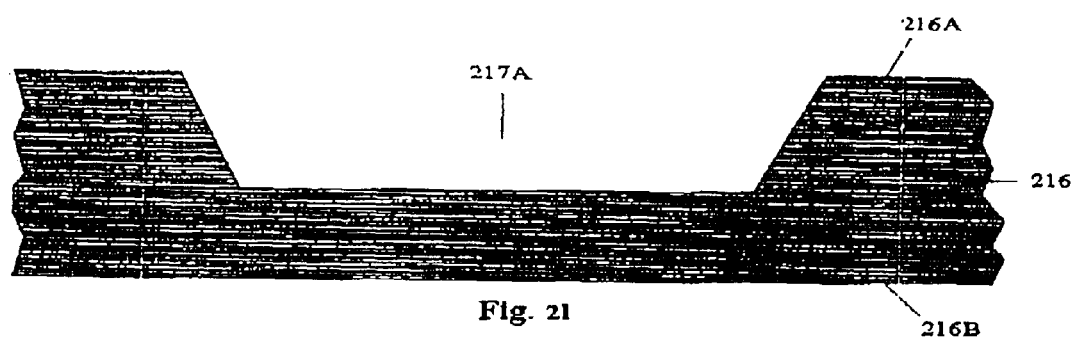

Secondly, as shown in FIG. 2l, microstructure 217A is fabricated onto the front-side 216A by using the photolithography and micromaching processes. Wherein, the microstructure 217A is used for providing a space in order to accommodate the said functional element 215 on the device-carrier substrate 201. For example, in a silicon wafer of crystalline orientation [1,0,0], can be etched in a solution of a mixture of 24% potassium hydroxide, 63% water and 13% isopropyl alcohol to form the said cavity microstructure. Here, other processes for fabricating the microstructure can also be applied.

Figure 2M:
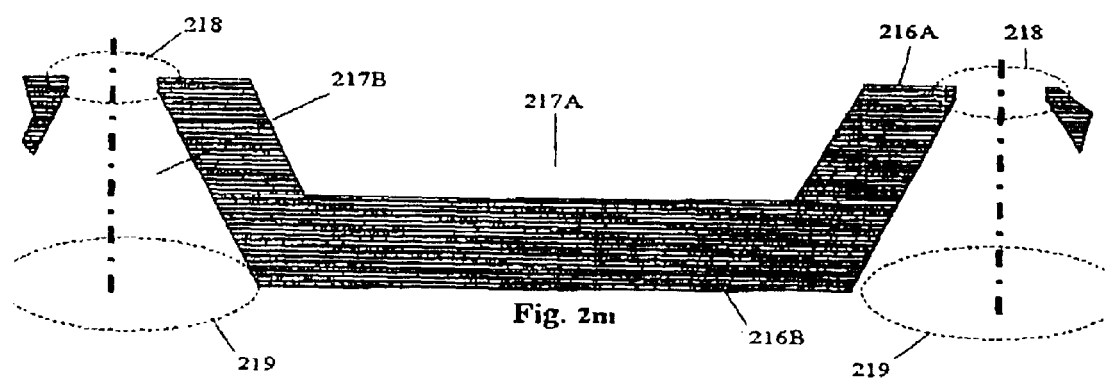

Then, as shown in FIG. 2m, a microstructure of through-hole 217B is fabricated onto the substrate 216 by using the photolithography and micromaching processes; thus, the micro-inlet 218 is an opening of the through-hole 217B on the front-side 216A. The micro-inlet 219 is an opening of the through-hole 217B on the backside 216B. The through-hole 217B can be made by the same method of making the microstructure 217A.

Figure 2N:
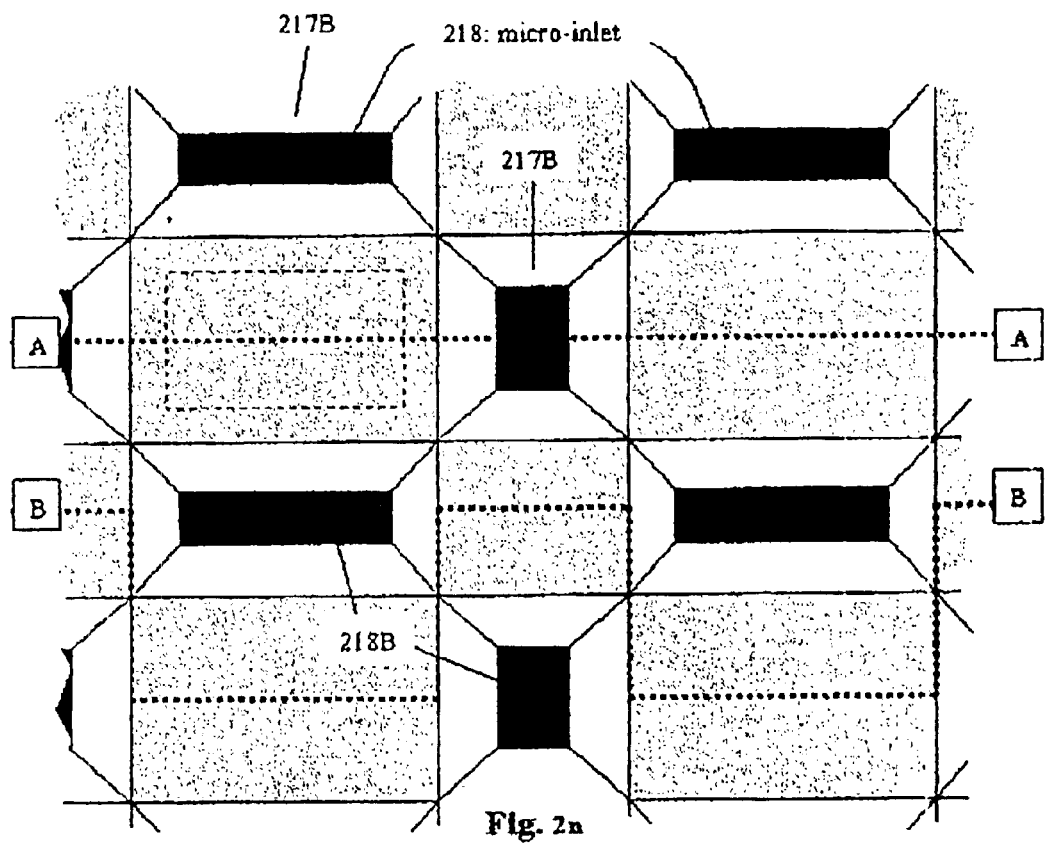

FIG. 2n shows the outline 220 seen on the backside of the substrate after the through-holes 217B are accomplished. The micro-inlets 218 are exhibited as the black region at the center of microstructures 217B. For clearer descriptions, please refer to the cross-sectional views along A—A and B—B, as shown in FIGS. 2n-1 and 2n-2.

Figures 1, 2N:
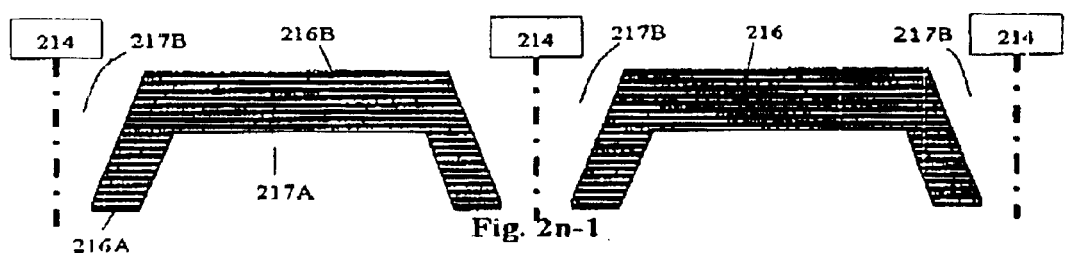

FIG. 2n-1 is a cross-sectional view along A—A of FIG. 2n. There is a dotted line 214 indicating a separating location for the two adjacent lids.

Figures 2, 2N:
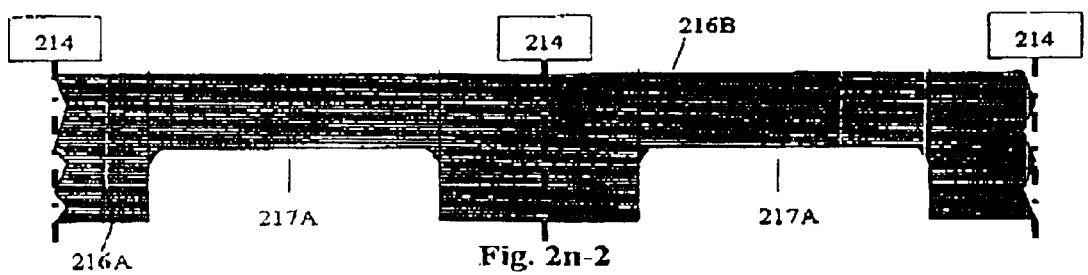

FIG. 2n-2 is a cross-sectional view along B—B of FIG. 2n. The through-hole 217B is not shown on the cross-section B—B. There is a dotted line 214 indicating a separating location for the two adjacent lids.

Figure 2O:
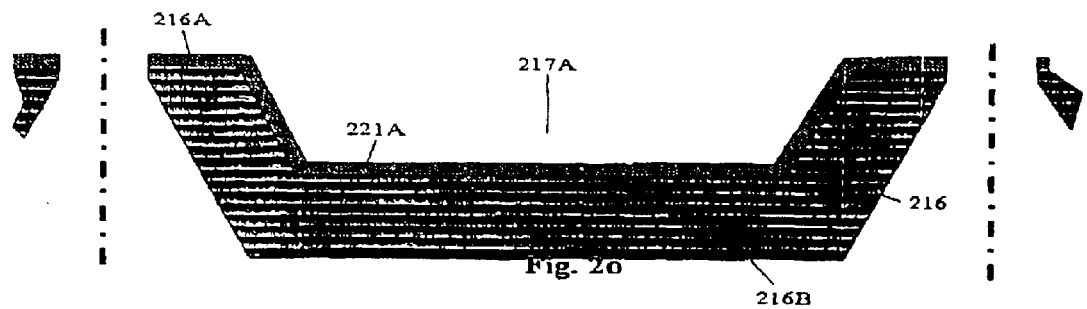

As shown in FIG. 2o, a first conductive layer 221A is deposited directly and it is used as a metallic shielding for the said assembled and integrated elements on device-carrier substrate. Further, as the first conductive layer is extended onto the substrate 216, it is can be used as the first conductive line, the metal pad or the UBM layer for further growing solder/metal bumps on the front-side 216A.

Here, the functional circuits or the conductive films, which are formed by the same processes FIGS. 2a through 2h. Absorber materials, i.e., the getter materials, refer to the reference materials [4] and [5] are prepared too, especially for absorbing water or particles that would degrade the device performances.

Figure 2P:
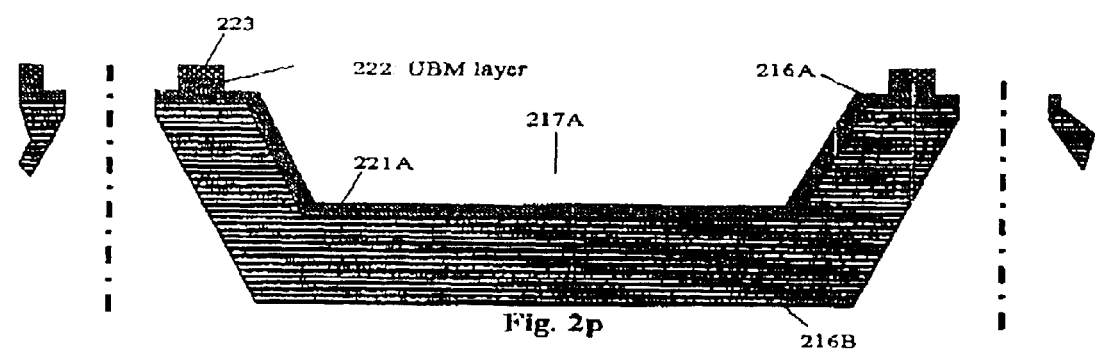

Further, as shown in FIG. 2p, a UBM (under bump metallization) layer 222 is prepared at the position for further forming pre-bonding interface. Thus interposers, micro-joints and microstructures, such as, solder/metal bump 223 etc. are prepared on the UBM layer 222.

Figure 2Q:
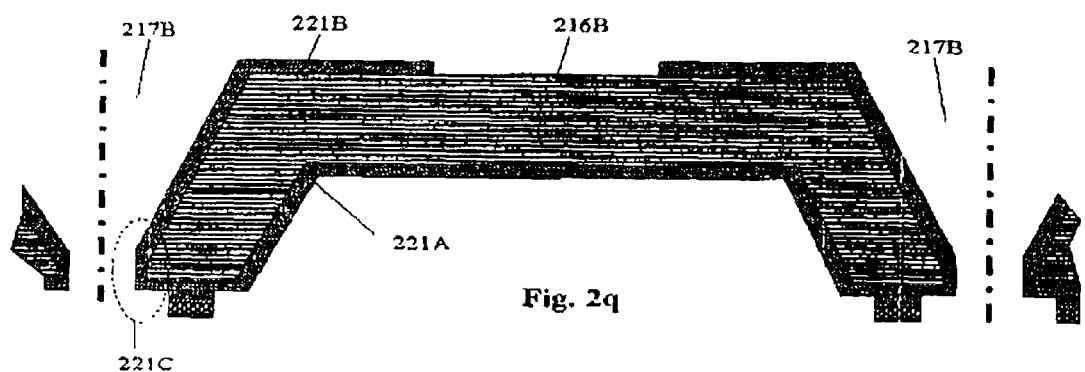

And as shown in FIG. 2q, on the backside 216B of the substrate, a first conductive layer 221B is deposited and patterned. Further, the first conductive layer 221B is used as the first conductive line, metal pad or a UBM layer for growing solder/metal bumps on the backside 216B. Wherein, conductive layer 221B fabricated on the microstructure 217B and conductive layer 221A on the front-side 216A are in contact with each other at 221C. Since the conductive layers 221A and 221B are deposited separately, it is better to proceed with related treatment, and a more reliable electric-connected structure is accomplished between the two conductive layers. The lid substrate is manufactured by these steps.

Figure 2R:
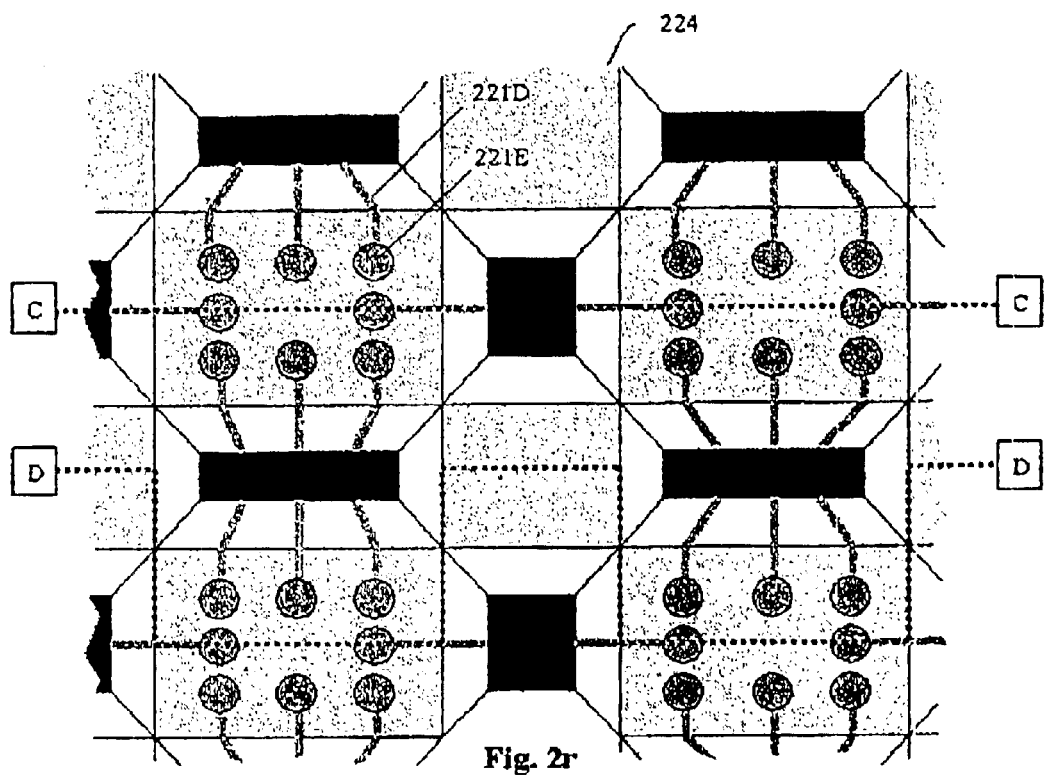
Figures 1, 2R:
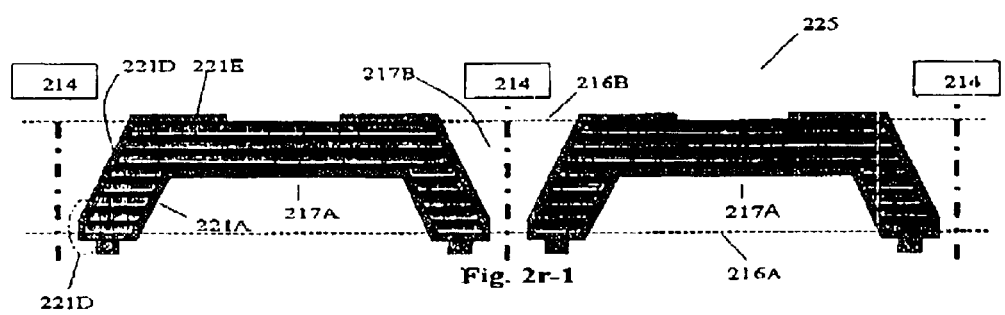

As shown in FIG. 2r, outline 224 is illustrated on the backside 216B of the lid substrate after the conductive line 221B is patterned. The said layer 221B consist of a first conductive line 221D and a metal pad 221E. Besides, FIG. 2r-1 shows the cross-sectional view 225 of C—C on FIG. 2r. There is a dotted line 214 indicating a separating location for two adjacent lids. The steps described above are the fabrication process for the lid substrate.

In conclusion, the fabrications of device-carrier substrate and the lid substrate, the material of these substrates are semiconductors, metals, plastics, polymers, ceramics, or glasses. According to the materials of the substrate, the corresponding manufacturing methods for the said elements can be the conventional semiconductor processes, planar and three-dimensional microfabrication technologies, such as the lithographic electroplating formation (LIGA), the hot embossing forming, the extrusion forming and the powder metallurgy, etc.

The steps for forming pre-bonding interface between device-carrier substrate and lid substrate are illustrated as follows.

(c) Forming a Pre-bonding Interface

Figures 1, 2S:
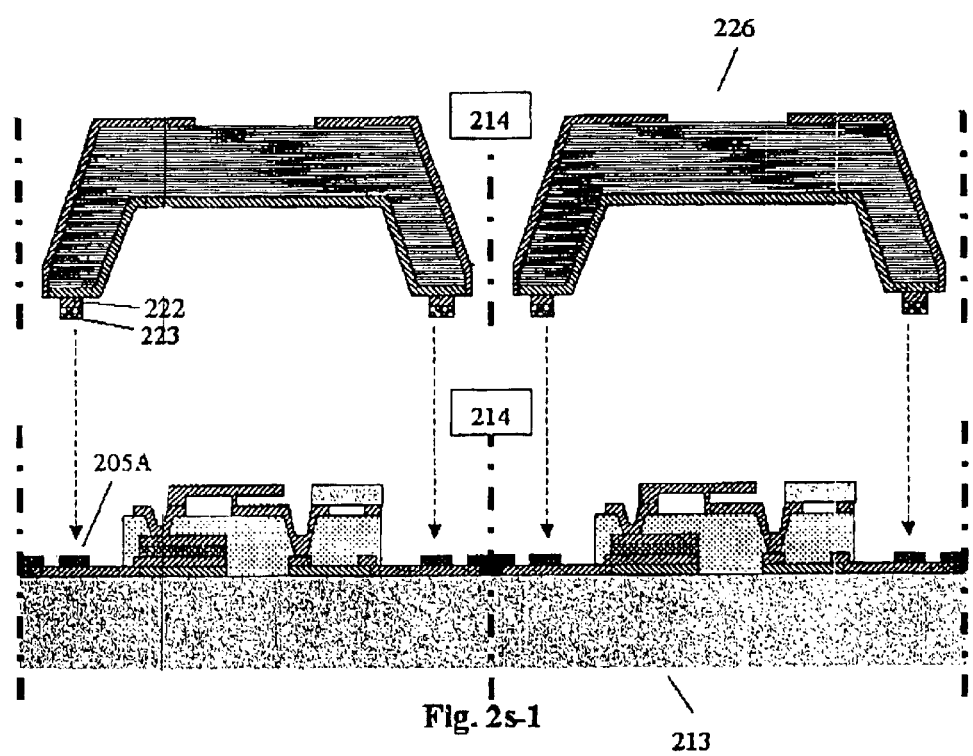
Figures 2, 2S:
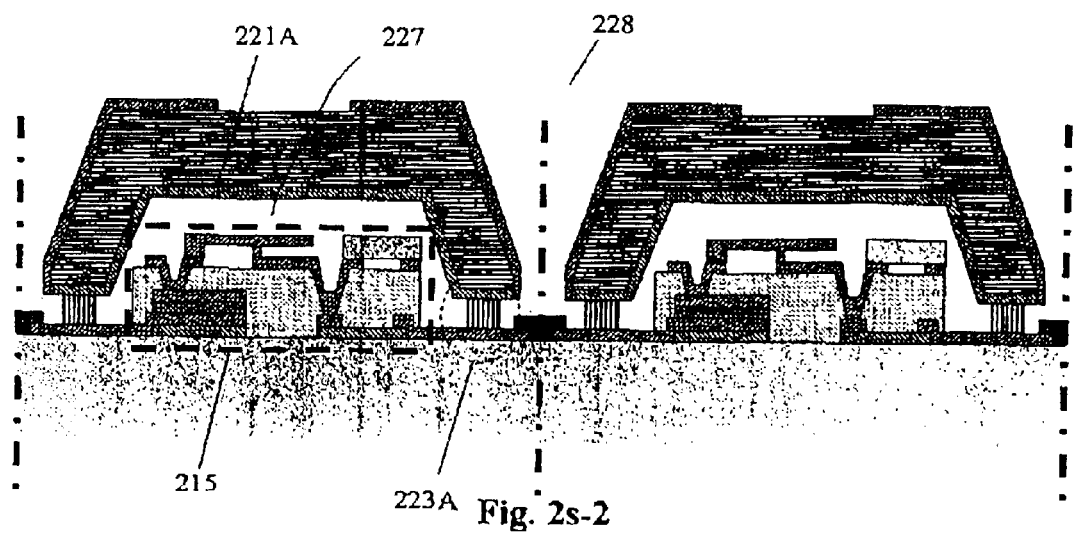
Figures 2, 2S, 3:
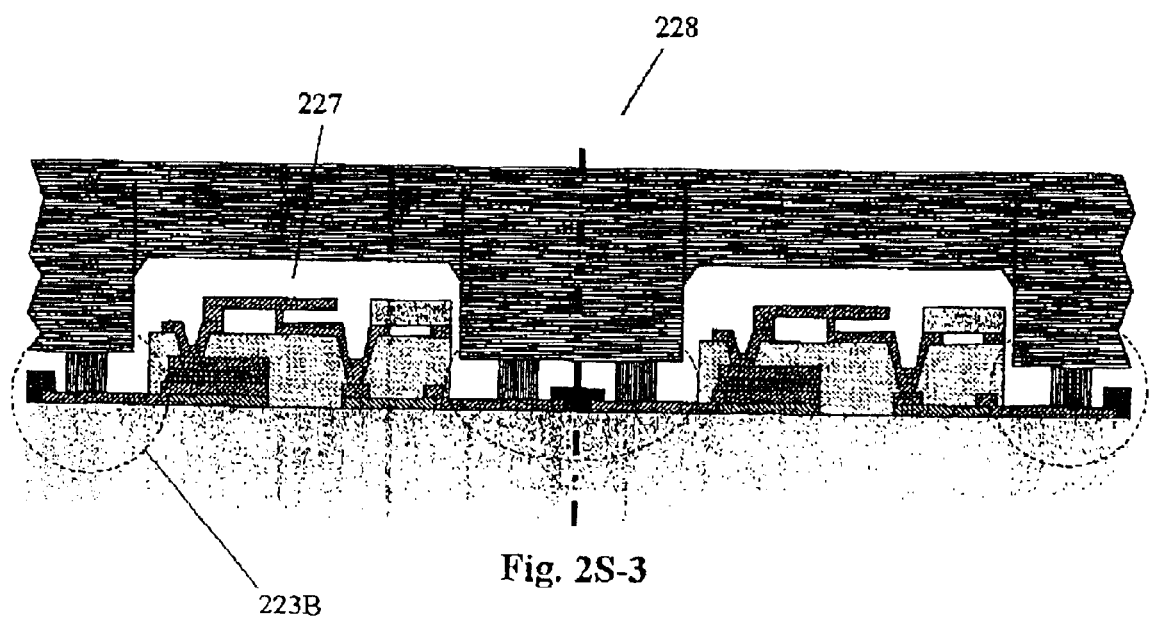

After we have the device-carrier substrate, which is ready for next step, we may conduct the pre-bonding process to form a substrate of a stack of substrates with pre-bonded interface. FIG. 2s-1 illustrates the alignment process and the pre-bonding interface process between the said lid substrate 226 and the said device-carrier substrate 213 by using the double-side alignment equipment (not shown here). And, before doing the alignment and pre-bonding processes, the substrate-level testing for the device-carrier substrate 213 and the lid substrate 226 are proceeded selectively. FIG. 2s-2 is a cross-sectional view of the pre-bonding substrate after the alignment process. In order to form a reliable pre-bonded interface, the heat treatment, debubble and de-gassing treatment and external applied pressure in accordance with the requirement of the pre-bonding process. FIGS. 2s-2 and 2s-3 show the cross-sectional view along the cross-sectional line C—C and D—D shown in FIG. 2r after the pre-bonding process, respectively. A bonded microstructure 223A is formed by contacting three layers of materials 222, 223 and 205A after the said alignment and pre-bonding process. A cavity 227 is formed and enclosed by the interposers, micro-joints and microstructures 223A and 223B of the said pre-bonded microstructure. The spatial space 227 can offer a room to accommodate and protect the said element 215, protruding three-dimensional MEMS devices and other three-dimensional microstructures. On the other hand, the enclosed and encompassed structures and elements 215 inside cavity 227 can consist of plural elements with various functions. Then the said structures 215 are typical devices in the SiP format. However, the interposer, micro-joints and microstructures 223A and 223B may only form discrete bonded and contacted area.

Further encapsulation process is needed to form a completely sealed interface.

(d) Completely Sealing the Bonded Interface

Figures 1, 2U:
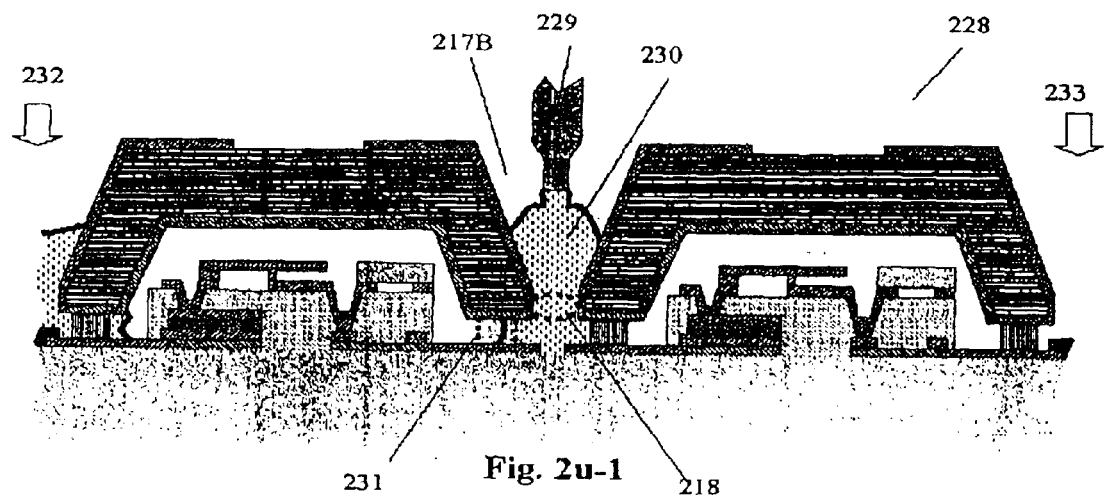
Figures 2, 2U:
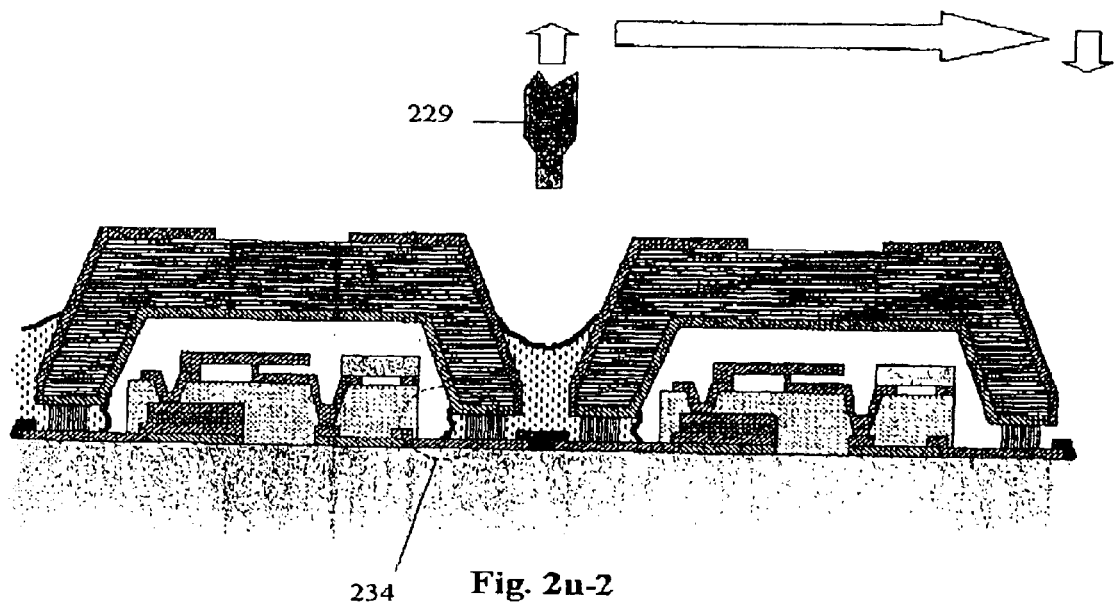

FIG. 2u-1 shows the pre-bonded package structure, a dispensing head 229, which is capable of doing accurate 3-axis motion and glue quantity control and a inlet 218 of encapsulation materials.

The said dispensing head 229 stay at the position of the upper sided through-hole 217b. Via the said through-hole 217B, the liquid type encapsulating materials 230 may flow gradually into the gap 231 to seal the rest opening area among the pre-bonded microstructures 223A and 223B, when external force coming from pressure difference, or extruding tools is applied to enhance the encapsulation process, the said encapsulating material 230 can be fluidic materials of organic materials, such as epoxy resin, polyimide, silicone, BCB (benzocy-clobutene), photo resistor, electric conductive resin, polymer, co-polymer, silver paste, solder paste etc. Some microstructures and flow channels are designed and made in the package structure for guiding the fluidic encapsulating materials 230 flow-in after passing through inlet 218. Such fluidic materials constraining process can be done by a capillary force difference caused by surface tension difference or geometric effect of shapes and coatings of microstructures and flow channels. Thereafter, the flow of fluidic materials will be constrained at position 234. By constraining encapsulating materials 230 in the flow paths, then the said element 215 can be prevented from damage during the encapsulation process.

After this step, the said dispensing head 229 can move to 233 position for next encapsulating step, just as the precedent 232 position, as shown in FIGS. 2u-1 and 2u-2. After a plurality of encapsulating steps, all the interface area is sealed completely. The device-carrier substrate 213 is bonded tightly with the lid substrate 226. The relative cross section views of E—E and F—F lines of top-view of package structure shown in FIG. 2u-3, are shown in FIGS. 2u-4 and 2u-5, respectively.

Figure 2V:
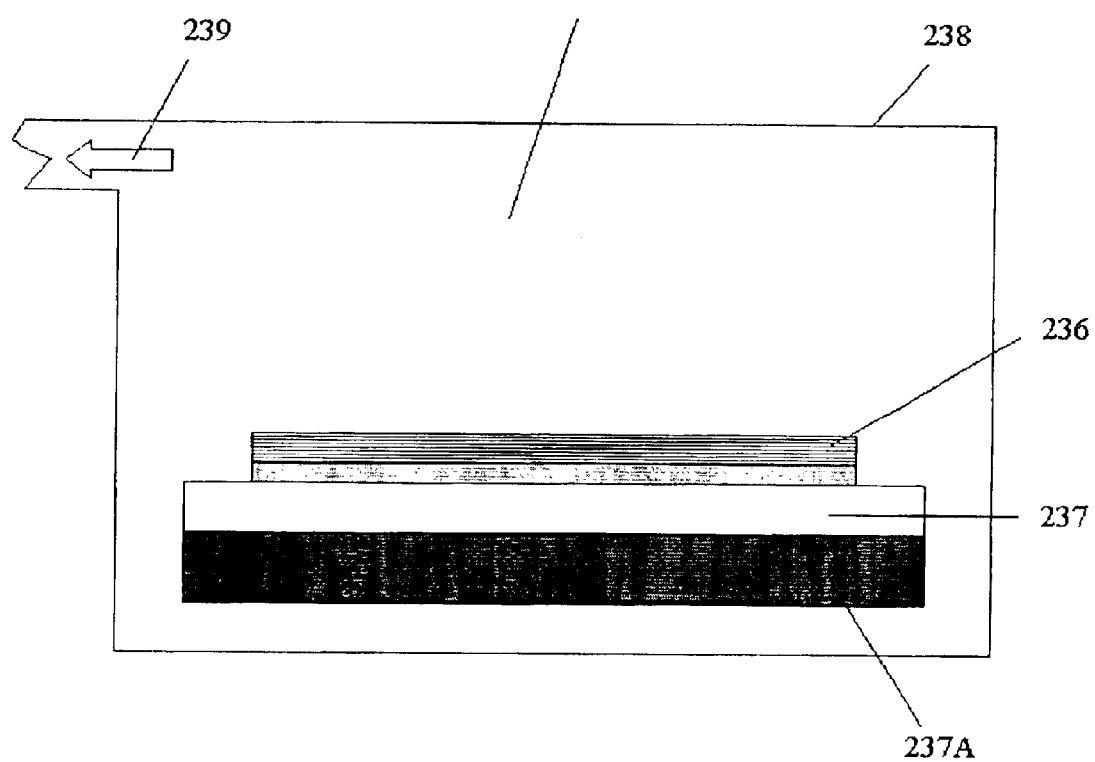

During the solidification process of pre-bonded and encapsulated package structure 236, the said package structure 236 can be placed on a fixture 237 and heated by a heating apparatus 237A. Additionally, the encapsulated said package structure 236 can be placed inside a chamber fulfilled with inert gas to prevent any unwanted reactions, like oxidation, etc, as shown in FIG. 2V.

On the other hand, this process can also be executed in a vacuum chamber in order to de-bubble, de-gas and extracted out the unwanted gas inside package structure 236.

Figures 2, 2X:
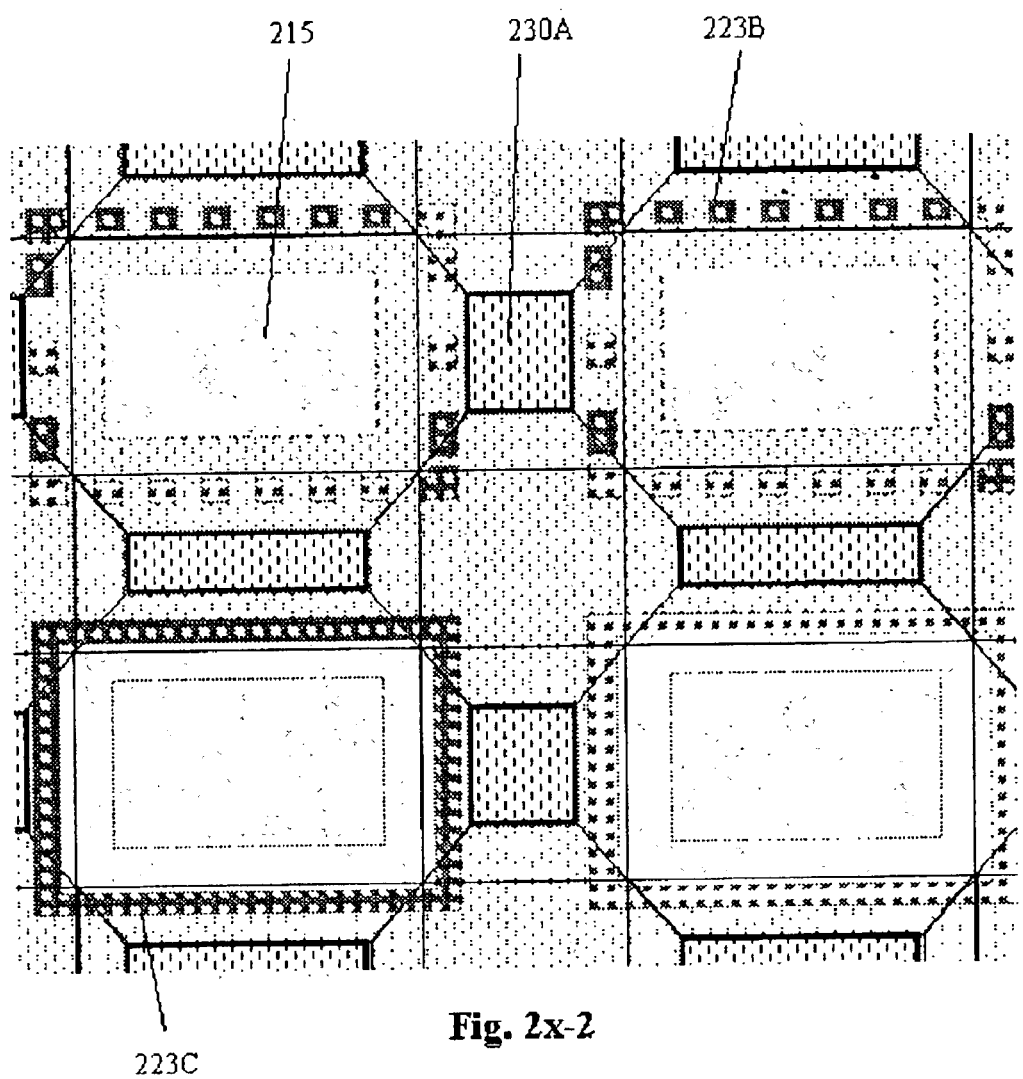

After the solidification process, in order to form the signal I/O contacts of the said package structure to outside systems and other discrete devices, the metal pads for further wire bonding, UBM layers for further growing solder bumps or gold bumps, solder ball, solder lands and metal pads for further surface mounting process are necessary to be prepared on the outside surface of the said package structure. FIG. 2x shows the top view of a schematic drawing of an example to illustrate the configuration of fan out/in electrical conductive lines and respective solder ball 243 positions, where the cross-sectional drawing of line G—G is shown in the FIG. 2x-1. The solder balls 243 are placed onto the pads 221E of electrical conductive lines with the interface layer 244 of solder paste/flux by using the known SMT process. Additionally, the dotted area of FIG. 2x-2 shows the area being fulfilled and occupied by the fluidic encapsulating materials, where the packaged elements 215 are also shown.

Figure 2Y:
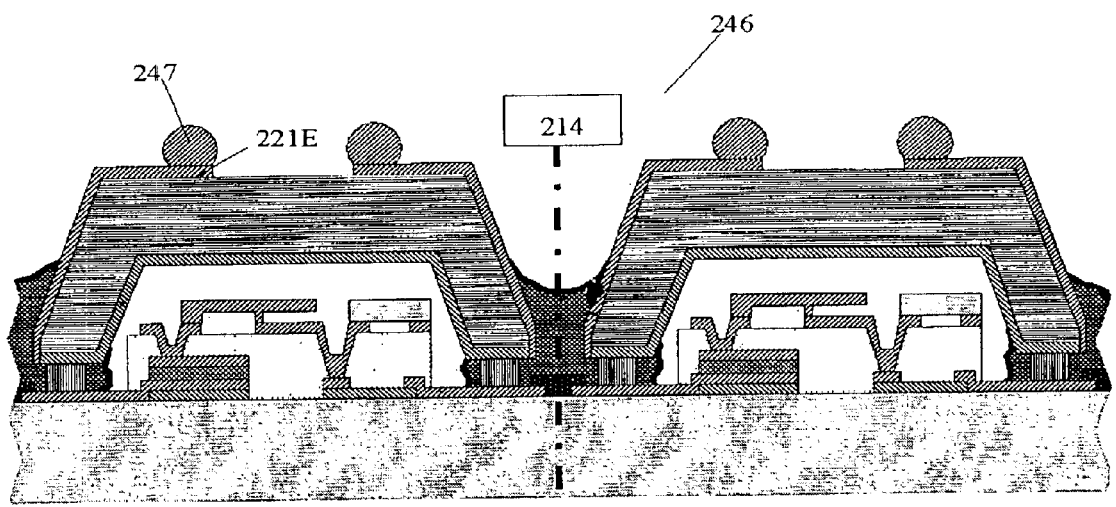
Figure 2Z:
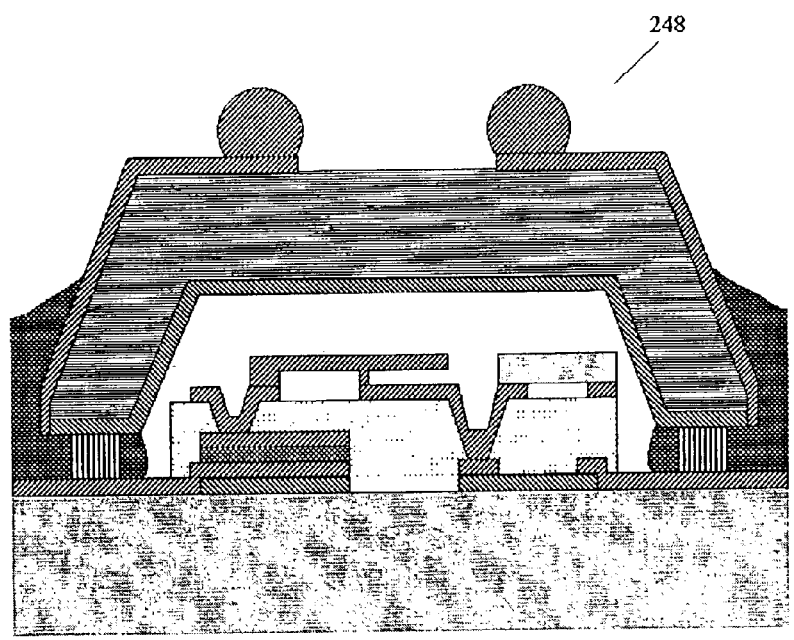

After reflow step of SMT process, the package structure 246 of a pre-bonded and encapsulated substrate of a stack of substrates is shown in FIG. 2y. Then the package structure 246 can be separated according to separation line 214 into divided package structure 248 shown in FIG. 2z.

In ease of aforementioned process is conducted in wafer level, while plural functional elements being packaged inside cavity to become system 227, then the said package structure 215 is a device in the WLSiP format.

EXAMPLE 2

Assembled and Integrated a Functional Element at Substrate-level

Figures 1, 3A:
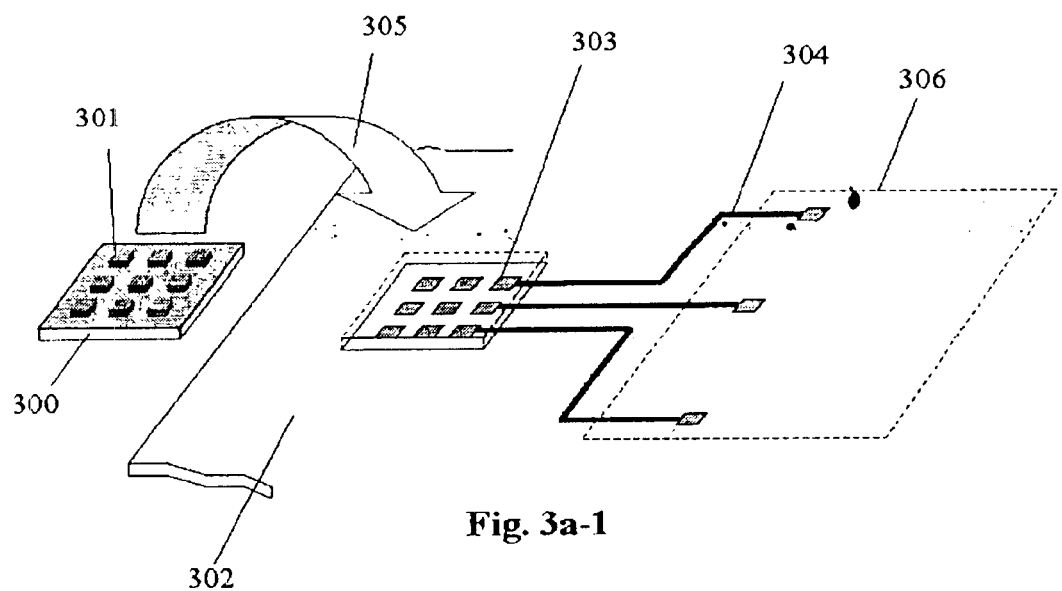
Figures 2, 3A:
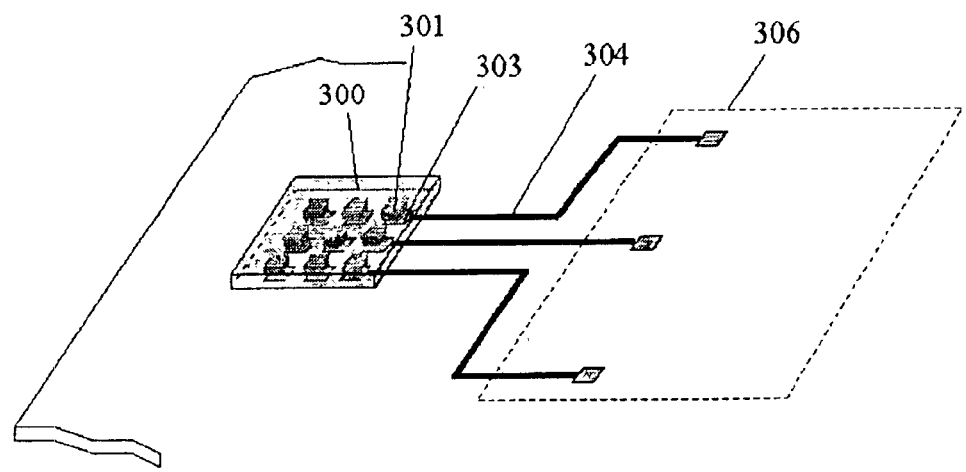
Figures 3, 3A:
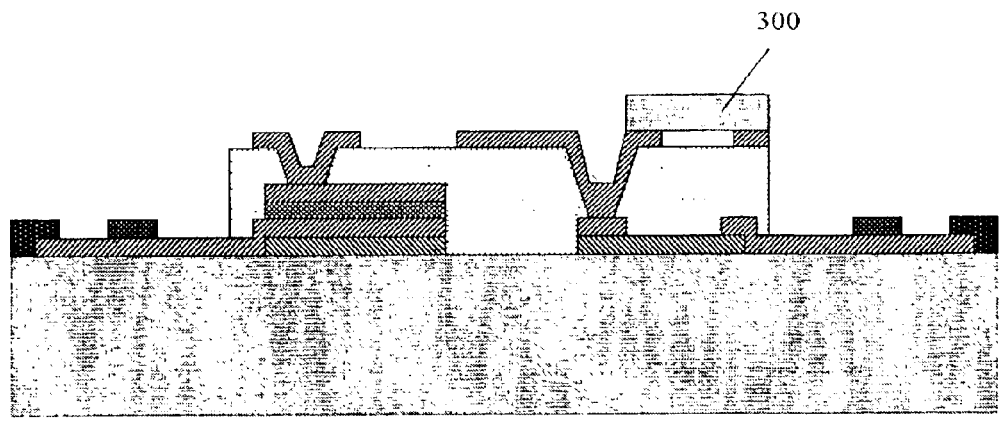
Figures 3, 3A, 4:
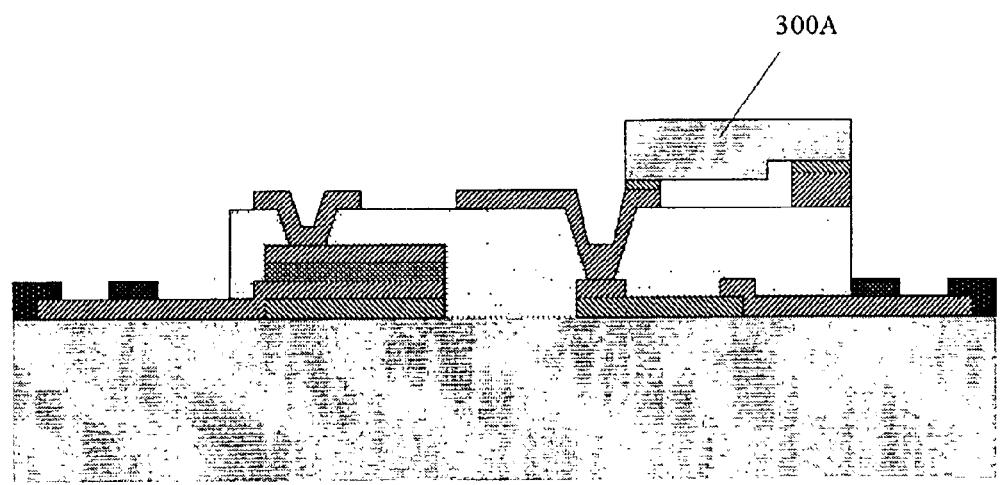

FIGS. 3a-1 through 3a-4 indicate that how to integrate the wafer-level active devices by flip-chip bonding method. Firstly, as shown in FIG. 3a-1, a metal bump 301 is grown onto the front-side of the die by the active device 300 initially. Wherein the metal bump are a bump made of various materials, such as a solder bump or gold bump etc. (for example, a metal bump shown in the figure is arranged as a 3 ? 3 planar array). The metal bump is integrated onto the device-carrier substrate 302 by flip-chip bonding method (indicated by the arrowhead 305). A metal pad 303 and a conductive line 304 is accomplished previously on the device-carrier substrate 302 for electric interconnection between the passive device 306 (indicated by dotted line) on the device-carrier substrate 302 and the active device 300. By using such method 305, it is enabled to bond accurately by means of the available flip-chip bonder or eutectic bonder. FIG. 3a-2 is a perspective view showing the active device that is being integrated by the flip-chip method. Wherein, the signal connection between the active device 300 and the passive device 306 on the device-carrier substrate is accomplished by the metal bump 301, metal pad 303 and the conductive line 304 thereof. FIG. 3a-3 is a cross-sectional view of FIG. 3a-2. FIG. 3a-4 shows that the photoelectric device 300A can also be integrated in accordance with the design for occasional application, such as a LED (light-emitting diode) and a laser diode, and a blue-light LED is shown in the figure.

Figures 1, 3B:
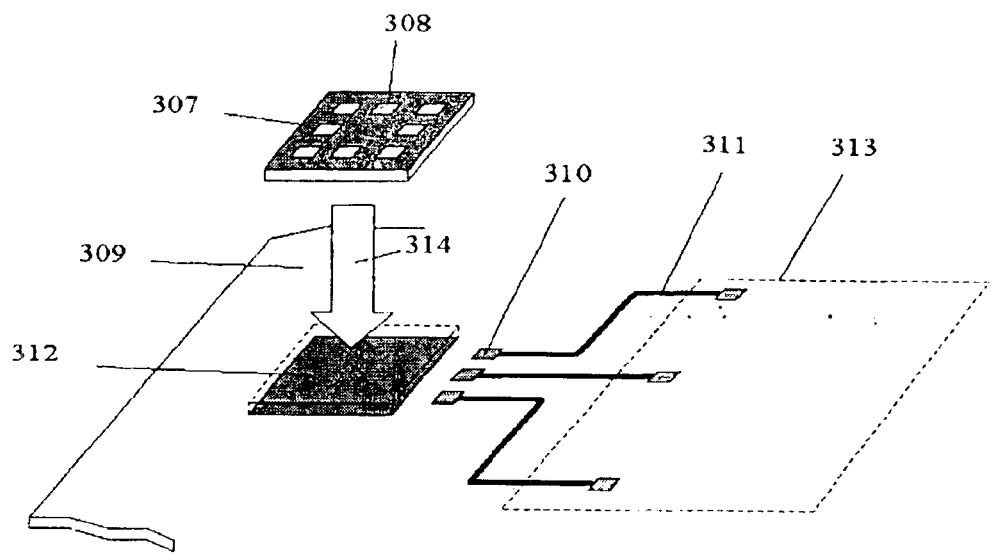
Figures 2, 3B:
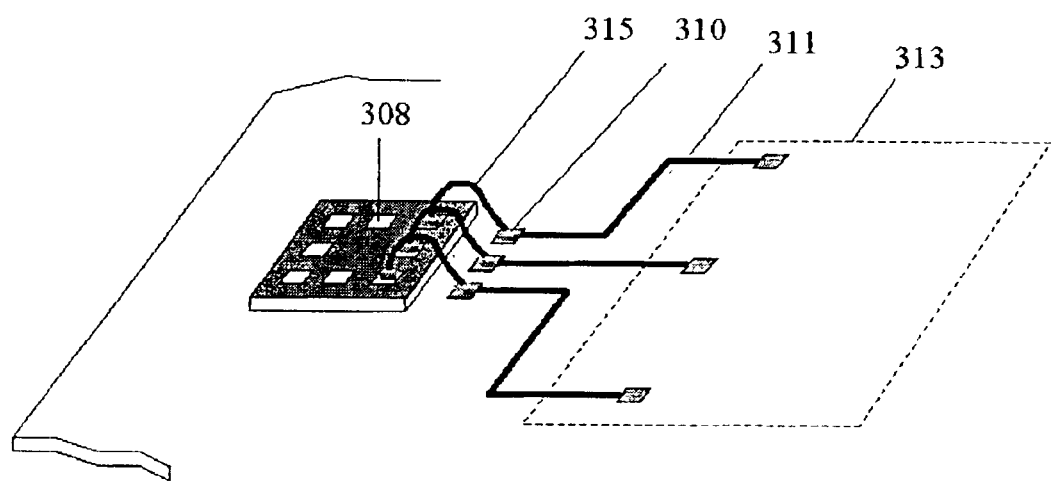
Figures 3, 3B:
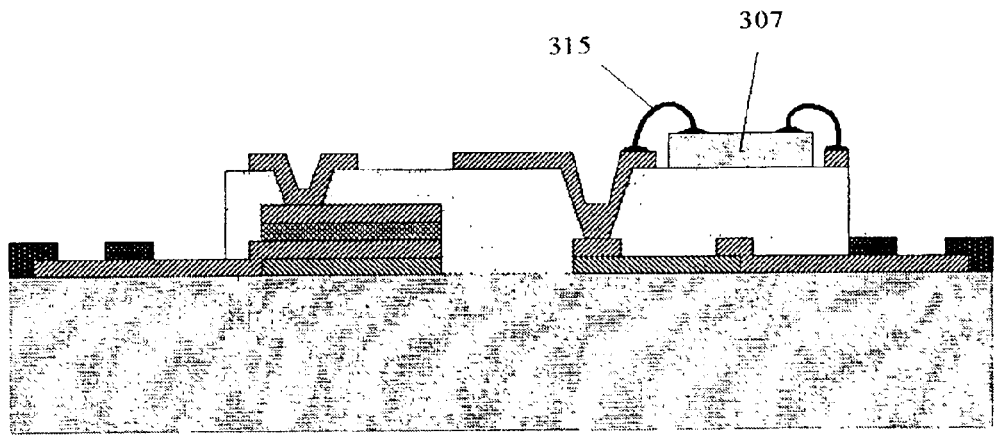
Figures 3, 3B, 4:
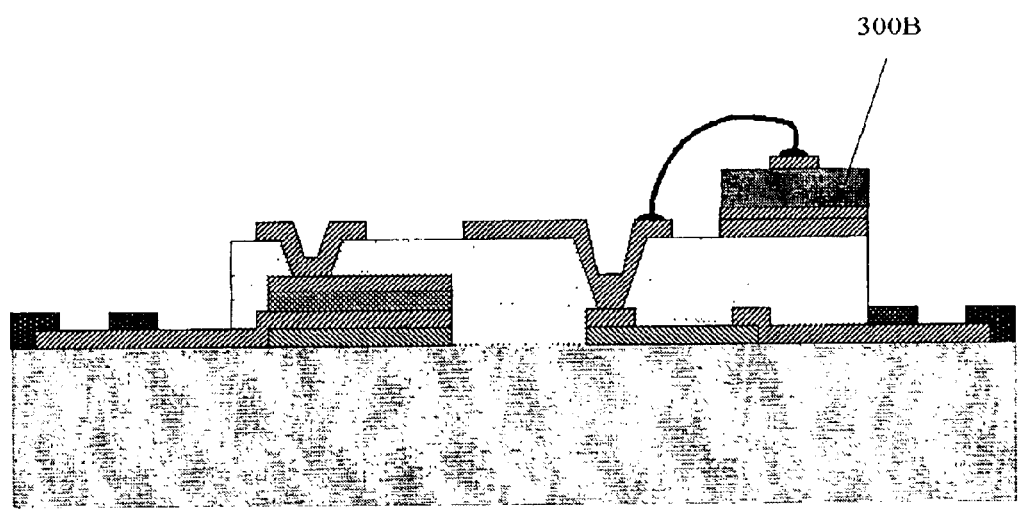

FIGS. 3b-1 through 3b-4 indicate that the active device 307 is integrated onto the device-carrier substrate 309 by the wire bonding method. As shown in FIG. 3b-1, there is a metal pad 308 on the active device 307, and the metal pad 308 are an aluminum pad or a gold pad etc. By means of the die attachment process 314 (indicated by an arrowhead), the active device 307 is attached to the position 312 on the device-carrier substrate 309. There are pre-accomplished metal pad 310 and conductive line 311 on the device-carrier substrate 309 for electric interconnection between the passive device 313 (shown as dotted line) on the device-carrier substrate 309 and the active device 307. The wire bonding process 315 is shown in FIG. 3b-2, wherein the electric interconnection between the metal pads 308 and 310 are accomplished by the wire bonder after proceeded with the die attachment process. FIG. 3b-3 is a cross-sectional view of FIG. 3b-2. FIG. 3b-4 shows that the photoelectric device 300B can also be integrated in accordance with the design for occasional application, such as LED (light-emitting diode) and laser diode, and a general LED is shown in the figure.

Besides, after the integration of the active/passive devices with the MEMS devices, in case of an exceptional situation is happened while the testing process, the failed device are retrieved and replaced at once. The properties of the passive device can also be trimmed at the wafer-level by laser trimming method and other methods that ordinary used by the industries.

Another, the fabrication for packaging the corresponding devices are accomplished at the wafer-level. Wherein, the devices involved in the system integration may be the aforementioned passive devices, active devices, MEMS devices and photoelectric devices; they may also be optical communication devices, optical components, bio-chemical/micro-fluidic devices, various driving circuits or integrated circuits.

EXAMPLE 3

How to Form the Pre-bonded Interface

In the example 3, the formation and the structure of the pre-bonded interface in accordance with the present invention will be described in detail. Here, it is divided into 3 items for explanation:

(a) How to form the pre-bonded interface by using the solder/metal bump.

(b) How to form the pre-bonded interface by using the three dimensional micro-spring instead of the solder/metal bump.

(c) How to form the pre-bonded interface by using the microstructure.

Now, each item is illustrated sequentially as follows.

(a) How to Form a Pre-bonded Interface by using the Solder/metal Bump

FIGS. 4a through 4h indicated that how to form a pre-bonded interface for the interface by applying solder bump. Please refer to FIG. 4a firstly, it shows a cross-section 225 along C—C on FIG. 2r same as FIG. 2r-1, and it illustrates the relative positions of the adjacent lids along the cross-section C—C on FIG. 2r. There is a dotted line 214 indicating a separation location for the two adjacent lids. Especially in this example, the first conductive layer is provided with electric interconnections between the functional circuit or the metallic shielding layer 221A fabricated onto the microstructure 217A of the front-side substrate, and the metal pad 221E on the backside substrate, and the first conductive line 221D. And a bonding structure 223B is formed by the UBM layer 222 and the metal bump 223.

Figures 1, 4C:
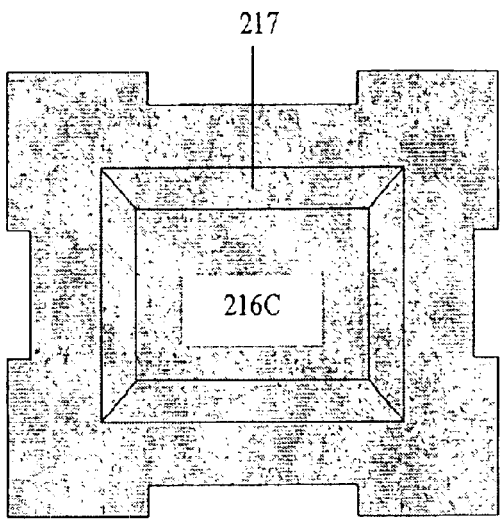
Figures 2, 4C:
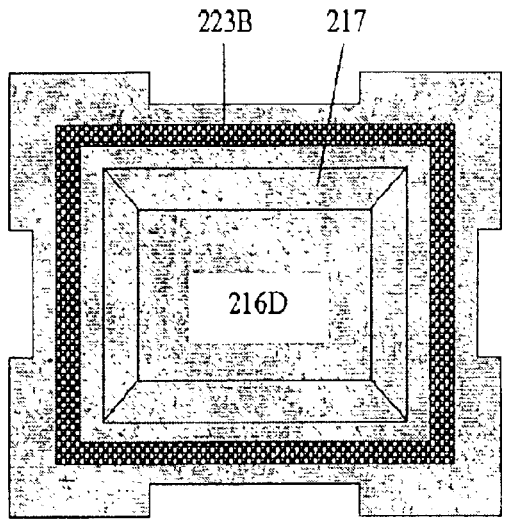
Figures 3, 4C:
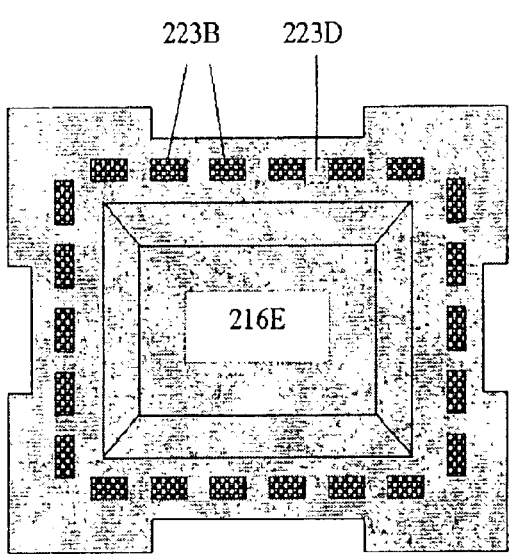
Figures 4, 4C:
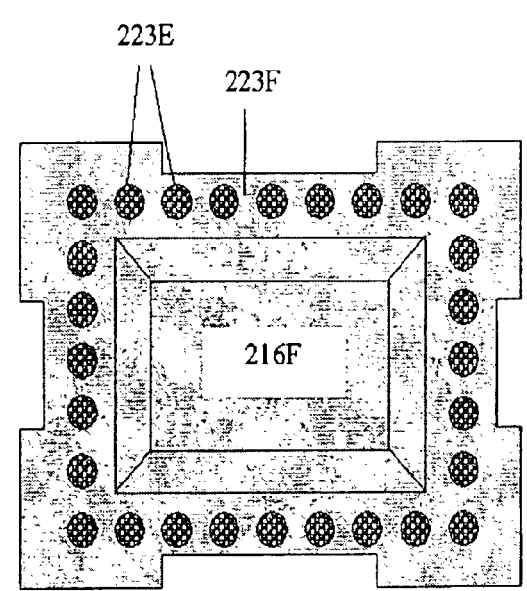
Figure 4D:
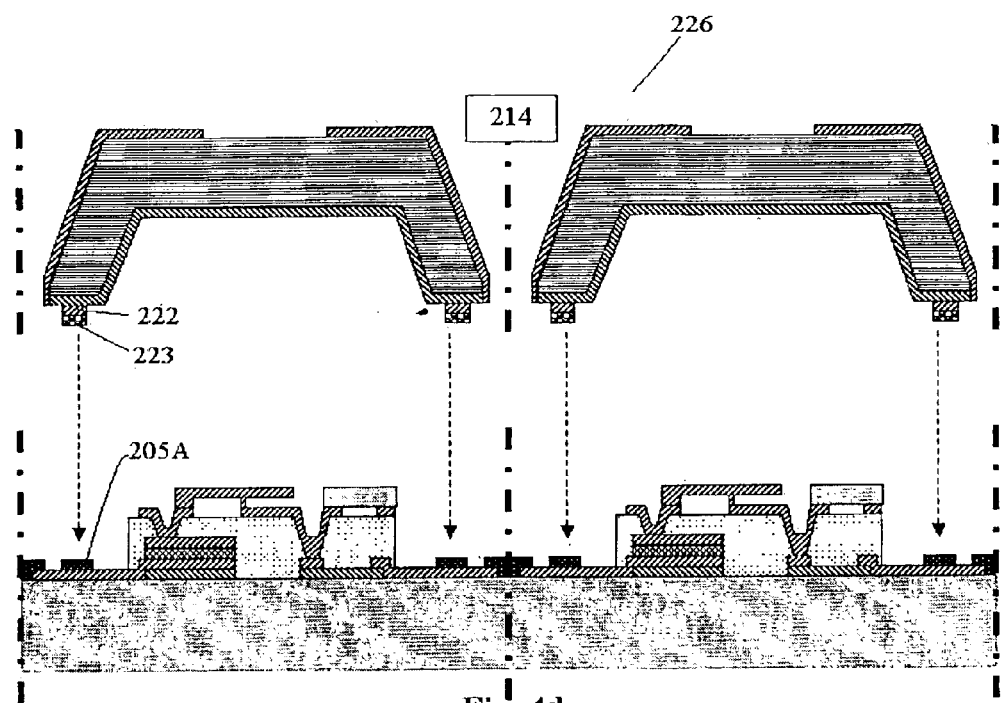
Figure 4E:
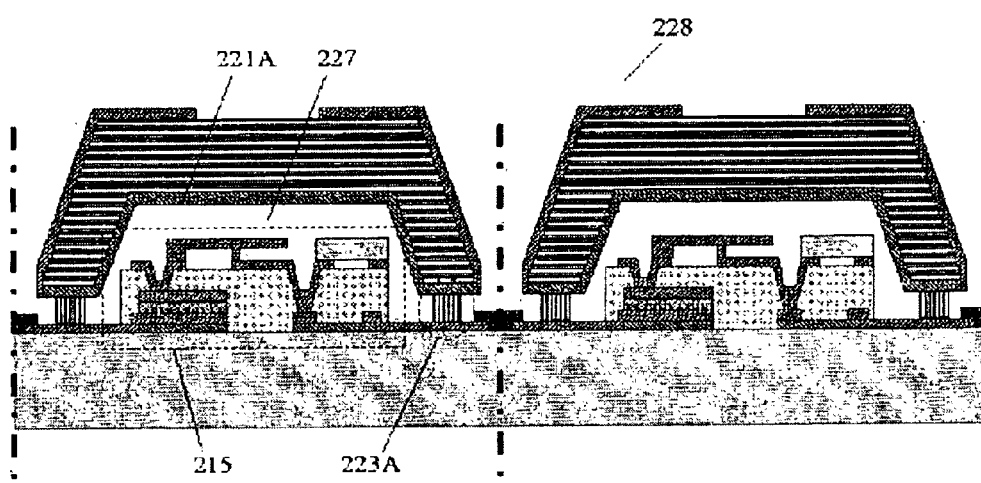

FIG. 4b shows the outline 400 seen from the front-side 216A of the lid substrate that is already fabricated. On the outline 400, the relative positions of the adjacent lids 216 (216C, 216D, 216E and 216F), the microstructure 217A, bonding structure 223B and the micro-inlet 218 are observed clearly. In order to explain the outline and the layout of the bonding structure 223B, there are three comparative examples 216D (FIG. 4c-2), 216E (FIG. 4c-3), 216F (FIG. 4c-4) from FIG. 4b. FIG. 4c-1 shows a lid substrate 216C without bonding structure. FIG. 4c-2 shows that the bonding structure 223B on the lid substrate 216D is enclosed-shaped. FIG. 4c-3 shows that the discrete bonding structure 223B on the lid substrate 216E; it is different from FIG. 4c-2 that the bonding structure 223B is not continuous that there is gap 22 between each bonding structure. FIG. 4c-4 shows that the discrete bonding structure 223B on the lid substrate 216F, and the microstructure 217A is surrounded therein; the bonding structure 223B is discrete that there is gap 223F generated between each bonding structure; there is difference from FIG. 4c-3 that solder balls and UBM layers are applied during the formation of the bonding structure 223E. Then, FIGS. 4d and 4e are cross-sectional views showing the steps of forming pre-bonding interface similar to the aforementioned FIGS. 2s-1 and 2s-2.

Here, the bonding structure can be made of non-metal, such as UV epoxy, BCB or other materials that will enhance the bonding strength between the upper and lower substrates (refer to the reference material [11]). The bonding structure can constitute an interface of enclosed-shape bonding ring, an interface of discrete bonding, contact area and the combination of these two formats on different locations of substrates.

(b) How to Form the Pre-bonded Interface by using Interposer: Three-dimensional Micro-spring FIGS. 4f through 4m illustrates how to form the pre-bonded interface by applying a three dimensional micro-spring instead of the aforementioned metal bump. Numeral 401 of FIG. 4f indicates that the three dimensional micro-spring 223F or 223G (micro-springs with different shape, please refer to the background of the invention for the structure illustration) is applied instead of the solder/metal bump 223 shown in FIG. 4a. Please refer to the U.S. Pat. No. 6,110,823 by the Form Factor Company (reference material [6]) for the fabrication of the three dimensional microspring. Here, only the application of this three dimensional micro-spring for the present invention is illustrated directly. The front-side 216A of the lid substrate 216 is arranged below, and the backside 216B is above. The microstructure 217A is opened downwards, and the through-hole microstructure 217B is opened upwards. There is a dotted line 214 indicating a predetermined position for dividing the two adjacent lids. Especially in this example, the first conductive layer is provided with electric interconnections between the circuit on the front-side 216A of the substrate, the metal pad 221E, and the first conductive line 221D on the backside 216B of the substrate.

Figure 4F:
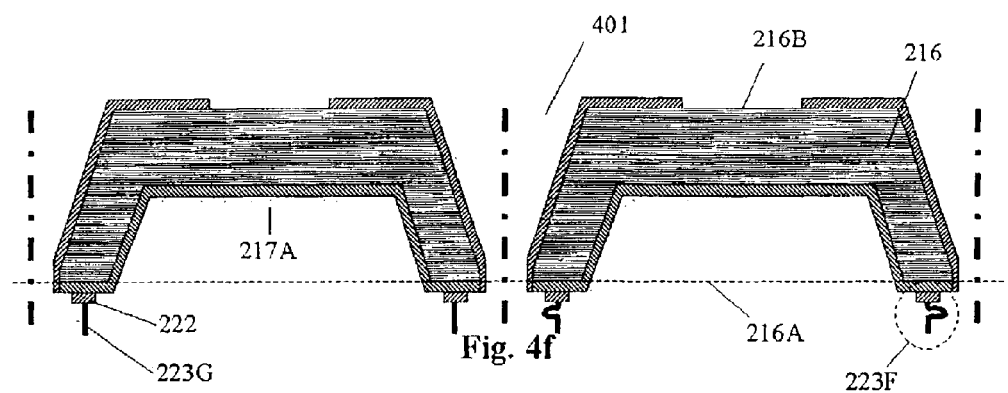
Figure 4G:
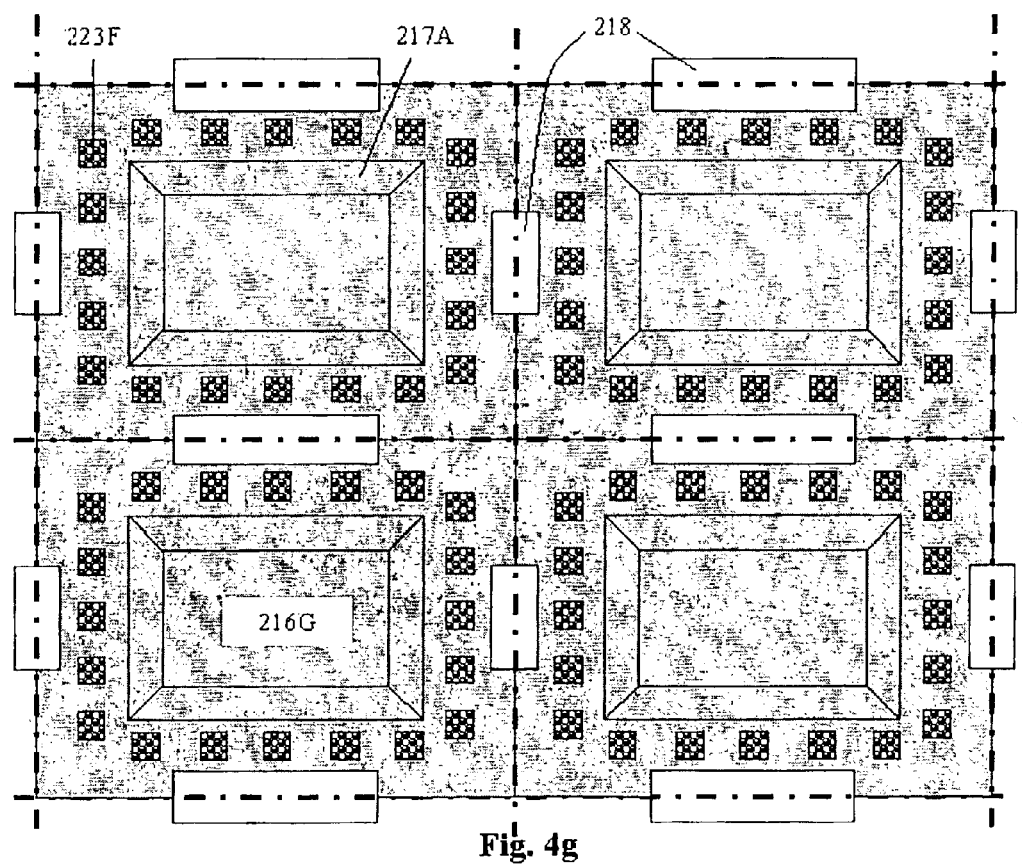
Figure 4H:
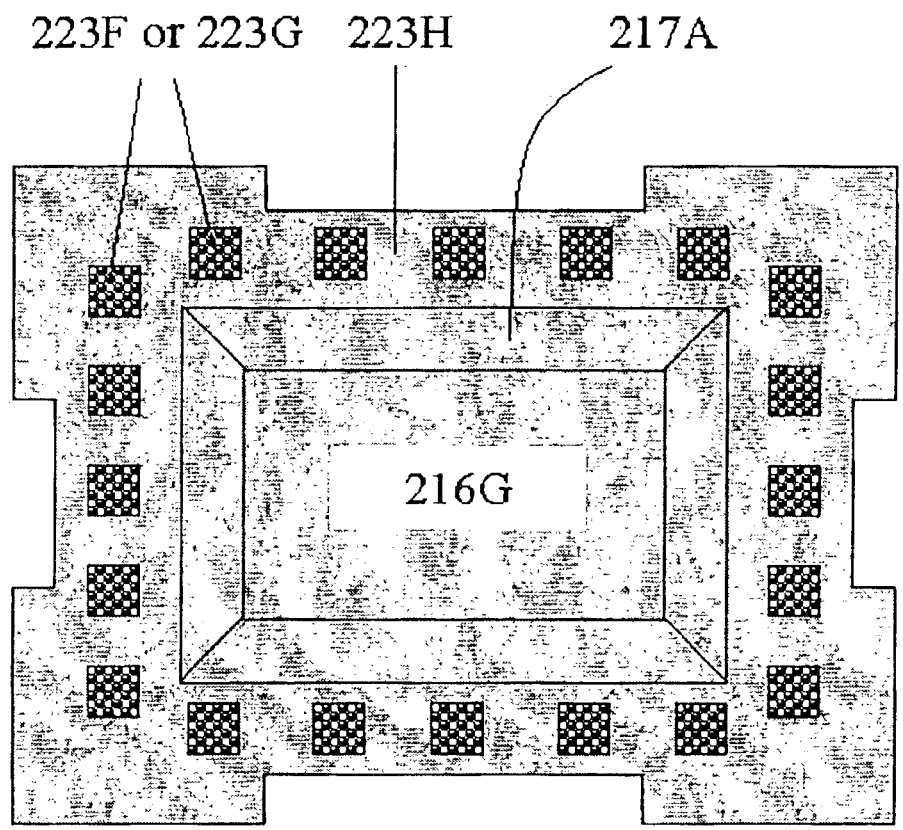
Figure 4I:
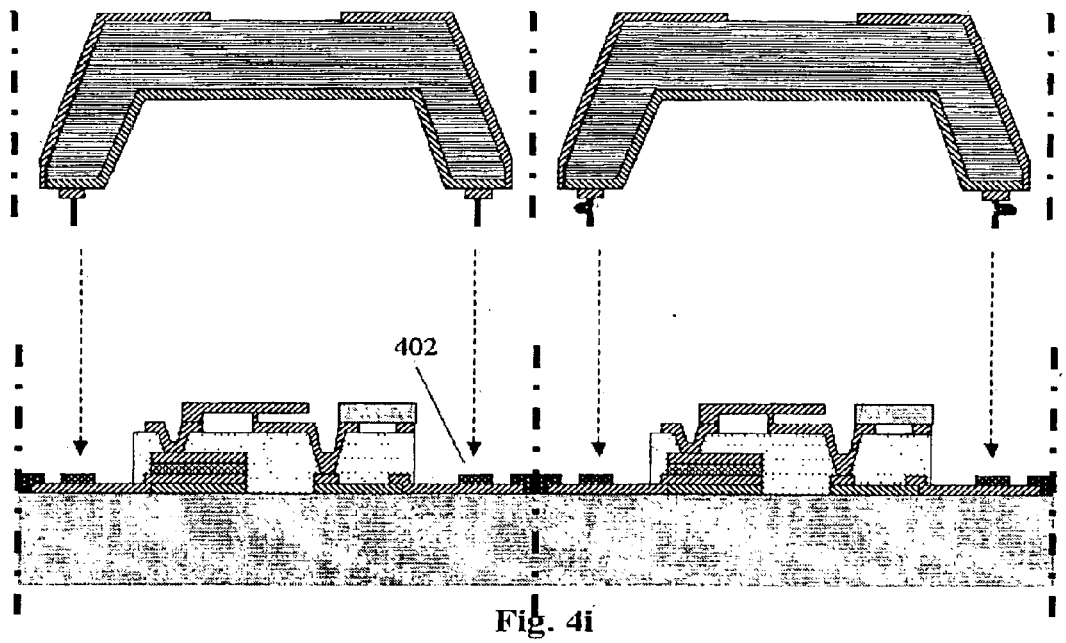
Figure 4J:
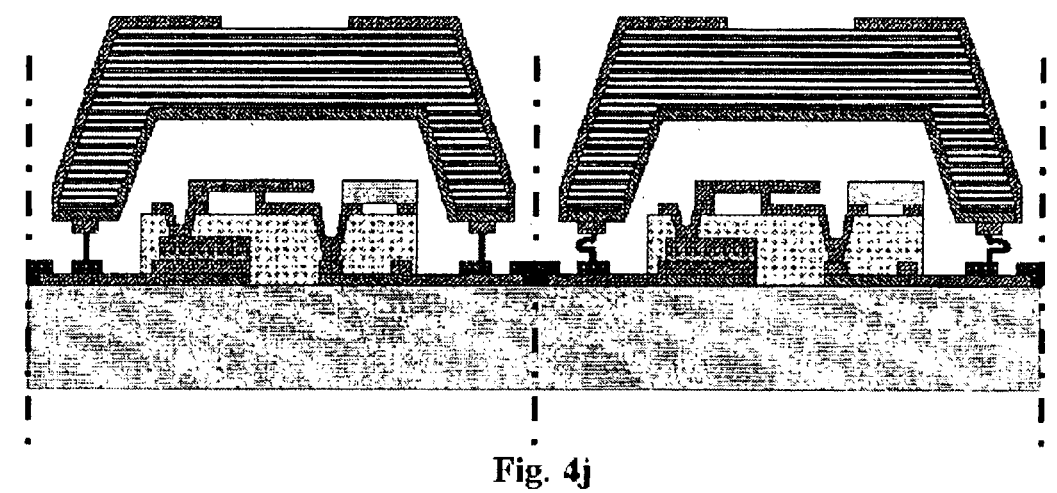
Figure 4L:
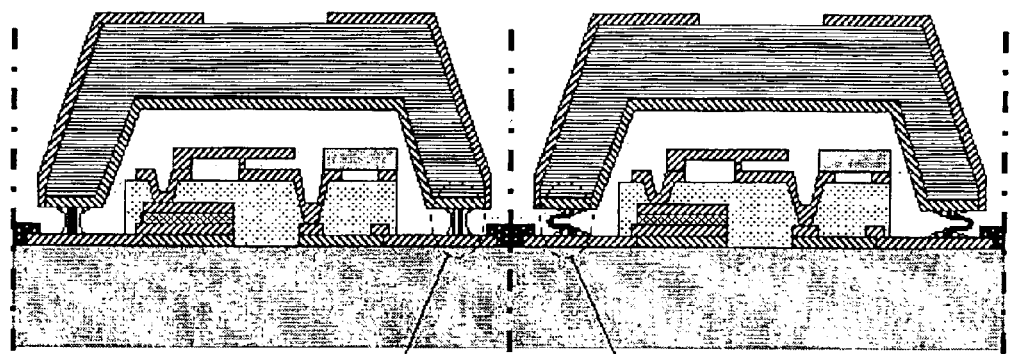
Figure 4L:
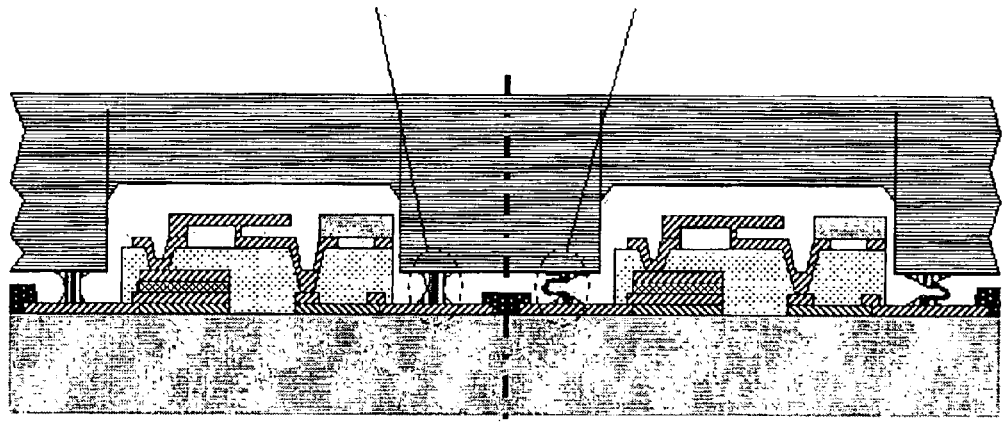

FIG. 4g is an outline seen on the front-side 216A of 401 on FIG. 4f, wherein the relative positions of the adjacent lids 216G the microstructure 217A, the three dimensional microspring 223F or 223G and the micro-inlet 218 are observed clearly. By comparing with FIG. 4b, the three dimensional micro-spring can only be applied with a discrete layout (see FIG. 4h). In FIG. 4h, the three dimensional micro-spring 223F or 223G of the lid 216G is ring-shape disposed surrounding the microstructure 217A, and the three dimensional micro-spring 223F or 223G is discrete that gaps 223H are provided between the three dimensional micro-springs. FIGS. 4i and 4j indicate that a solder paste of 63 Sn—37 Pb or other solder flux is applied to the UBM layer 402 of the device-carrier substrate, and the lid substrate applied with a three dimensional micro-spring is fetched onto the solder point of the device-carrier substrate accurately by the apparatus for auto-alignment & placement. By proceeding with the reflow technique, a perfect solder joint 402A or 402B is formed (see FIGS. 4k and 4l).

(c) How to Form the Pre-bonded Interface by using the Microstructure

Figure 4M:
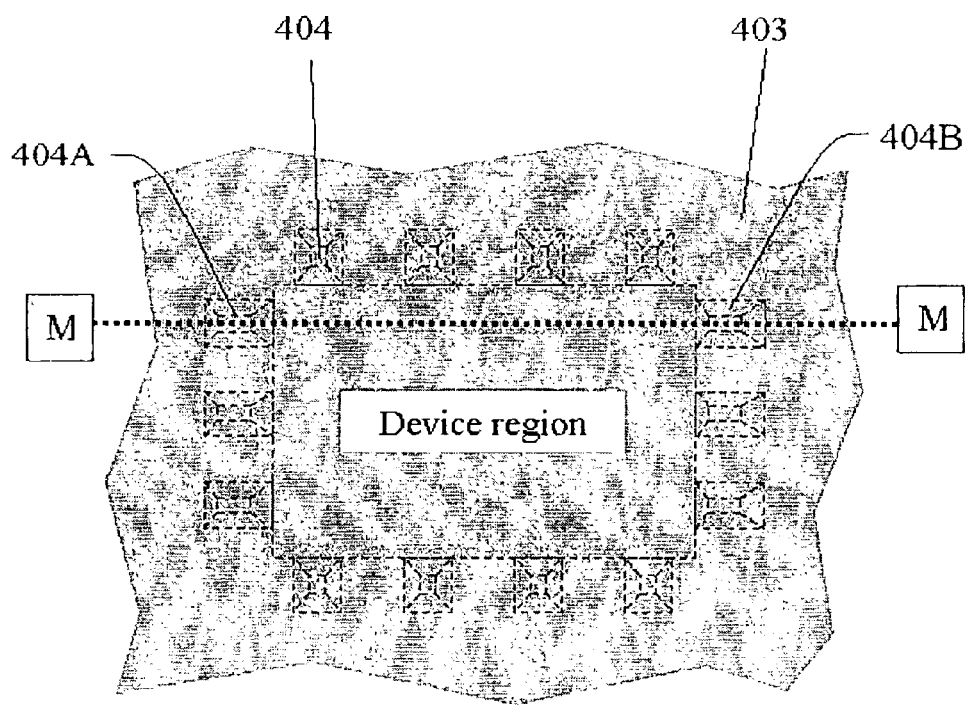
Figures 1, 4M:
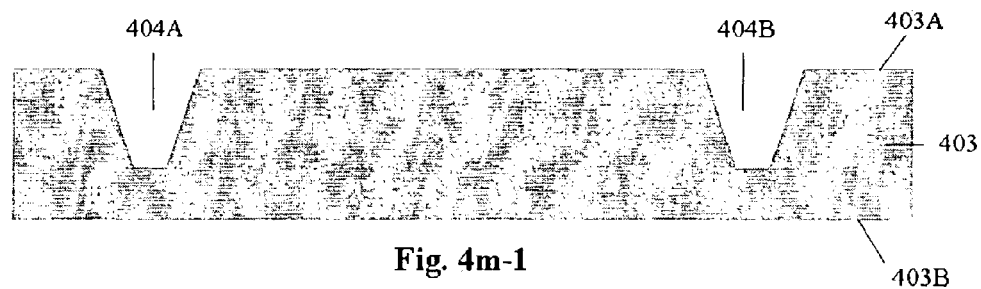
Figures 2, 4M:
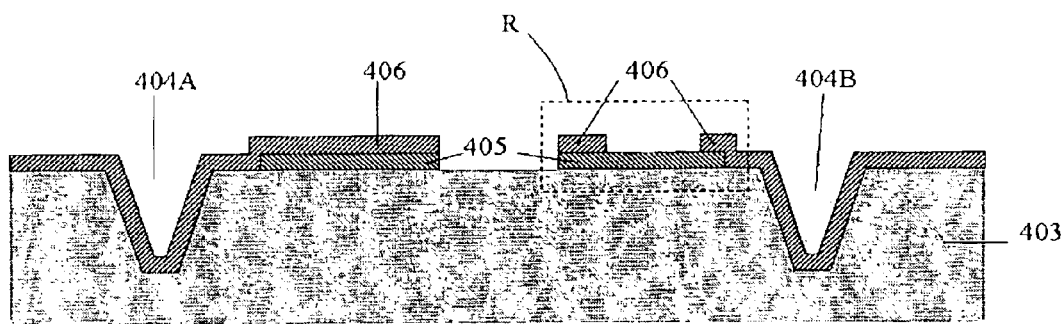
Figures 3, 4M:
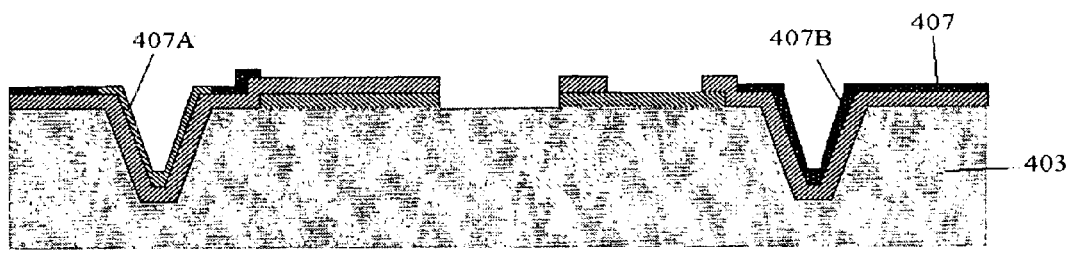
Figures 4, 4M:
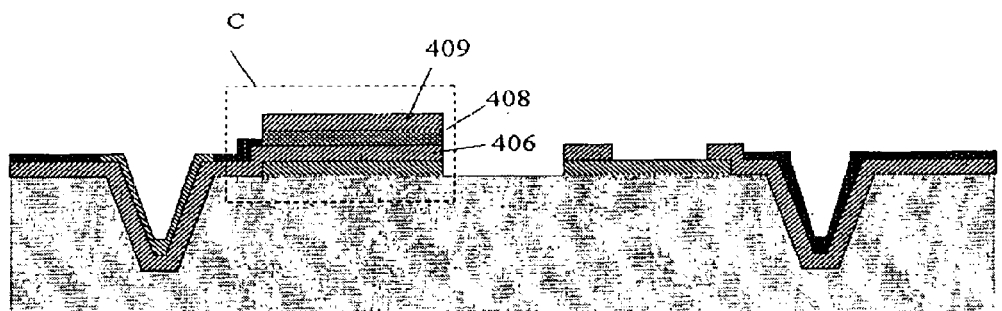
Figures 4, 4M, 5:
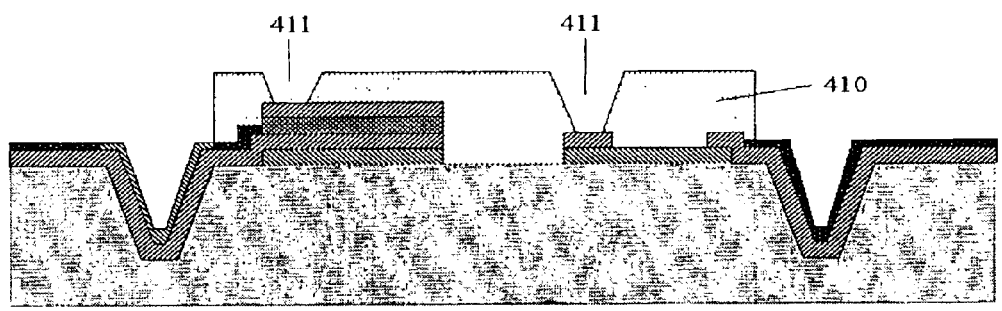
Figures 4, 4M, 5, 6:
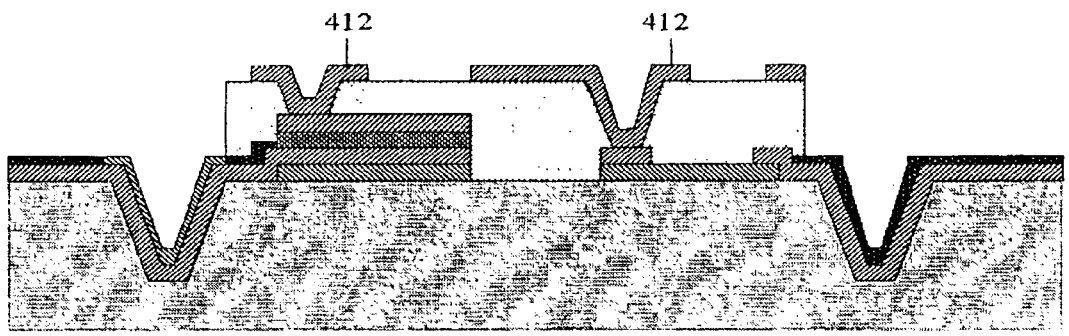
Figures 4, 4M, 5, 6, 7:
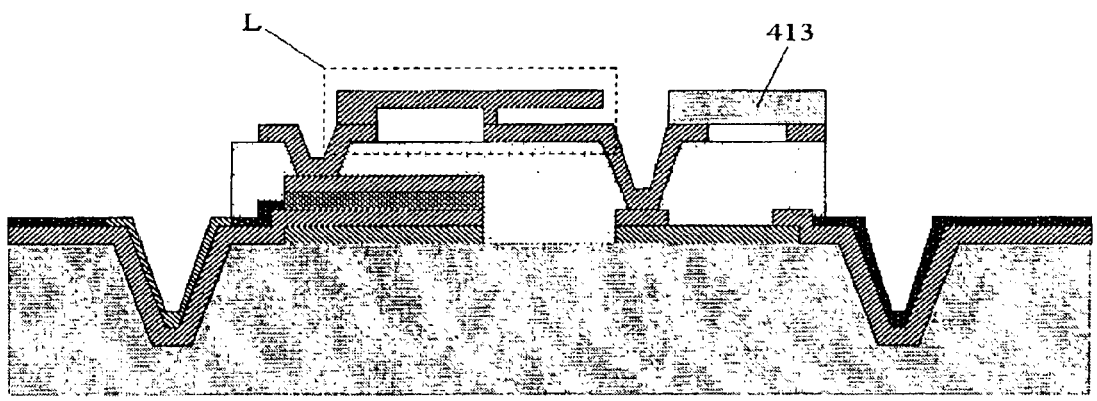
Figures 4, 4M, 5, 6, 7, 8:
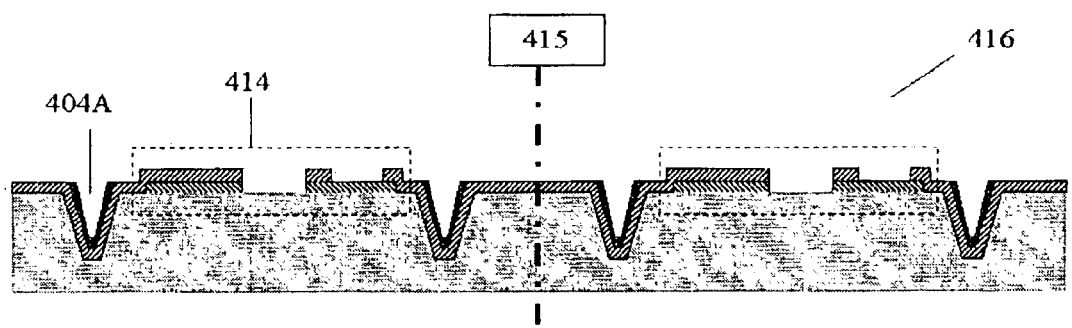
Figures 4, 4M, 5, 6, 7, 8, 9:
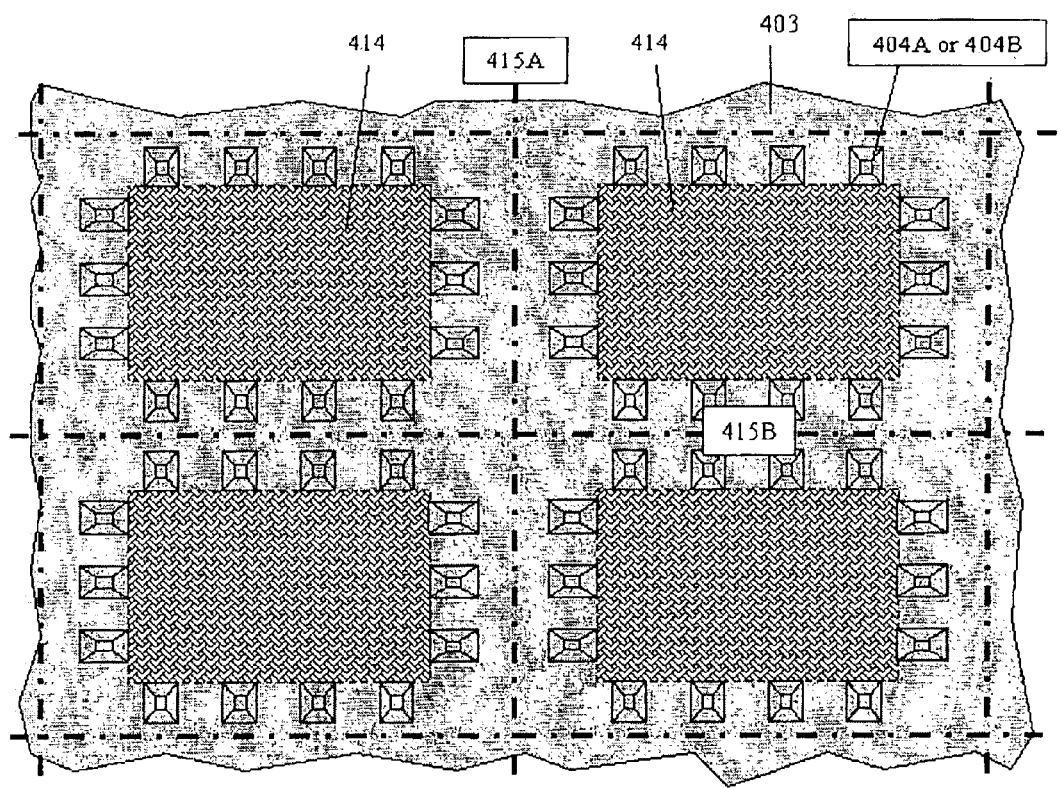

In FIGS. 4m through 4m-8, show an example of making the said assembled and integrated elements (locate at Device region, shown in FIG. 4m) and bonding-aiding microstructures 404 on the device-carrier substrate 403.

In FIG. 4m-1, show the cross-sectional view of substrate 403 along M—M, concave microstructures 404A and 404B are made onto substrate 403 by using the photolithography and micromaching processes. For example, in a silicon wafer of crystalline orientation [1,1,0], can be etched in a solution of a mixture of 24% potassium hydroxide, 63% water and 13% isopropyl alcohol to form the said cavity microstructure. Here, other processes for fabricating the microstructure can also be applied.

Secondly, as shown in FIG. 4m-2, a resistance layer 405 and a first conductive layer 406 are deposited and defined by etching or using the lift-off method. The first conductive layers 406 are formed onto the both ends of the resistance layer 405, and a resistor structure R is formed. Another, the first conductive layer is extended onto the device-carrier substrate 403 and the microstructures 404A and 404B, and is used as the first conductive line, the metal pad or a UBM layer provided for further growing the solder/metal bump. Next, as shown in FIG. 4m-3, an interface layer 407 is deposited and defined, which are made of metallic or conductive, and non-metallic or non-conductive materials. In order to simplify the explanations, two ways 407A and 407B are illustrated simultaneously in FIG. 4m-3. Wherein, 407A applied with UBM layer is provided with a electric interconnection between the first conductive line and the bonding structure material of the follow-up lid substrate; and on 407B is the isolation layer of the first conductive line.

Next, as shown in FIG. 4m-4, a dielectric layer 408 and a second conductive layer 409 are deposited and defined sequentially. A capacitor structure C with conductive layer/dielectric layer/conductive layer is formed by the first conductive layer 406 and the second conductive layer 409, and the dielectric layer 408 therein.

Then, as shown in FIG. 4m-5, using the spin-on method to form a protection layer 410. The protection layer 410 is made of a dielectric material with low dielectric coefficient, which is thick enough to cover the passive devices of the resistor and the capacitor, and it is applied to the substrate 403 uniformly. Then, a contact window 411 is defined on the protection layer 410.

Next, as shown in FIG. 4m-6, a third conductive layer 412 is deposited and defined in order to form a second conductive line on the front-side, and redistributed electrodes for the lower devices, the resistor and capacitor, is accomplished.

After the third conductive layer 412 is accomplished, various active/passive devices are fabricated onto the protection layer 410 by various techniques of bonding and assembly. For example, in plating process, the second conductive line that was defined previously are used as a bottom electrode for further plating step. Then the passive devices, such as the MEMS three dimensional inductor (like the L of FIG. 4m-7), or the active devices, such as the MEMS microwave switch can be made by using the said plating step. Besides, the active devices like integrated circuit dies of silicon or the power amplifier devices of the gallium arsenide etc. are flip-chip assembled onto the appropriate position of the third conductive layer 412.

FIG. 4m-8 shows the appearance 416 of the whole device-carrier substrate that it is accomplished. The dotted line 414 indicates the device area of the said elements. The dotted line 415 exhibits a separating location for further dividing the device-carrier substrates.

FIG. 4m-9 shows the top view of the device-carrier substrate 403, wherein a dotted-line region exhibits the said functional clement 414. Numeral 404A or 404B indicates the microstructures that was made previously for forming the pre-bonded interface, which is arranged as a single-row, ring-shape or non-enclosed type as shown in FIG. 4m; alternatively, it can also be arranged as a multi-row or enclosed type. Besides, the difference between the microstructures 404A and 404B is: a solder metal 407A is used as a material for the interface layer of the microstructure 404A, and an isolating material 407B is used as a material for the interface layer of the microstructure 404B. The division line 415A and 415B are perpendicularly intersected with each other, and they indicate the division positions. Accordingly, the fabrication processes of the device-carrier substrate are described above, and the processes of the lid substrate will be described as follows.

Figures 1, 4N:
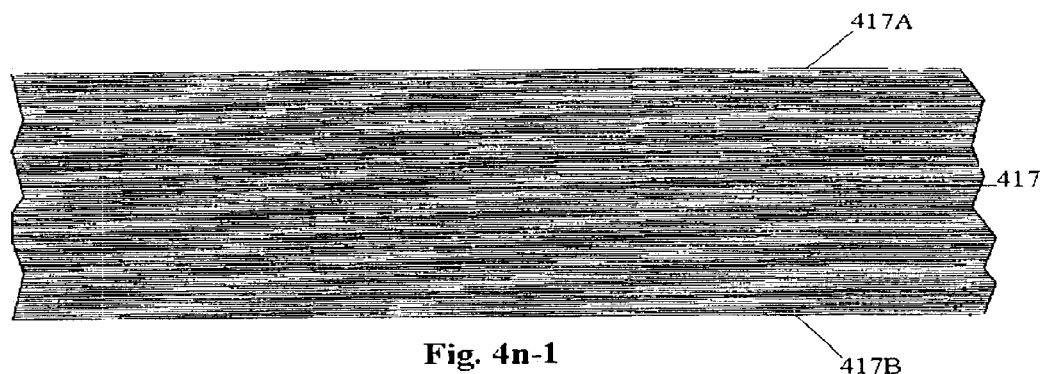
Figures 2, 4N:
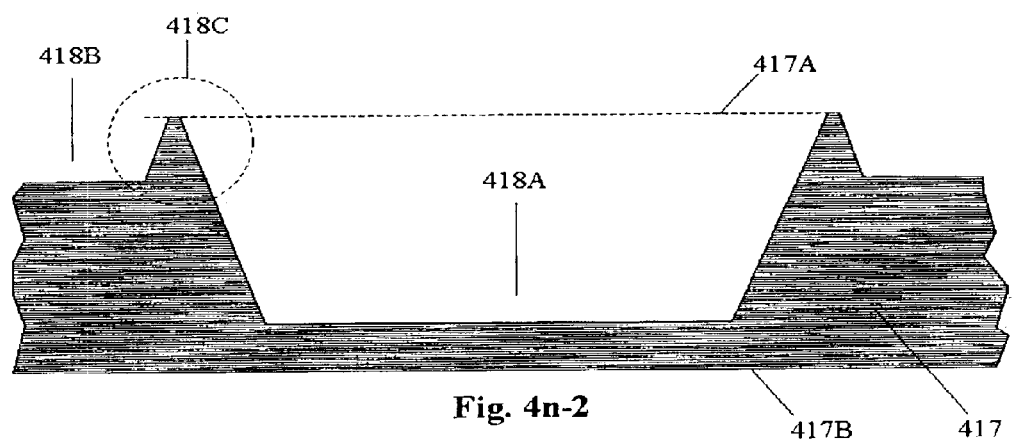
Figures 3, 4N:
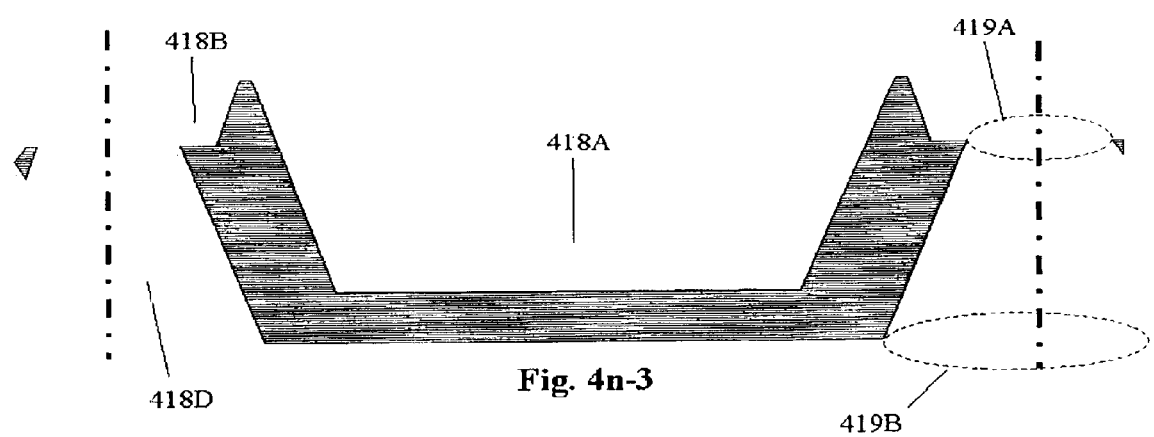
Figures 4, 4N, 5, 6, 7:
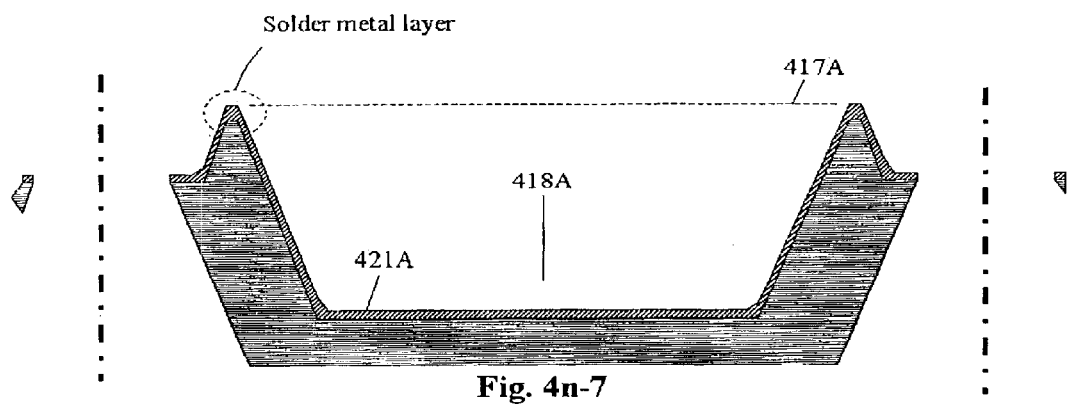
Figures 4, 4N, 5, 6, 7, 8:
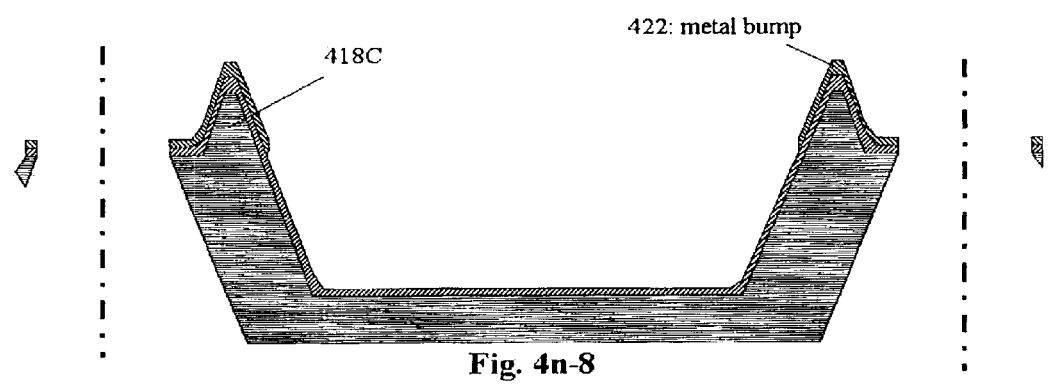
Figures 4, 4N, 5, 6, 7, 8, 9:
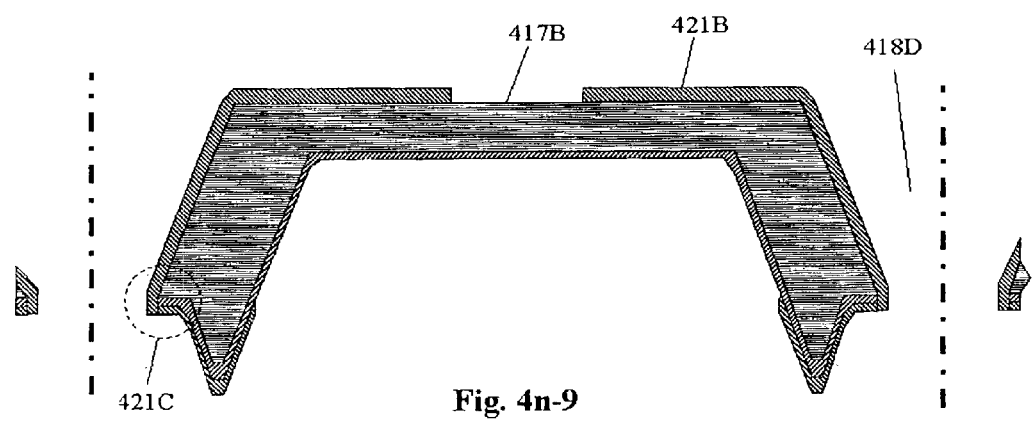
Figures 4, 4N, 5, 6, 7, 8, 9, 10, 11, 12:
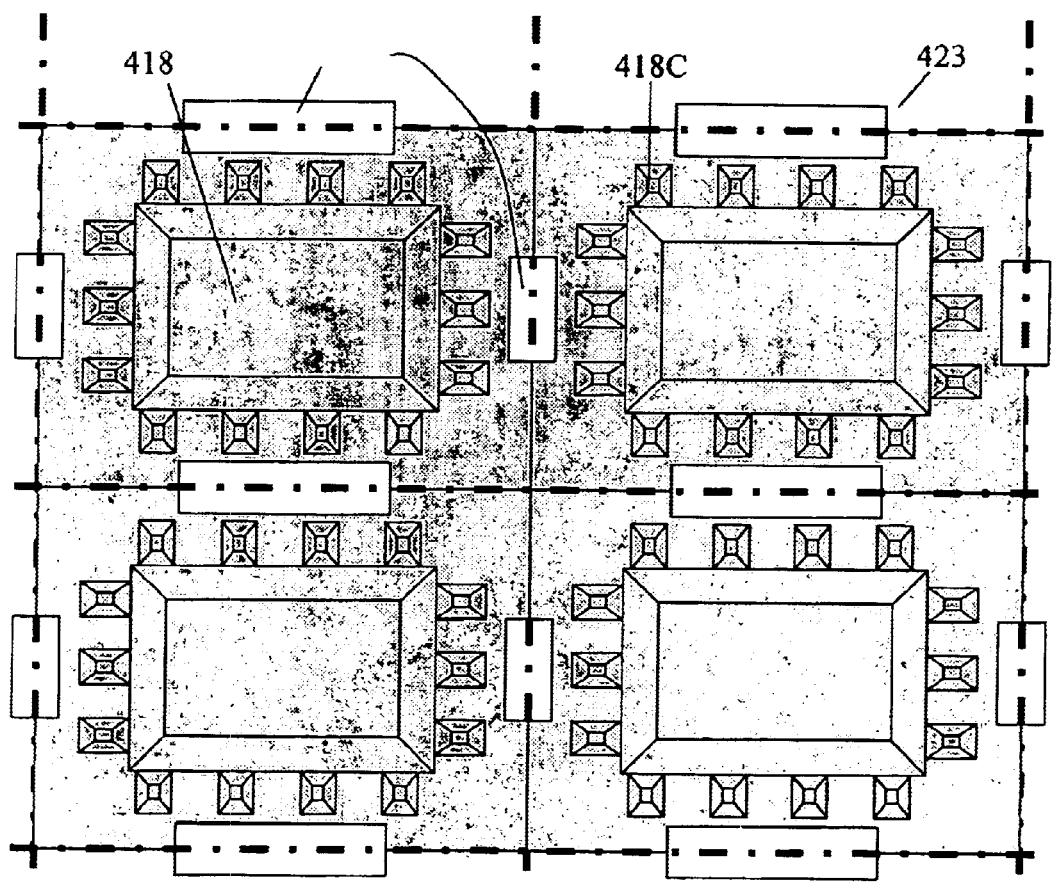
Figure 4O:
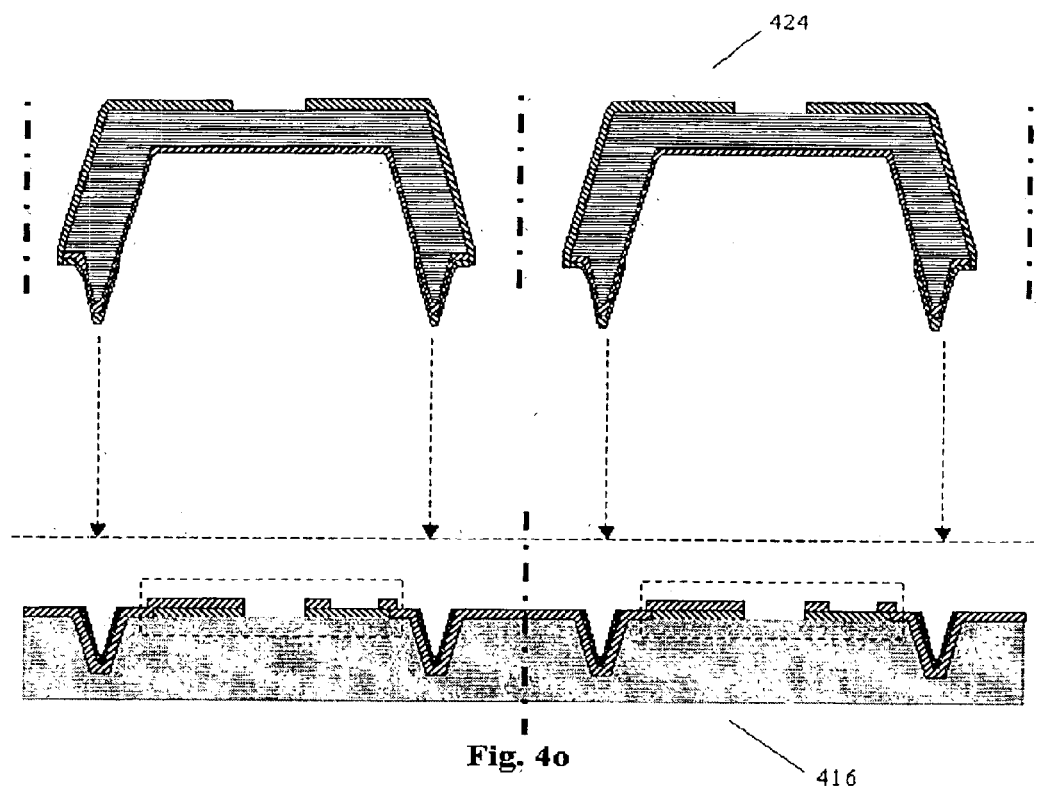
Figure 4P:
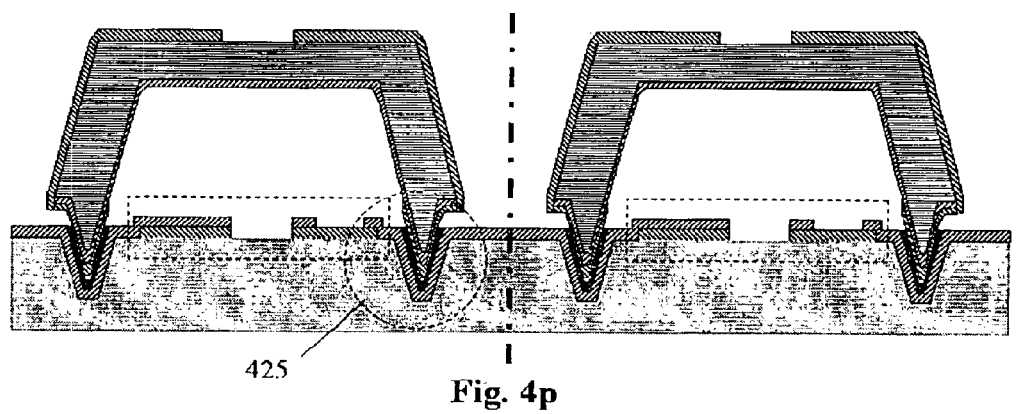
Figures 1, 4Q:
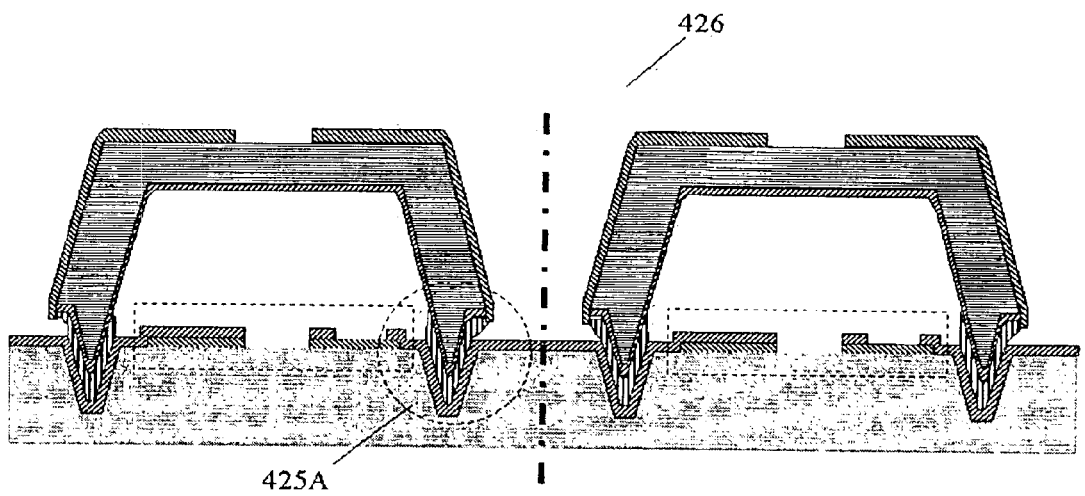
Figures 2, 4Q:
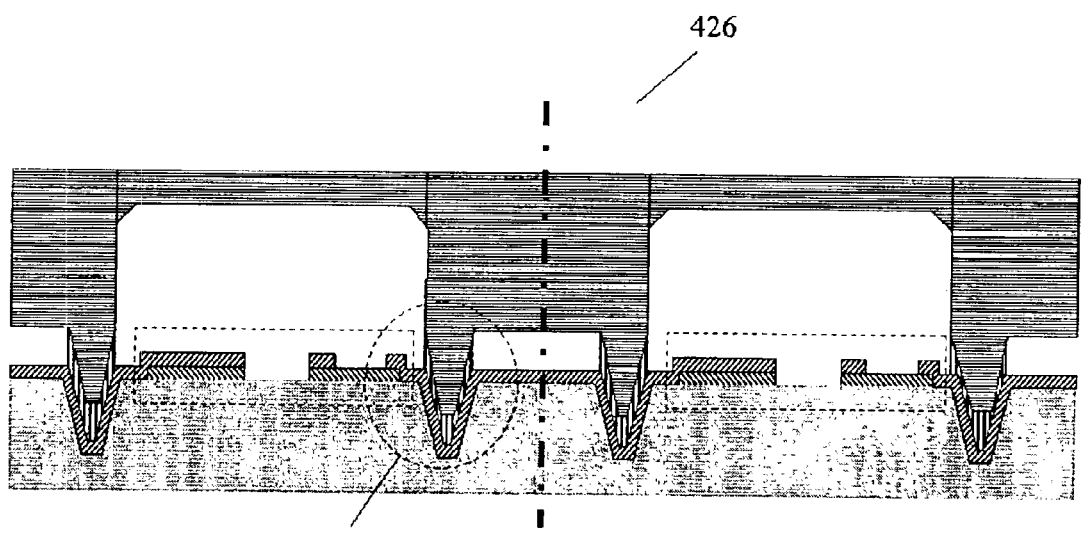

As shown in FIG. 4n-1, a silicon substrate with crystalline orientation [1,1,0] 417 is applied as a lid substrate. In FIG. 4n-1, the front-side is 417A, and the backside is 417B. Another, as shown in FIG. 4n-2, by using the photolithography and micromaching processes, the microstructures 418A and 418B are fabricated onto the front-side 417A of the substrate 417. Besides, a convex microstructure 418C is generated with respect to the concave microstructures 418A and 418B. Wherein, the microstructure 418A is applied to the device-carrier substrate 403 for providing a sufficient space for the said elements 414. For example, a silicon substrate of crystalline orientation [1,1,0] can be etched in a solution of a mixture (24% potassium hydroxide (KOH), 63% water and 13% isopropyl alcohol to form the said microstructures. Here, other methods for fabricating the microstructure can also be applied. Next, as shown in FIG. 4n-3, by using the photolithography technique and the micromaching technique etc., a through-hole microstructure 418D is fabricated onto the backside 417B of the substrate 417, thus the front-side 417A and the backside 417B of the substrate 417 can reach each other via the through-hole microstructure 418D. A micro-inlet 419A is an opening formed onto the front-side 417A of the substrate by the through-hole microstructure 418D. Numeral 419B indicates an opening formed on the backside 417B by the through-hole microstructure 418D. For example, a silicon substrate of crystalline orientation [1,1,0] can be etched in a solution of a mixture 24% potassium hydroxide (KOH), 63% water and 13% isopropyl alcohol to form the through-hole microstructure 418D. Please refer to FIG. 4n-4, after the through-hole microstructure 418D is accomplished, the outline are seen on the backside 417B of the substrate. The black region on the middle of the through-hole microstructure 418D indicates the micro-inlet 419A. In order to explain the structure more apparently, please refer to FIGS. 4n-5 and 4n-6, which illustrate the relative positions between the two adjacent lids from the cross-sections I—I and H—H of FIG. 4n-4, respectively. Wherein, a dotted line 415 indicates a separation location for the two adjacent lids. In FIG. 4n-6, the microstructure 418B are seen, and there is a convex microstructure 418C on both sides of the microstructure 418B. Further as shown in FIG. 4n-7, on the front-side 417A of the substrate and the microstructure 418A, a functional circuit or a metallic thin film is formed by applying the aforementioned processes as shown in FIGS. 2a through 2h. In this example, a first conductive thin film 421A is deposited directly and used as a metallic shielding for protecting the assembled and integrated elements; or an absorber materials, i.e., the getter materials, refer to the reference materials [4] and [5] are prepared too. Besides, the first conductive layer is extended on the substrate 417, the convex microstructures 418C and 418B, so it are used a., the first conductive line, the metal pad or a UBM layer for growing metal bump on the front-side 417A of the substrate. Further as shown in FIG. 4n-8, an interface-bonding layer is selected with respect to the requirements for the bonding structures. In this example, a metal bump 422 is fabricated onto the microstructure 418C, which is predetermined to pre-bond the interface. And with the aforementioned UBM layer 407A on the microstructure 404A of the device-carrier substrate 403 together, the pre-bonded interface are formed. Further as shown in FIG. 4n-9, a first conductive layer 421B is deposited onto the backside 417B of the substrate, and by means of the photolithography technique and the metallic thin film sputtering coating/electroplating method, the required metal pattern are defined. Besides, the first conductive layer 421B is extended on the backside 417B of the substrate and the through-hole microstructure 418D, and it is also used as the first conductive line, metal pad and a UBM layer for growing metal bump on the backside 417B of the substrate. Wherein, the conductive line fabricated along the incline of the through-hole microstructure 418D is in contact with the conductive layer 421 A of the front-side 417A of the substrate at the position of 421C. Since the conductive layer 421A and the conductive layer 421B are deposited separately, a preferred manufacturing method is to be proceeded with the heat treatment thereafter, so as to accomplish a structure with a reliable electric interconnection between the two conductive layers. So far, the fabrication of the lid substrate with microstructures is accomplished. FIG. 4n-10 shows the outline seen on the backside 417B of the substrate after the metal pattern 421B is defined. The metal pattern 421B is formed by the first conductive line 421D and the metal pad 421E. In order to explain the structure and the relative positions between the conductive layers of the adjacent lids more apparently, please refer to FIGS. 4-11, wherein the cross-section J—J of FIGS. 4–10 showing the relative positions of the two adjacent lids is illustrated. The front-side 417A of the substrate is arranged below, and the backside 417B is arranged above; the microstructure 418A is opened downwards, and the through-hole microstructure 418D is opened upwards; a dotted line 421 indicates a predetermined position for dividing the two adjacent lids. Especially in this example, the first conductive layer is provided with electric interconnections between the circuit 421A on the front-side 417A of the substrate, the metal pad 421E and the first conductive line 421D on the backside 417B of the substrate. FIG. 4n-12 shows the outline 423 seen on the front-side 417A of the lid substrate 417. FIG. 4o illustrates that the lid substrate finished product 424, which is proceeded with the processes as shown in FIGS. 4n-1 through 4n-11, and the device-carrier substrate finished product 416, which is proceeded with the processes as shown in FIGS. 4m-1 through 4m-9, are being aligned and pre-bonded. The alignment process is proceeded by an exposure machine, which is capable of double-side alignment, with the aligning patterns or division lines that were designed previously. Here, before the alignment process and the bonding process are proceeded, a best way is to proceed the wafer-level testing for the device-carrier substrate finished product 416 and the lid substrate finished product 424. As shown in FIG. 4p, after the alignment process for the device-carrier substrate finished product 416 and the lid substrate finished product 424, they are fixed by a clamping apparatus. The fixed device-carrier substrate finished product 416 and the lid substrate finished product 424 are moved to the reflow oven or wafer-bonding machine and proceeded with the steps of the solder bonding. Thus, the bonding process is accomplished at the joint 425 of the pre-bonded interface, and the bonding structures 425A and 425B are formed as shown in FIGS. 4q-1 and 4q-2. The combined substrate 426 after being bonded is shown in FIGS. 4q-1 and 4q-2.

In this example, the materials of the interface between the microstructure on the upper substrate and the microstructure on the lower substrate bonded correspondingly are: metal, non-metal, conductor, non-conductor, or other mechanisms that is enabled to form a bonding interface (refer to the reference material [12]).

The microstructures are any three dimensional structure that is helpful to the alignment and bonding processes. It maybe a concave three dimensional structure corresponding with the substrate surface, or maybe a convex three dimensional structure on the substrate surface.

The microstructures can constitute an interface of enclosed-shape bonding ring, an interface of discrete bonding, contact area and the combination of these two formats on different locations of substrates.

The microstructures on the substrate (such as a cavity etc.) are used for providing spaces for accommodating the assembled and integrated elements. In case the materials and the area of the substrate are not increased, by using the microstructures, the reliability of the pre-bonded interface is enhanced. As the microstructures are fabricated to the corresponding positions of the upper and lower substrates, the area for bonding the interface is increased by these microstructures.

Besides, in this example, the through-hole microstructure on the substrate will be used as a glue-inlet for the wafer-level packaging, and it will be described in detail in example 6.

EXAMPLE 4

Path of Signals I/Os and Heat-transfer for the Whole Packaging Structure

Figure 5A:
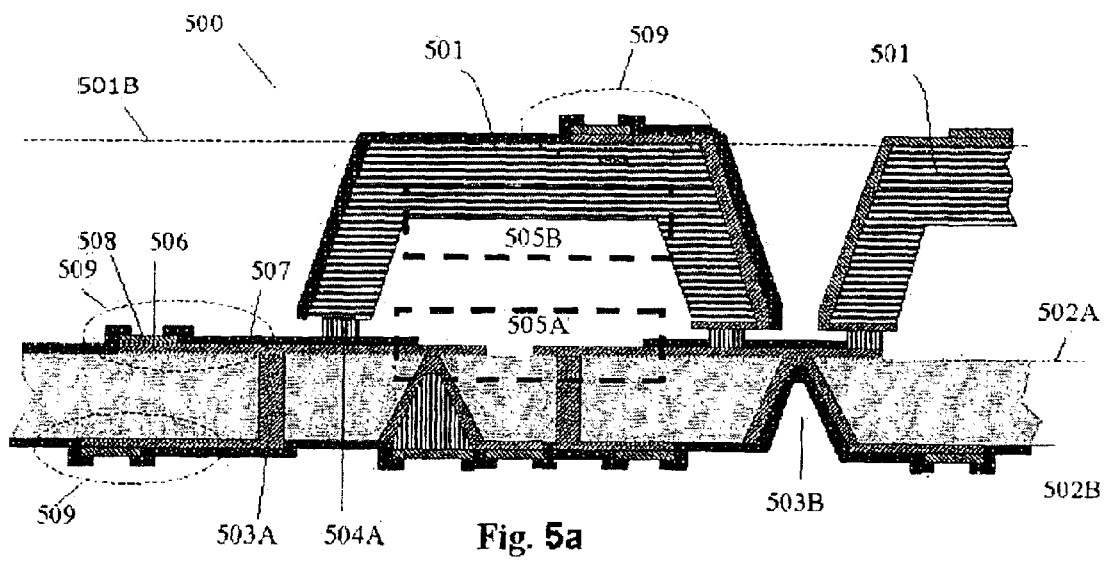
FIGS. 5a through 5n shows the path of electric-signals I/Os (inputs/outputs) and heat-transfer in accordance with different types of package structures in accordance with the present invention, including.

FIG. 5A is the schematic drawing 500 of signal I/Os and heat-transfer for the new packaging structure. Here, the parts of the whole packaging structure are defined: a lid substrate 501, of which the backside 501B; a device-carrier substrate 502, of which the front-side 502A and the backside 502B. Two kinds of through-hole microstructures 503A and 503B, which providing the way of signal-I/Os redistribution between the front-side 502A and the backside 502B of the device-carrier substrate 502, are fabricated by applying various micromaching techniques. There are two regions 505A and 505B: the dotted-line region 505A indicates the device area fabricated on the device-carrier substrate 502 of the assembled and integrated elements, which integrating the active/passive devices with the MEMS devices; and at the dotted-line region 505B, it are the metallic shielding or the device area for integrating active/passive devices with the MEMS devices that is fabricated by using the methods from the above examples. Structures 504A and 504B are the pre-bonding interfaces. The paths of signal I/Os or heat-transfer through the whole package structure are indicated as numeral 509, of which the basic structure comprising a conductive layer 506, a UBM layer 508 and an isolation layer 507 (or a solder mask layer).

Figure 5B:
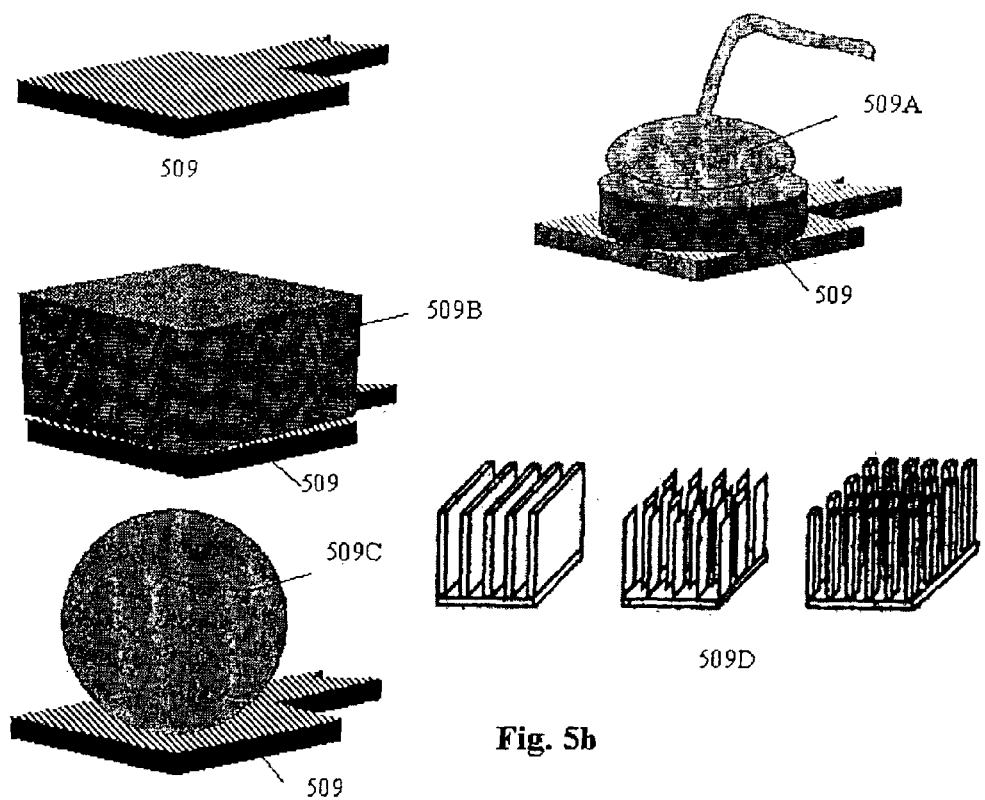

FIG. 5b is a detailed description of the paths of signal I/Os or heat-transfer 509. The path of signal I/Os or heat-transfer 509 may connect with bonding wire 509A, which is a perspective view showing the ball-bond; here, the wedge-bond or the ribbon-bond can also be applied. The path of signal I/Os or heat-transfer 509 are applied with a solder/metal bump 509B or a solder ball 509C, or a large-area conductive pad for heat-sink fin 509D adhering thereon. In addition to as the path of signal I/Os or heat-transfer through the whole packaging, 509 is used as a testing pin while manufacturing, thus it are applied to the wafer-level testing and the quality control.

Figure 5C:
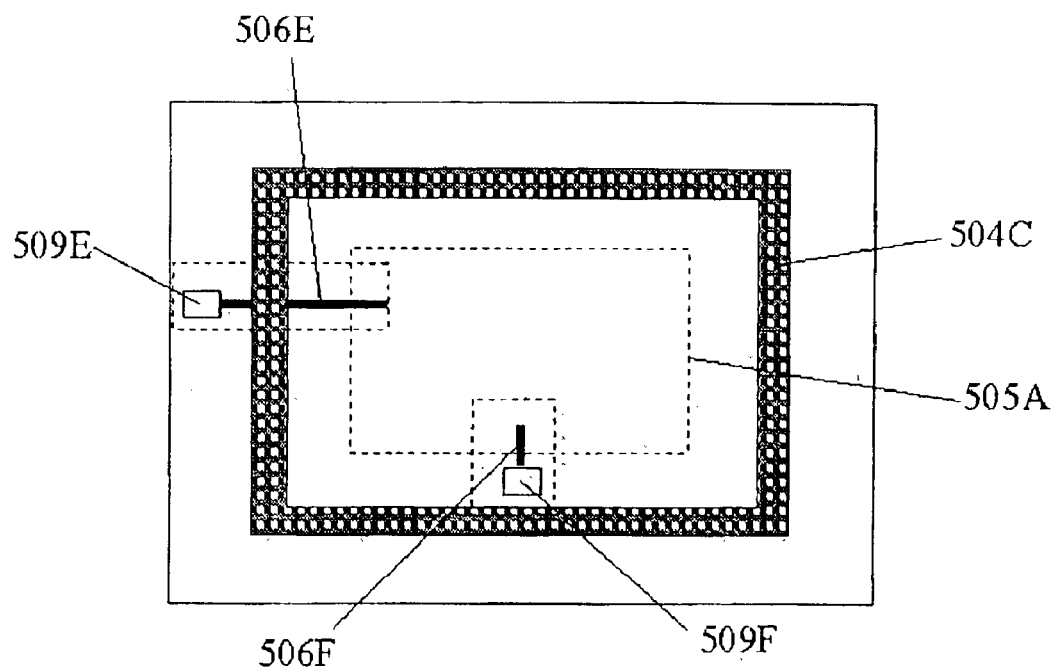
Figure 5D:
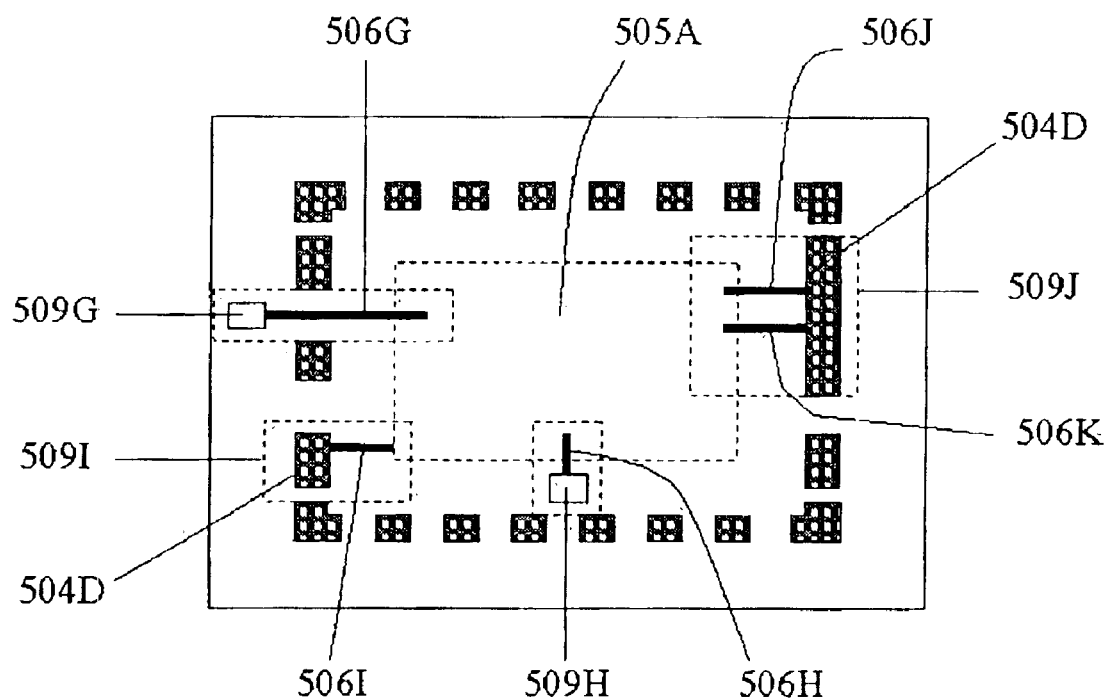

FIGS. 5c and 5d show the routes of the path of signal I/Os and heat-transfer in accordance with FIG. 5a for various types of the pre-bonded structures. For illustrating conveniently, please refer to FIGS. 5c and 5d showing the views seen on the front-side 502A of the device-carrier substrate from FIG. 5a. As shown in FIG. 5c, the assembled and integrated elements 505A for integrating the active/passive devices with the MEMS devices is surrounded by the ring-shaped, continuous pre-bonding structure 504C. In such structure, signals can input/output by two ways 509E and 509F which maybe in 509A, 509B, 509C or 509D. The signal (and heat) from the assembled and integrated elements 505A can pass (flow) via the conductive line 506E, which passed through the bottom of the pre-bonding structure 504C (like FIG. 5a, relationship of pre-bonding structure 504A and conductive layer 506, with isolation layer 507 within), then connect to the UBM layer 509E. The signal (and heat) from the same module 505A by the conductive layer 506F, and connect to the UBM layer, which locate at 509F. In addition, testing pads are provided on 509E and 509F, such perimeter pads dispose as one single row or multi-row, inside or outside the pre-bonding structure 504C, so as to proceed the testing process by using a probe card before the pre-bonding process. As shown in FIG. 5d, the pre-bonding structure 504D locate surround module 505A, discretely disposed. There is four ways for routing signals under the discrete pre-bonding layout: 509G, 509H, 509I and 509J. In 509G, the signal can pass from module 505A via the conductive line 506G, then pass by a gap between two bonding structures 504D, and connect to the UBM layer on 509G In 509H, the signal from module 505A by the conductive line 506H, which connect to the UBM layer 509H. In 509I, signal can pass from module 505A to the conductive line 506I, which connect to pre-bonding structure 504D, and connect with module 505B on the lid substrate 501 via the electric-conductivity pre-bonding structure 504D. Compare with 509I and 509J, the conductive lines 506J and 506K connect to the same bonding structure 503B. Therefore, in the occasions that required for equal electric potential, the bonding structure are used as a common signal I/O, which is connected with the system module 505B on the lid substrate. In addition, the testing pads are also provided in 509G and 509H. The perimeter pads dispose around the module 505A or dispose outside the bonding structure 504D, so as to proceed the wafer-level testing by applying a probe card before the pre-bonding process.

Figure 5E:
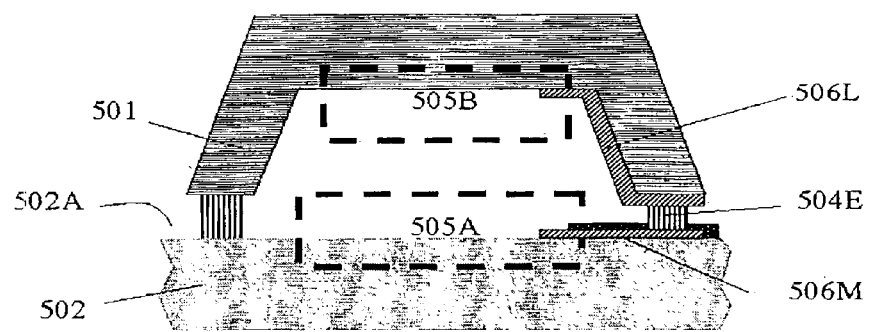

FIG. 5e illustrates how to make the signals to be internal-connected between the system module regions on the upper and lower substrates respectively. Wherein, by means of extending conductive layer 506L on the lid substrate, the pre-bonding structure 504E, and extending conductive layer 506M on the front-side 502A of the device-carrier substrate 502, module 505B of the lid substrate 501 is signal-connected with the module 505A.

In conclusion, this packaging structure is designed that it is allowed of a wafer-level testing for the assembled and integrated elements before the pre-bonding process. The electric properties and the physics characteristics about the module are measured directly on the substrate by a probe or a probe card. In addition, after final testing and packaged at wafer-level, to proceed environmental test at the wafer-level, and the external AC signals are applied by the probe or the wafer-level probe card, or the AC bias is applied, so as to proceed the aging treatment test, for example, the long-time burn-in process etc.

Figure 5F:
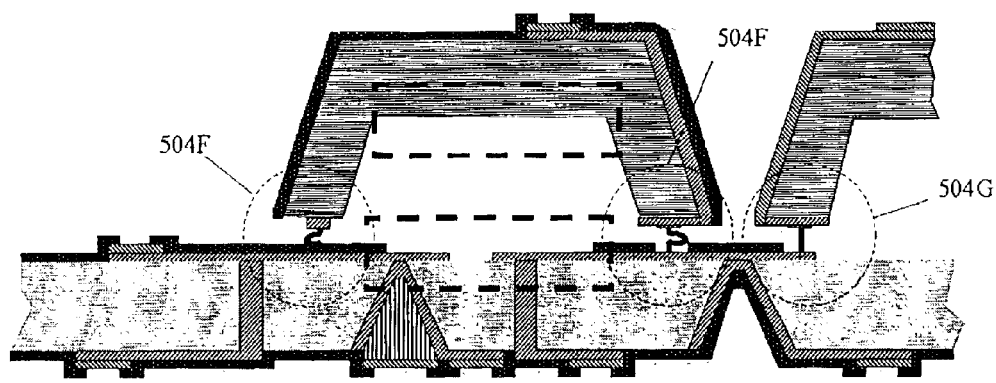

FIG. 5f is similar to FIG. 5a but the micro-springs 504F and 504G are applied instead of the pre-bonding structures 504A and 504B, wherein, as the three dimensional micro-springs are being applied for pre-bonding the interface, the relationship of the signals I/Os are illustrated.

Figure 5G:
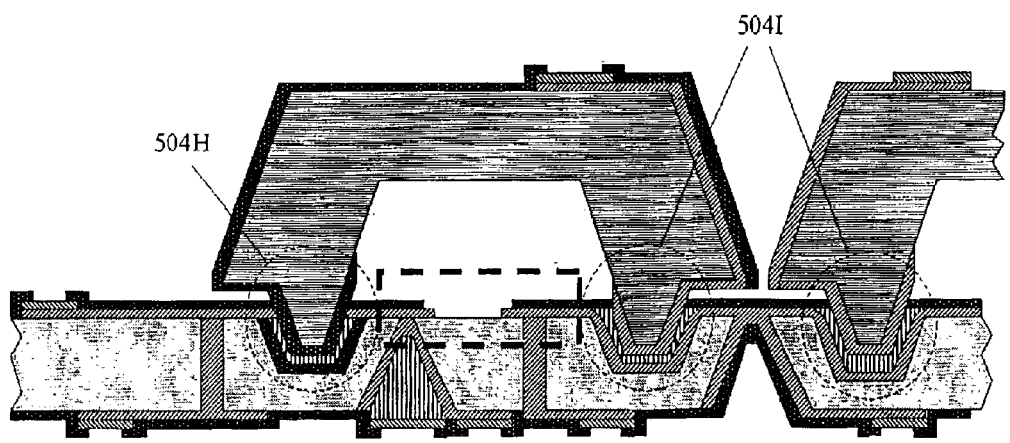
Figures 1, 5G:
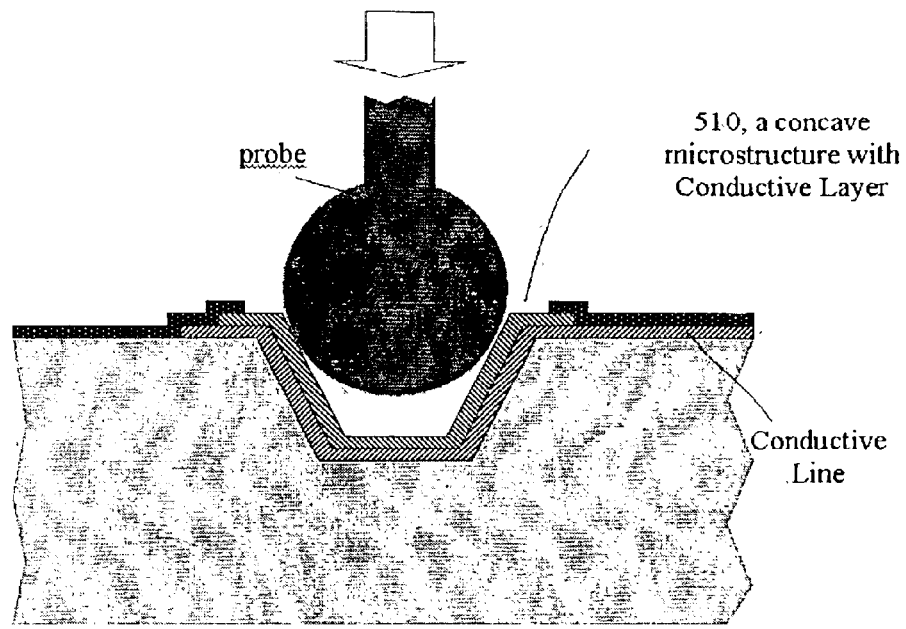
Figures 2, 5G:
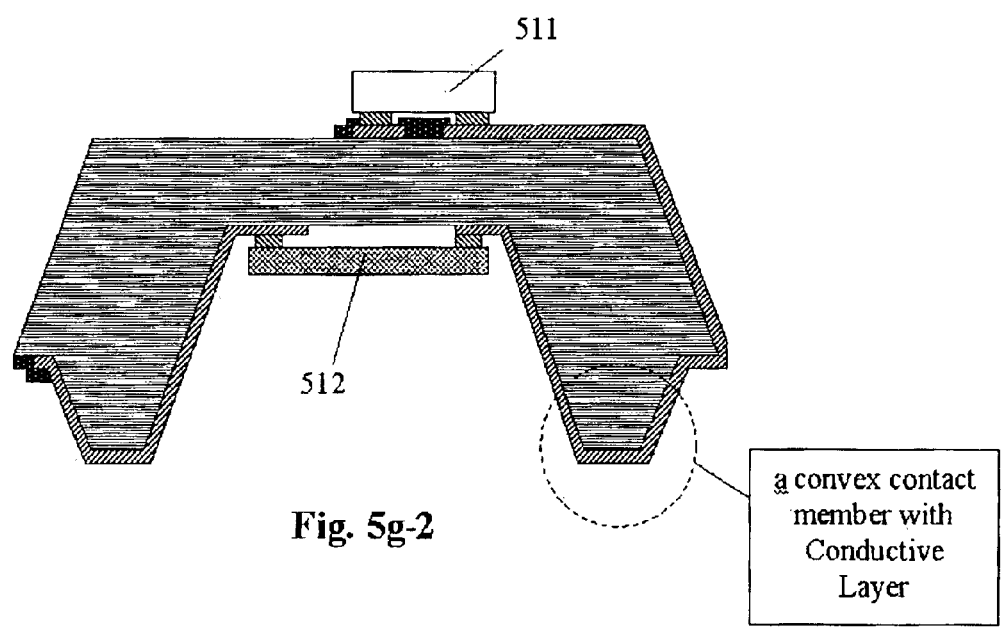

FIG. 5g is similar to FIG. 5a but the microstructure bonding 504H and 504I are applied instead of the pre-bonding structures 504A and 504B, wherein, 504H and 504G illustrates the effect of conductibility or non-conductibility of various materials applied for various ways to bond the interfaces respectively. In addition, the signal I/O terminal is fabricated onto the microstructure, and with the method shown in FIG. 5g, the signal I/O contact or the heat-transfer path that are adequately reliable (see reference material [7]) are formed. Please refer to FIG. 5g-1, by using a concave contact member 510, which is capable of conductibility, and by selecting a wafer-level probe card with a probe that was appropriately designed, the wafer-level testing or the wafer-level burn-in process are proceeded reliably.

Furthermore, because of the package structure, the distribution status of the wafer-level testing or the wafer-level burn-in process cannot be recognized by the ink mark, which is generally used after the packaging process is accomplished. Therefore, the test result mapping data of the wafer is necessary to be recorded; alternatively, by using the internal testing circuit, it are tested and sorted more completely. Synthesizing the designs described in example 2 and FIG. 5c (see FIG. 5g-2), the LED 511 (which is enabled to indicate the testing results, it can also be a flip-chip bonded bare die, a chip array, a LED with surface-mounted package or a mini-backlight board module) is integrated with the upper substrate of the testing circuit 512 and the lower substrate having the conductibility, and then they are packaged together, so as to be used for the final testing after being packaged. For example, after the division forming, the final testing is proceeded, and the test results are exposed to the LED, thus the final-packaged sorting are proceeded.

Figure 5H:
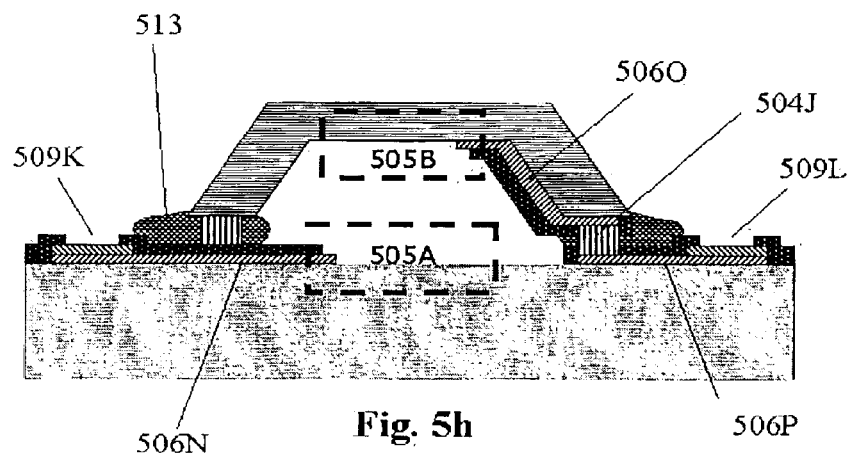

FIGS. 5h through 5k illustrate various configurations of final product, of which the signal I/Os and the heat-transfer path are fan-out disposed. In FIG. 5h, module 505A on the device-carrier substrate is connected to the signal I/O pins or the heat-transfer path 509K through conductive layer 506N. The module 505B on the lid substrate is connected to the signal I/O pins or the heat-transfer path 509L via conductive layer 506O, and the pre-bonding structure 504J, and connect to conductive layer 506P of the front-side of the device-carrier chip. The sealed position of the liquid glue is indicated as 512.

Figure 5I:
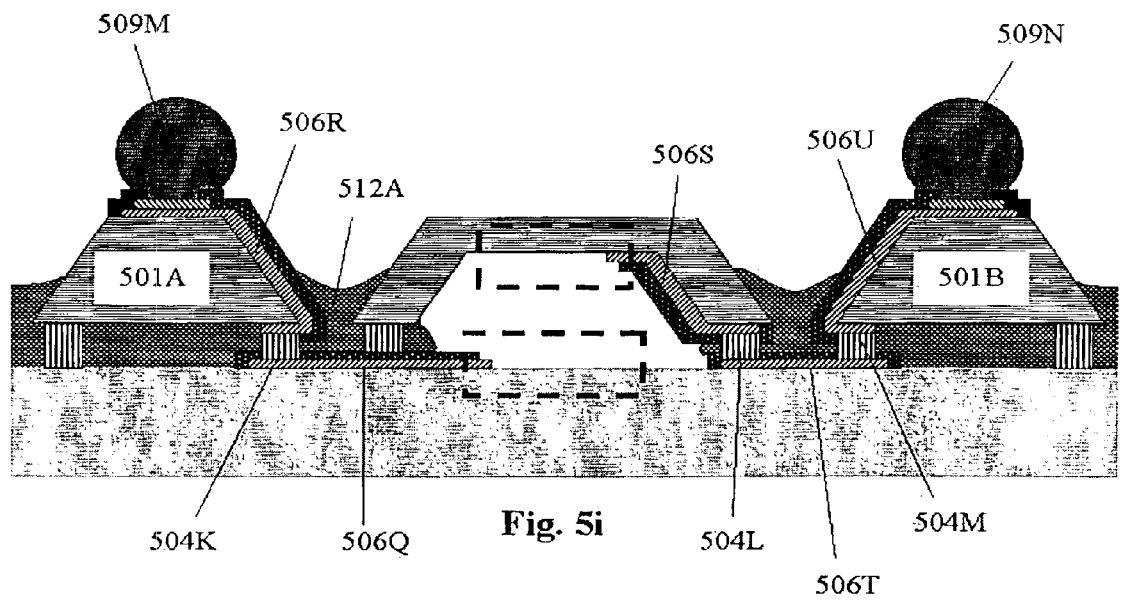

In FIG. 5i, module 505A on the device-carrier substrate is connected to the signal I/O pins or the heat-transfer path 509M via conductive line 506Q which is extended to the front-side of the substrate, the pre-bonding interface structure 504K, and conductive line 506R which is extended to the lid substrate. The system module 505B of the lid substrate is connected to the signal I/O pins or the heat-transfer path 509N through the conductive line 506S which is extended to the lid substrate, the pre-bonding structure 504L, the conductive line 506T which is extended to the front-side of the device chip, the pre-bonding interface structure 504M and conductive line 506U which is extended to the lid substrate. The sealed position of the liquid/fluid glue is indicated as 512A. Further in FIG. 5i, not only the lids 501 are seen, but also the two adjacent lids 501A and 501B. It is not as the lid 501 that there is no cavity microstructure fabricated onto the two lids 501A and 501B shown in the figure. Of course, according to the circuit regions with various performances, various separation lids are fabricated appropriately. That is, this packaging structure is not restricted to be provided with just one lid, and a plurality of lids are fabricated for separating various circuit regions if necessary. The signal interference or the heat influence between the circuit regions are prevented efficiently by applying this design.

Figure 5J:
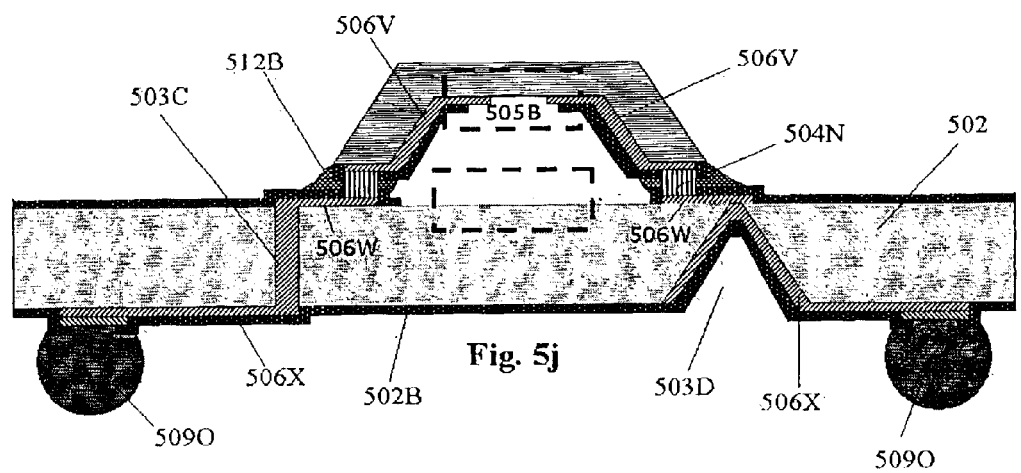

In FIG. 5j, module 505B of the lid substrate is connected to the signal I/O pins or the heat-transfer path 509O via conductive line 506V which is extended to the lid substrate, the pre-bonding structure 504N, the conductive line 506W which is extended to the front-side of the device chip and the conductive line 506X which is extended on the through-hole microstructure 503C or 50three dimensional. The sealed position of the liquid/fluid glue is indicated as 512B.

Figure 5K:
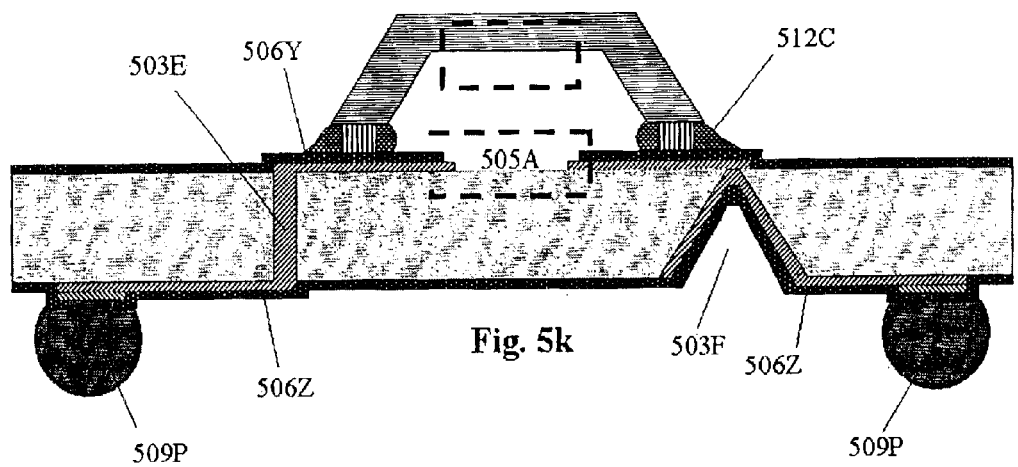

In FIG. 5k, module 505A of the device-carrier substrate is connected to the signal I/O pins or the heat-transfer path 509P via conductive line 506Y which is extended on the device-carrier substrate, the conductive line 506Z which is extended to the through-hole microstructure 503E or 503F on the device-carrier substrate. The sealed position of the liquid/fluid glue is indicated as 512C.

Figure 5L:
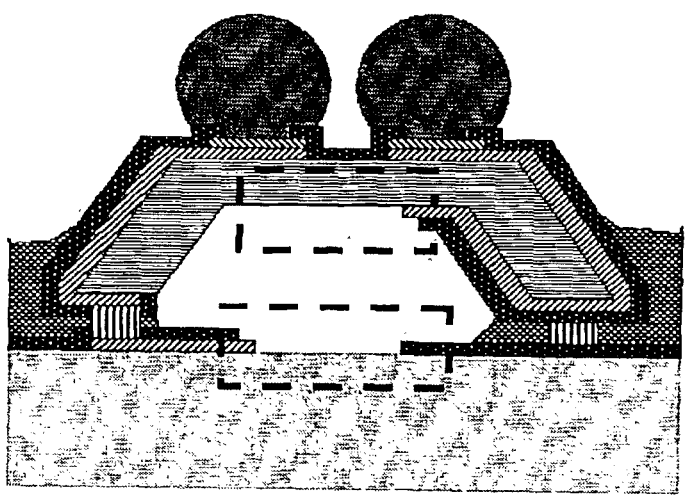
Figure 5M:
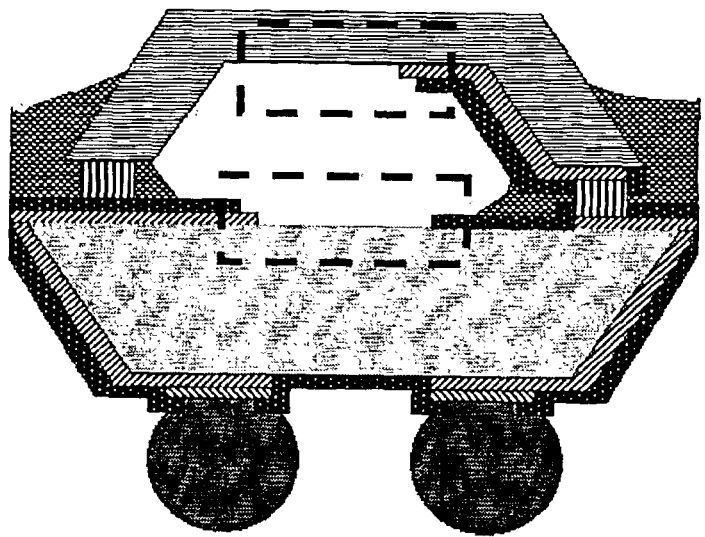
Figure 5N:
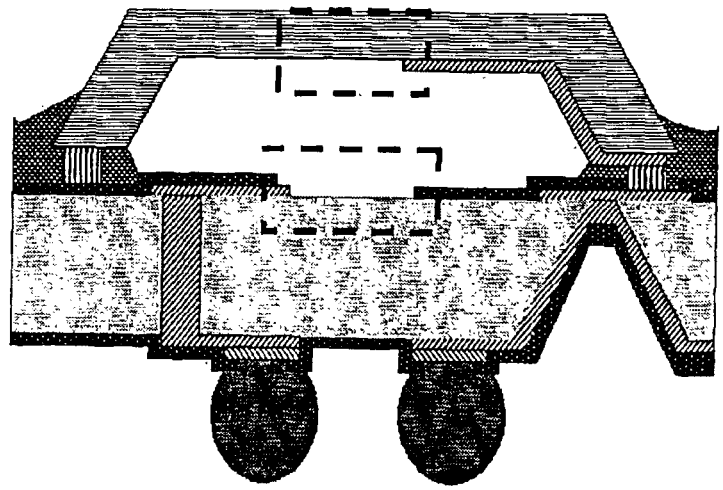

FIGS. 5l through 5n illustrate the status of the signal I/O and the heat-transfer circuit that is fanned-in, thus no more descriptions here. They are different to FIGS. 5h through 5k that the signal I/O pins or the heat-transfer path, as shown in FIGS. 5l through 5n, is disposed exactly below or above the system module.

In conclusion, the package structure shown in FIGS. 5h through 5n is provided with both fan-out and fan-in electric interconnection and is designed with the heat-transfer path. Because of the electric interconnection and the heat-transfer path, the package structure is capable of pitch transfer flexibility for inputting/outputting the signals between the signal I/Os contacts, so that it are designed to accommodate the pitch of the connection pin of the printed circuit in accordance with the industrial standards. It is not restricted that not only a lid are applied by the package structure, and a plurality of lids are applied for separating various circuit regions if necessary, so that the signal interference happened between the circuit regions are prevented efficiently.

EXAMPLE 5

Concepts of Applying the Microstructures

Figures 1, 6A:
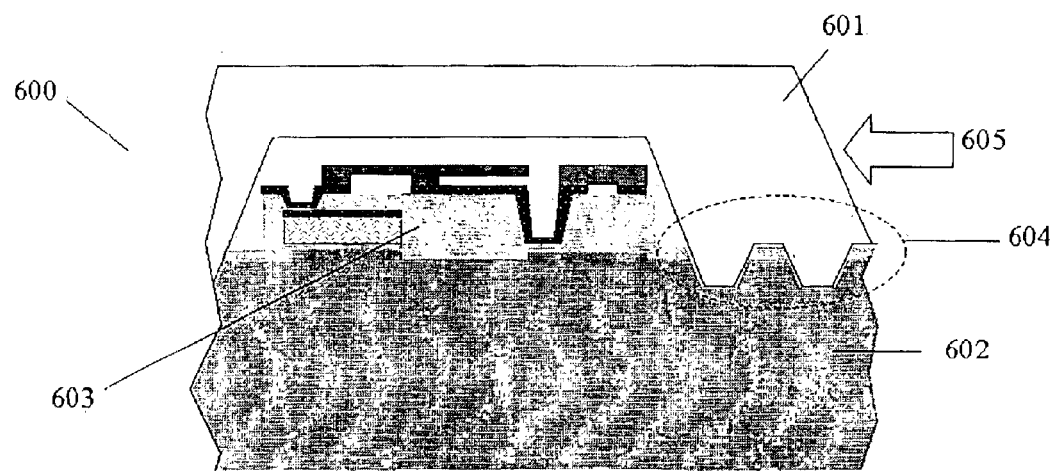
Figures 2, 6A:
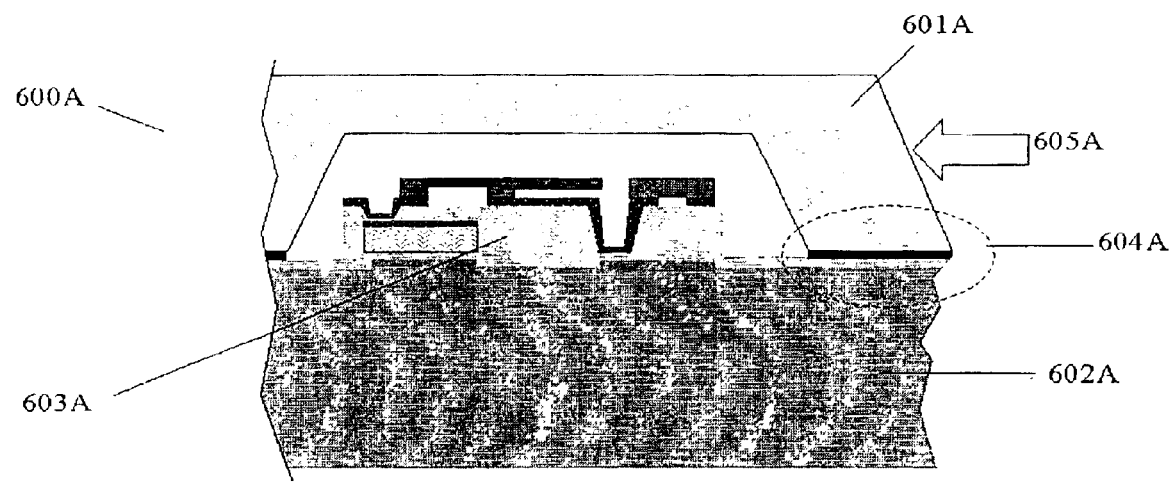

FIGS. 6a-1 and 6a-2 show two various bonding interface configurations 600 and 600A; By the comparison between 600 and 600A, the major difference that the bonding interfaces 604 and 604A with various surface appearances are seen.

As shown in FIG. 6a-1, the said element 603 is already fabricated on the device-carrier substrate 602. On the pre-determined positions for bonding the lid substrate 601 and the device-carrier substrate 602, the corresponding concave/convex microstructures 604 are made. The bonding status between the lid substrate 601 and the device-carrier substrate 602 is shown in FIG. 6a-1. In addition, an external force 605 is exerted onto the lid substrate 601, and the direction thereof is shown as the arrowhead in the figure.

As shown in FIG. 6a-2, the said element 603A is fabricated onto the device-carrier substrate 602A. The bonding interface 604A between the lid substrate 601A and the device-carrier substrate 602A is shown in FIG. 6a-2. In addition, an external force 605A is exerted onto the lid substrate 601A, and the direction thereof is shown as the arrowhead in the figure.

By comparing between FIGS. 6a-1 and 6a-2, with respect to the exerted external force 605 and 605A, since the bonding structure at interface 604A that is unable to resist larger shear force, the resistance to the shear force just are provided by the adhesive materials or the atomic bonding force. Consequently, when a horizontal external force 605 is exerted to this structure as shown in FIG. 6a-2, the bond interface appears to be unreliable. The bonding structure at interface 604 is more reliable than 604A. In other words, comparing with the package structure with 604A, a better shear force resistibility are provided by a packaging structure with a concave/convex microstructure 604 applied as a bonding interface.

Figures 1, 6B:
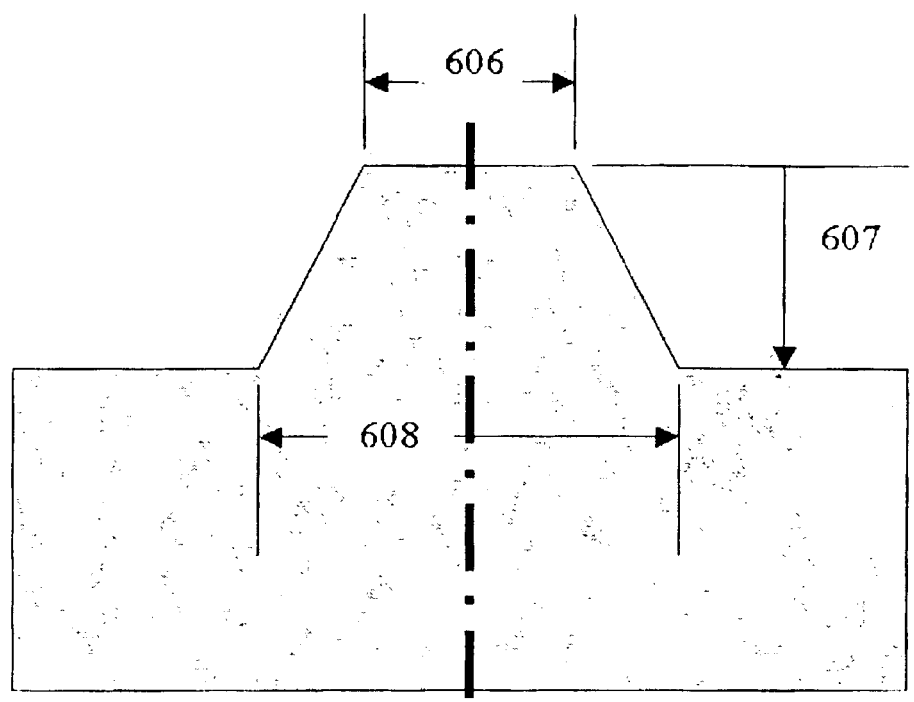
Figures 2, 6B:
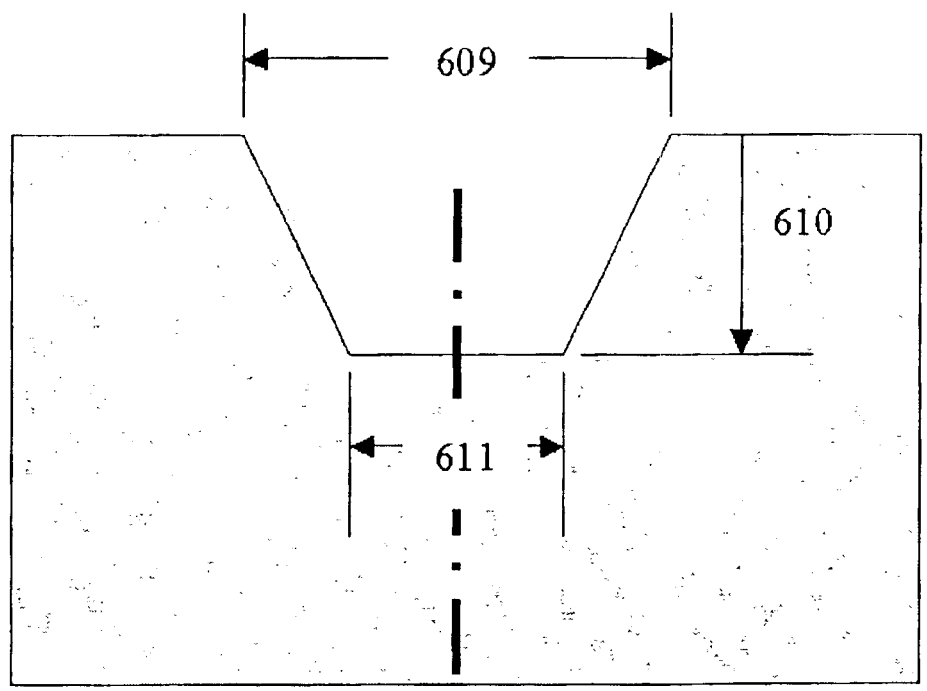
Figures 3, 6B:
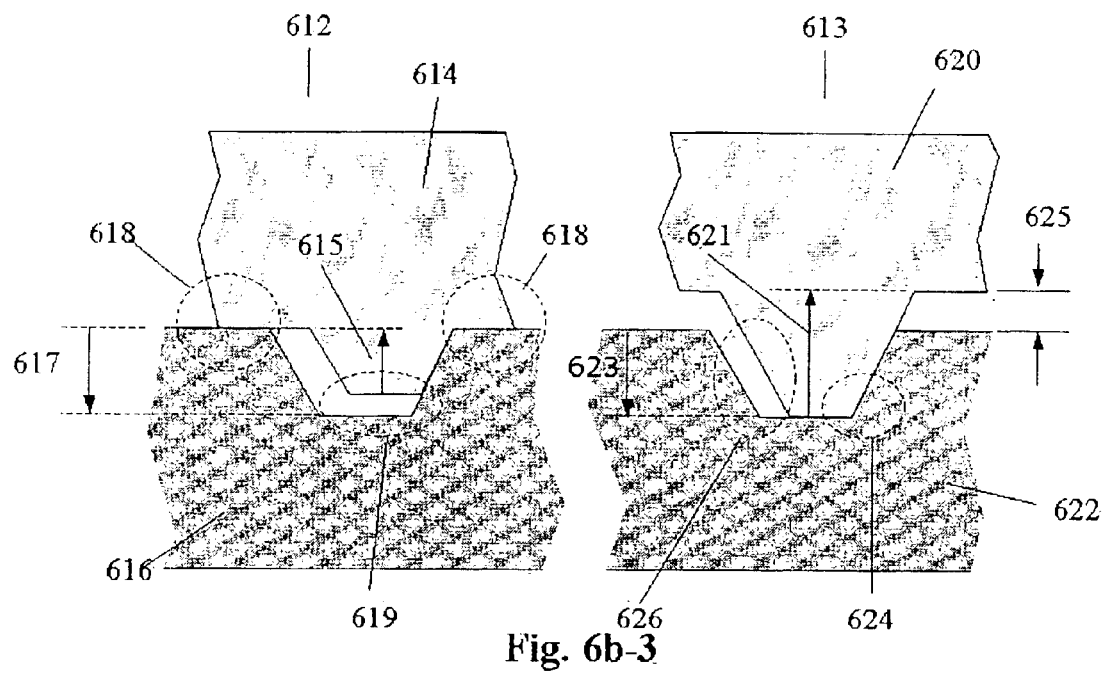

In FIGS. 6b-1, 6b-2 and 6b-3, show examples of various microstructures on silicon substrate, which are made by wet-etching method. FIG. 6b-1 shows the outline of a mesa (convex microstructure), the top 606, the height 607, and the bottom 608 of mesa are shown; wherein the dimensions of the mesa depends on the dimensions of the top 606 and the etching time; FIG. 6b-2 shows the outline of a cavity (concave microstructure), the opening 609, the depth 610, and the bottom 611 of the cavity are shown; wherein the dimensions of the cavity depends on the dimensions of the opening 609 and etching time; FIG. 6b-3 illustrates various status 612 and 613, while the mesa and cavity assemble together. In the first assembly 612, the height 615 of the mesa 614 is smaller than the depth 617 of the cavity 616, so that a contact happened on the interface 618 while cooperating; and thus, a gap 619 is generated. In the second assembly 613, the height 621 of the mesa 620 is larger than the depth 623 of the cavity 622, so that a contact happened on the interface 624; and thus, gaps 625 and 626 are generated.

Figures 1, 6C:
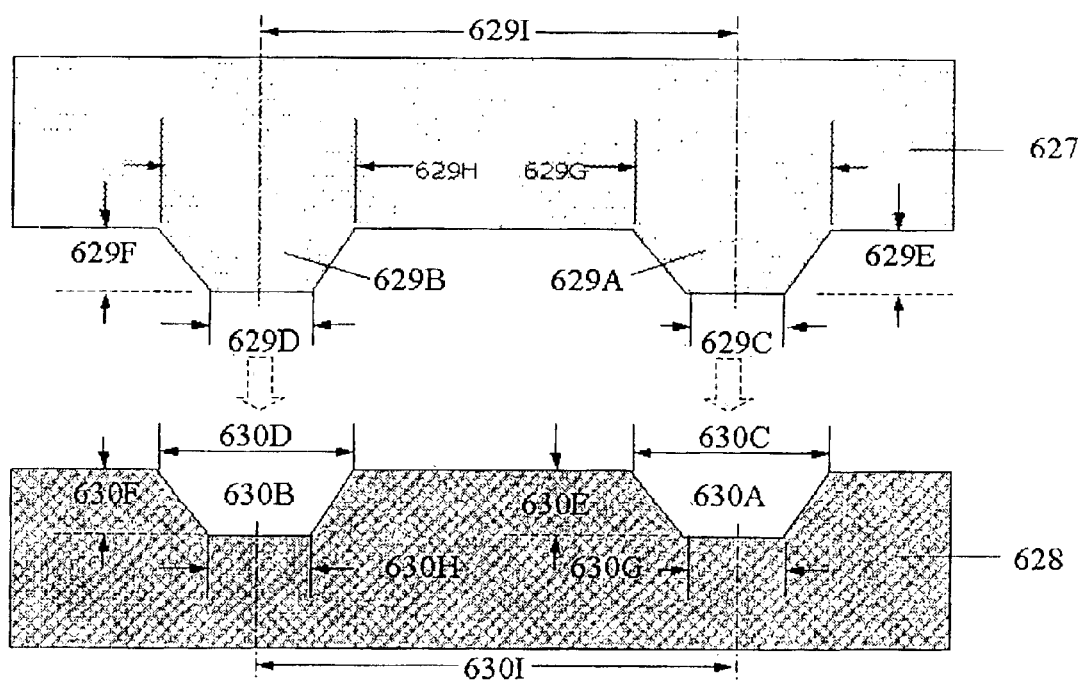
Figures 2, 6C:
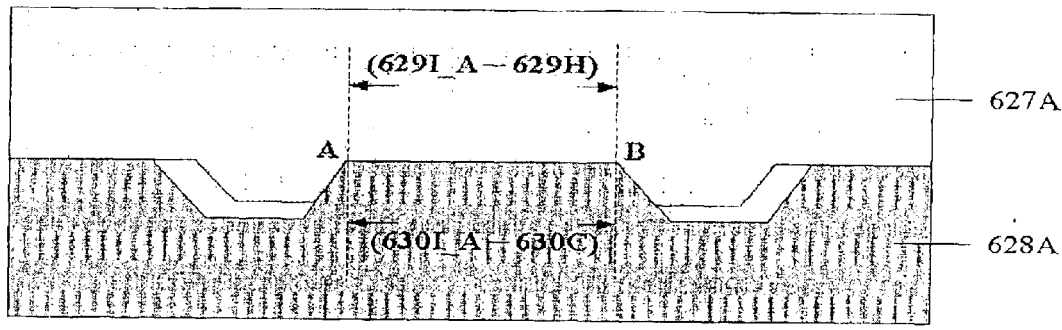
Figures 3, 6C:
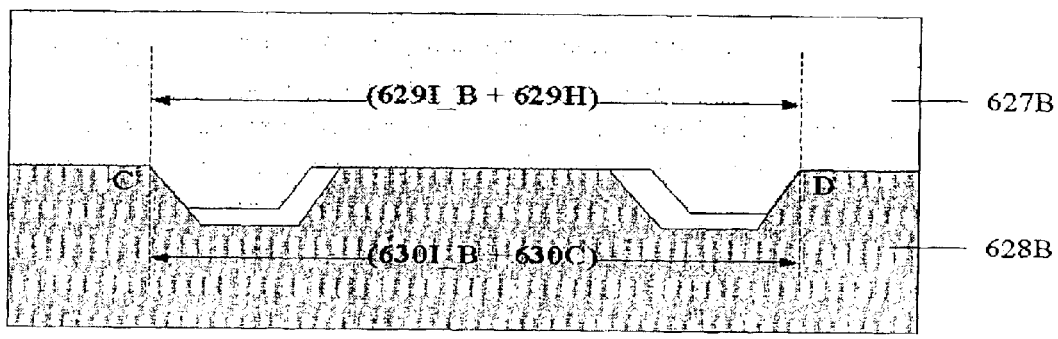
Figures 4, 6C:
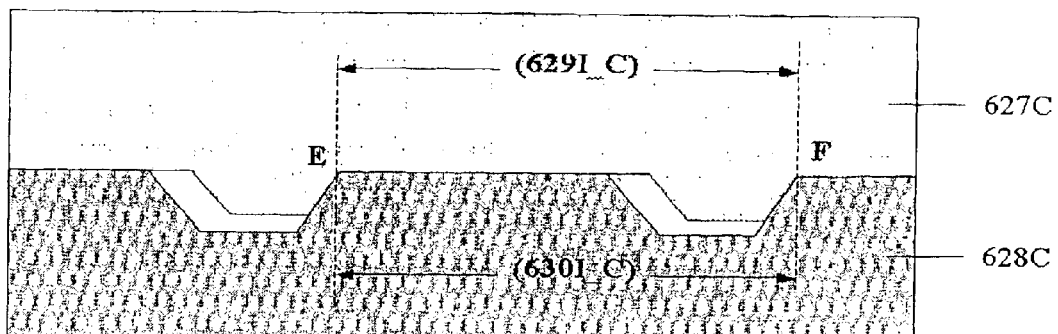
Figures 5, 6C:
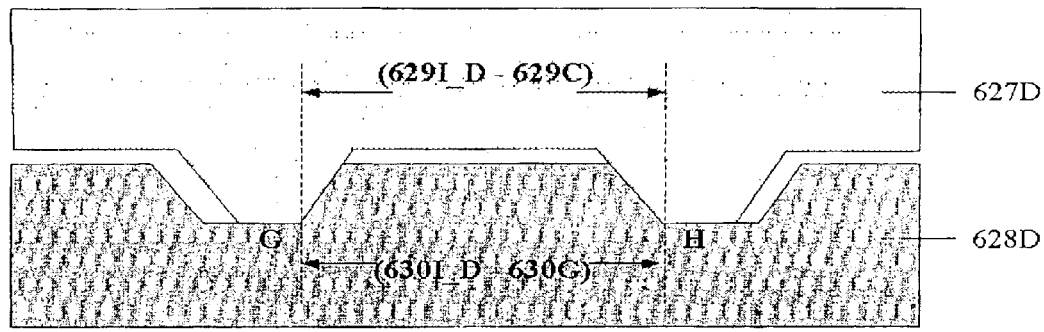
Figures 6, 6C:
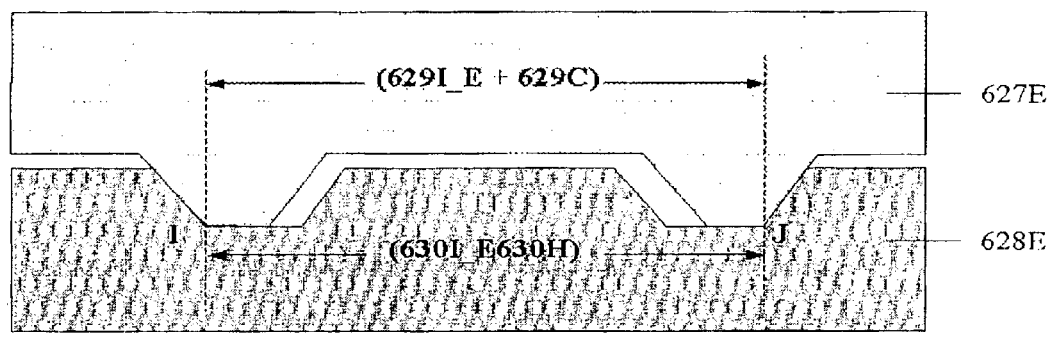
Figures 6, 6C, 7:
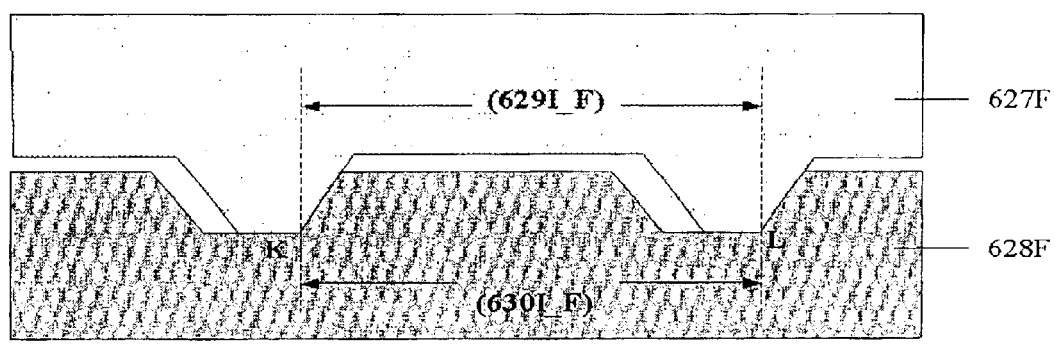

FIG. 6c-1 illustrates the assembly of the substrate 627 having two mesas and the substrate 628 having two cavities. The influence of the relative positions between the two mesas and two cavities upon the assembly thereof is discussed here. On the substrate 627, there are two mesas 629A and 629B, of which the top 629C and 629D, the height 629E and 629F, the bottom 629G and 629H are shown on the figure; the distance between the centerlines of the mesas 629A and 629B is defined as 629I. On the substrate 628, two cavities 630A and 630B; wherein the cavities 630A and 630B, of which the opening 630C and 630D, the depth 630E and 630F, the bottom 630G and 630H are shown in the figure; the distance between the centerlines of cavities 630A and 630B is defined as 630I. The substrates 627 and 628 are assembled together (dotted line); here, supposed the dimensions of 629A and 629B are exactly the same, and the dimensions of 630A and 630B are the same, too. That is, (1) 629C=629D; 629E=629F; 629G=629H (2) 630C=630D; 630E=630F; 630G=630H Then, FIGS. 6c-2, 6c-3 and 6c-4 are shown the assembling of double-mesas substrates (627A, 627B and 627C) and double-cavities substrates (628A, 628B and 628C) under the status 612. Here should note: for the convenience of the discussions below, the distances 629I and 630I between the centerlines of the microstructures are marked sequentially as 629I_A and 630I_A, 629I_B and 630I_B, 629I_C and 630I_C.

In FIG. 6c-2, a common contact face is generated on A–B between the two substrates:

629I_A−(629H+629G)/2=630I_A−(630C+630D)/2

? 629I_A−629II=630I_A−630C

To accomplish the assembly described in FIG. 6c-2, it depends on whether the above equation is true. That means the four dimensions 629I_A, 629H, 630I_A and 630C, a total of four fabrication variables, should be matched up.

In FIG. 6c-3, common contact faces are generated on C–D between the two substrates:

629I_B+(629H+629G)/2=630I_B+(630C+630D)/2

? 629I_B+629H=630I_B+630C

To accomplish the assembly described in FIG. 6c-3, it depends on whether the above equation is true. That means the four dimensions 629I_B, 629H, 630I_B and 630C, a total of four fabrication variables, should be matched up.

In FIG. 6c-4, common contact faces are generated on E–F between the two substrates:

629I_C−629H/2+629G/2=630I_C−630D/2+630C/2

? 629I_C=630I_C

To accomplish the combination described in FIG. 6c-4, it depends on whether the above equation is true. That means only two dimensions 629I_C and 630I_C, a total of two fabrication variables, should be matched up.

Summary the assemblies of FIGS. 6c-2, 6c-3 and 6c-4, it is known that the assembly by single-side matching as shown in FIG. 6c-4 is an easier way to be accomplished.

FIGS. 6c-5, 6c-6 and 6c-7 are shown the assembling of double-mesas substrates (627D, 627E and 627F) and double-cavities substrates (628D, 628E and 628F) under the status 613. Here should note: the distances 629I and 630I between the centerlines of the microstructures are marked sequentially as 629I_D and 630I_D, 629I_E and 630I_E, 629I_F and 630I_F; wherein, In FIG. 6c-5, common contact faces are generated on G–H between the two substrates:

629I_D−(629C+629D)/2=630I_D−(630H+630G)/2

? 629I_D−629C=630I_D−630G

To accomplish the assembly described in FIG. 6c-5, it depends on whether the above equation is true. That means the four dimensions 629I_D, 629C, 630I_D and 630G, a total of four fabrication variables, should he matched up.

In FIG. 6c-6, common contact faces are generated on I–J between the two substrates:

629I_E+(629C+629D)/2=630I_E+(630H+630G)/2

? 629I_E+629C=630I_E+630H

To accomplish the assembly described in FIG. 6c-6, it depends on whether the above equation is true. That means the four dimensions 629I_E, 629C, 630I_E and 630H, a total of four fabrication variables, should be matched up.

In FIG. 6c-7, common contact faces are generated on K–L between the two substrates:

629I_F−629C/2+629D/2=630I_F−630H/2+630G/2

? 629I_F=630I_F

To accomplish the assembly described in FIG. 6c-7, it depends on whether the above equation is true. That means only two dimensions 629I_F and 630I_F, a total of two fabrication variables, should be matched up.

Summary the assemblies of FIGS. 6c-5, 6c-6 and 6c-7, it is known that the assembly as shown in FIG. 6c-7 is an easier way to be accomplished.

In addition, in FIGS. 6c-2 and 6c-5, by heating the upper substrate (627A and 627D) uniformly, the upper substrate is expanded because of thermal expansion; then it are bonded with the lower substrate smoothly, and then they are firmly assembled together after cooling down. In FIGS. 6c-3 and 6c-6, by heating up the lower substrate (628B and 628E) uniformly, the lower substrate is thermo-expanded; then it are bonded with the upper substrate smoothly, and then they are firmly assembled together after cooling down.

Figure 6D:
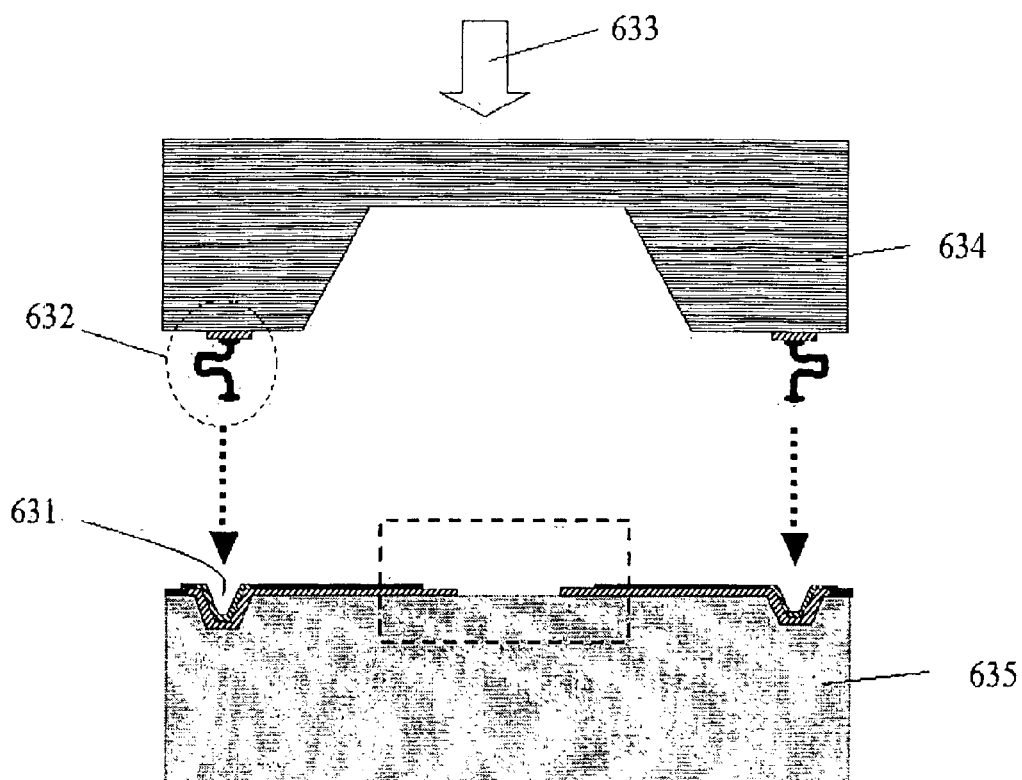
Figure 6E:
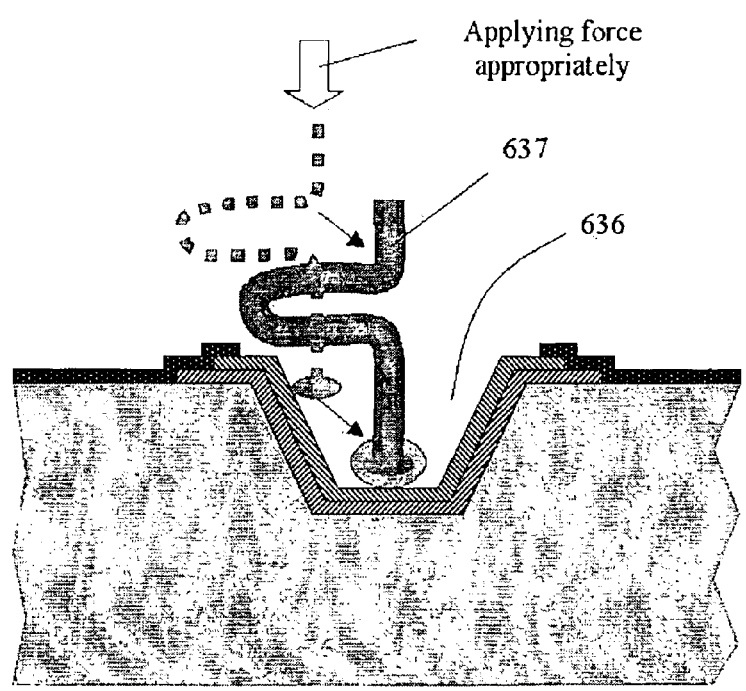

In FIGS. 6d and 6c, show the forming of pre-bonding by applying the concave microstructure 631 with the three dimensional micro-spring 632. The upper substrate 634 and the lower substrate 635 are proceeded the alignment process by exerting an appropriate force 633 the bonding process. FIG. 6e illustrates that the three dimensional micro-spring 637 is guided into the exact contact point with the help of the concave microstructure 636 having a UBM layer.

Figures 1, 6F:
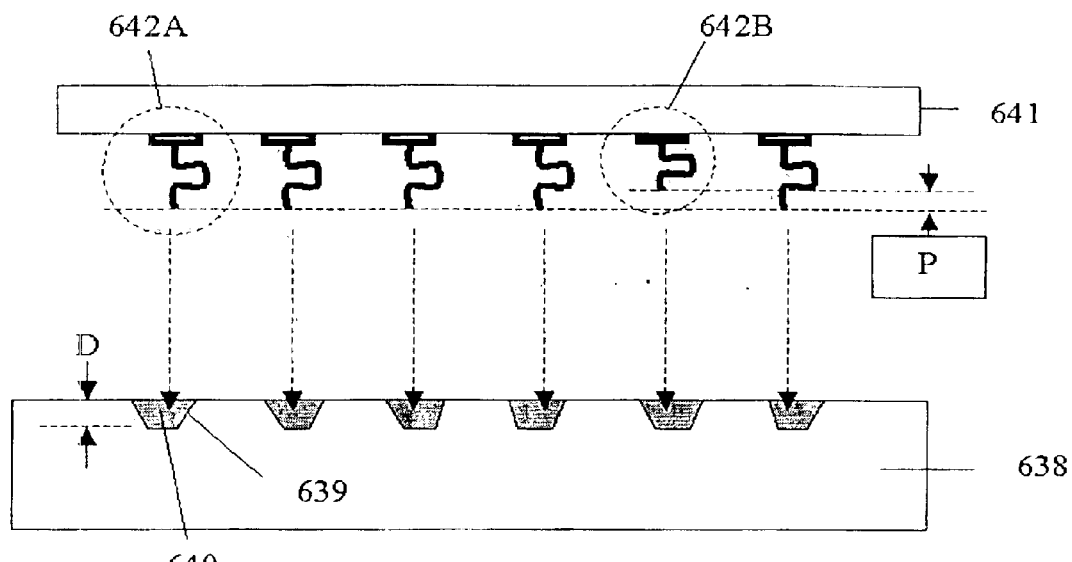
Figures 2, 6F:
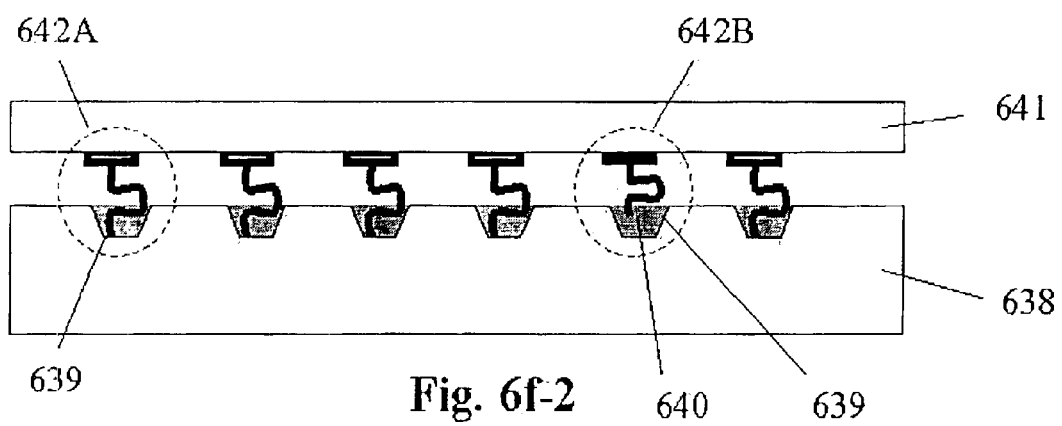
Figures 1, 6G:
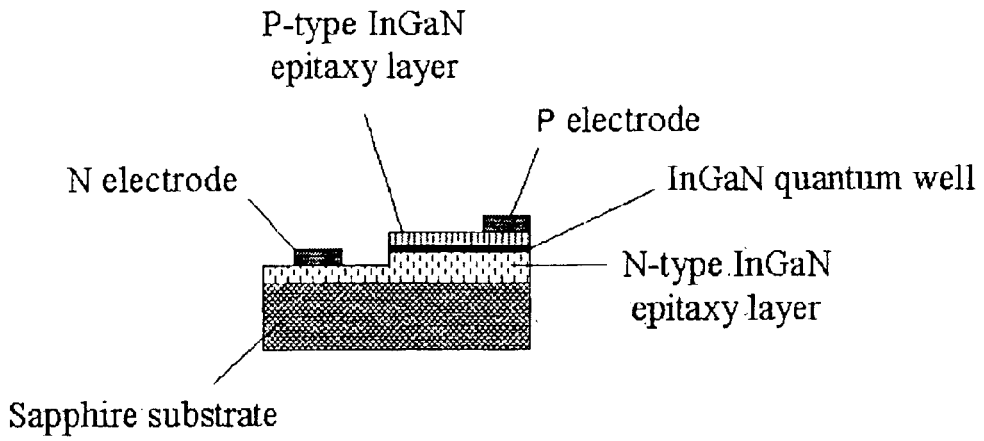
Figures 2, 6G:
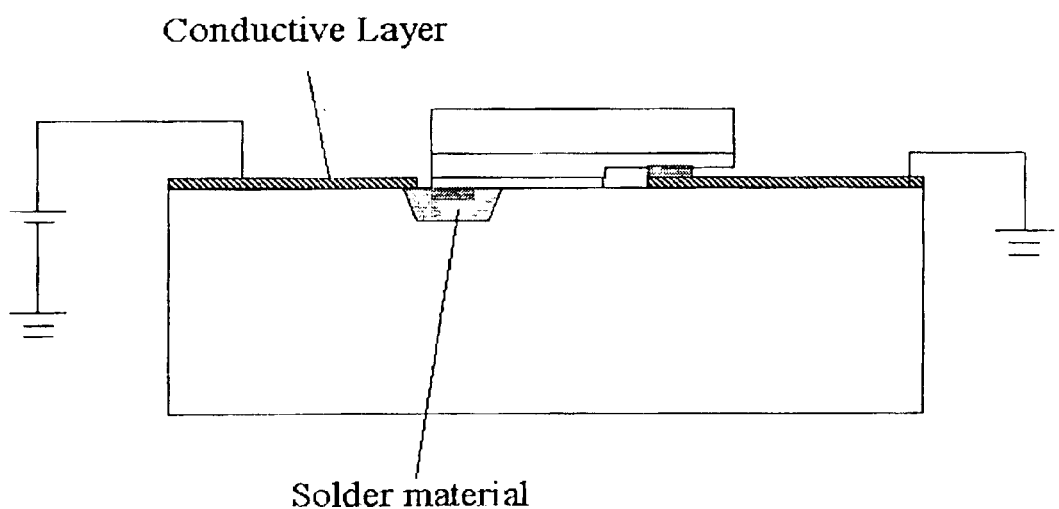

FIGS. 6f-1 and 6f-2 illustrates that the coplanar error P of the three dimensional micro-springs 642A and 642B on the upper substrate 641 (or any pin or contact points at random) are absorbed efficiently by filling up the concave microstructure 639 having a depth of D and a UBM layer with the soldering material 640. In FIG. 6f-2, while the upper substrate 641 and the lower substrate 638 are bonded together, the three dimensional micro-spring 642A is in contact with the bottom of the microstructure 639, and the three dimensional micro-spring 642B is still not in contact with the bottom of the concave microstructure 639 since it is too short or bias. Nevertheless, by the solder material 640 filled inside the concave microstructure, they are bonded together successfully by the thickness of the solder material 640 compensating for the insufficient length of the three dimensional micro-spring 642B. However, here is a restriction that the coplanar error P between the three dimensional micro-springs must be smaller than the depth D of the microstructure.

In addition, the blue LED, which is a photoelectric device, wherein, contains electrodes P and N on the same side (see FIG. 6g-1), and the heights of the electrodes are not the same (refer to the reference material [8]). While proceeding the flip-chip bonding for integrating the blue-light LED in example 2, the conclusions from FIGS. 6f-1 and 6f-2 are used for the integration, see FIG. 6g-2.

EXAMPLE 6

Forming a Completely Sealed Interface

Figure 7A:
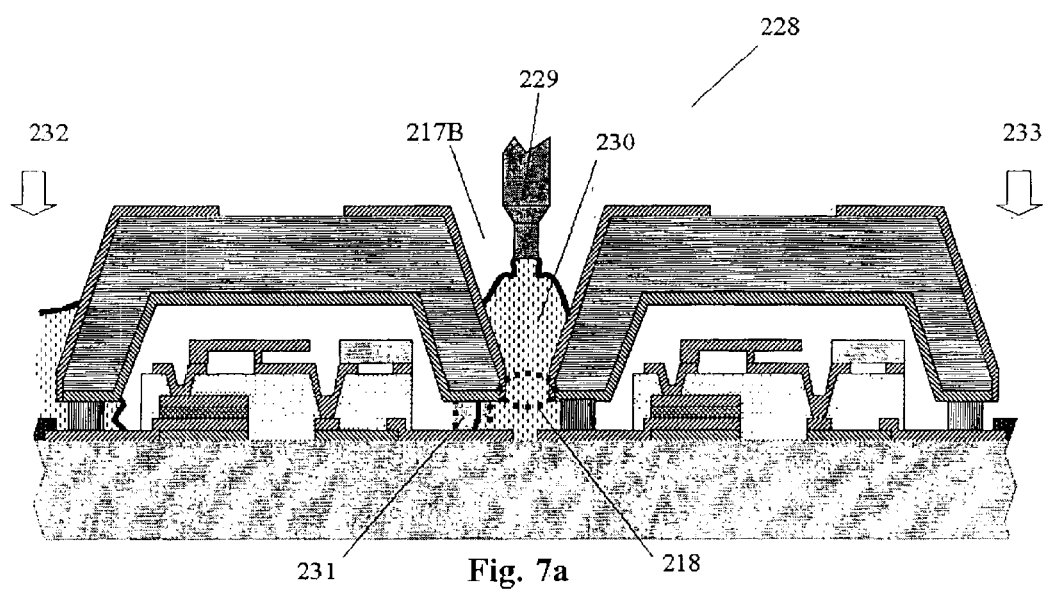
Figure 7B:
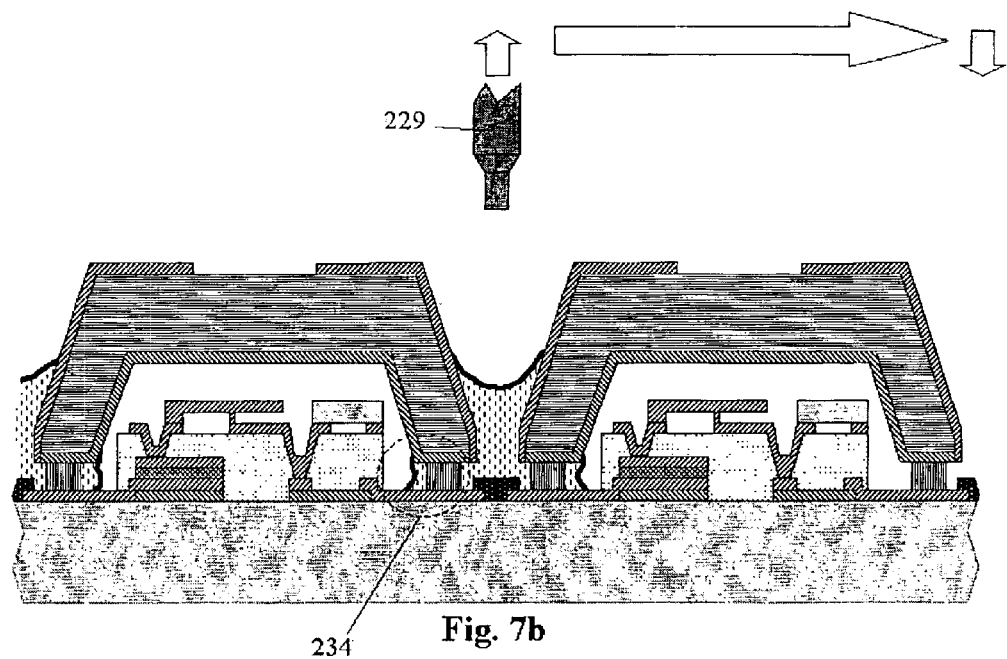
Figure 7C:
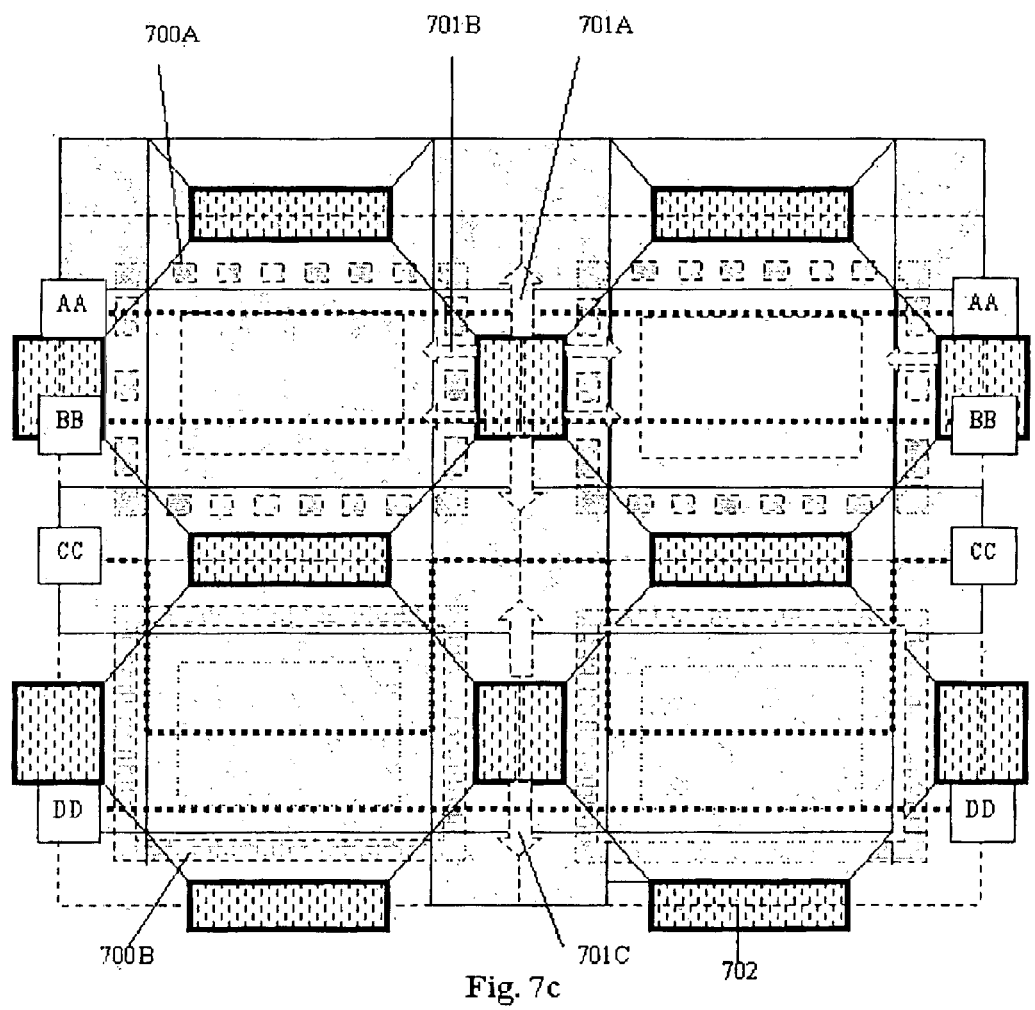

FIGS. 7a and 7b illustrates how to form a completely sealed interface especially for the combined substrate 228 that a pre-bonding interface is already formed thereon. It is similar to FIGS. 2u-1 and 2u-2, so that no descriptions here. FIG. 7c is a perspective view showing the outline seen from the backside of the lid substrate by looking downwards, wherein the lid substrate is made to be semi-transparent, and the relative positions between the corresponding structures (dotted line) on the front-side of the device-carrier substrate are seen. Only two kinds of pre-bonded interfaces are shown in the figure for illustration: the discrete bonding structure 700A, and enclosed-shape bonding ring 700B. The liquid/fluid glue inlet (micro-inlet) is shown as 702, and the directions of the arrowheads 701A, 701B and 701C indicate the flow directions of the glue corresponding to the pre-bonding structures, respectively. The relationships between the flow directions of the glue and the structures are explained more apparently in the cross-sections AA—AA, BB—BB, CC—CC and DD—DD.

Figures 5, 7D:
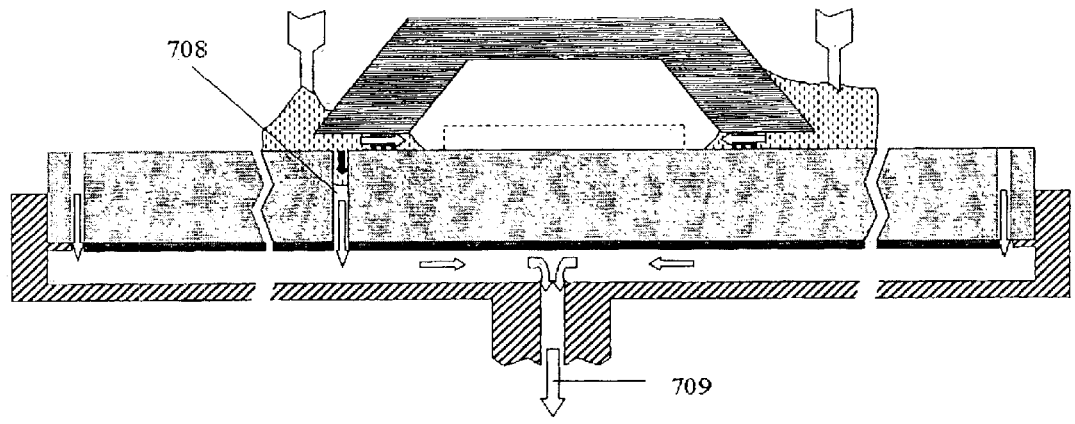

FIG. 7d-1 is a cross-sectional view from AA—AA of FIG. 7c, wherein the relative positions between the pre-bonded interface 700A and the liquid/fluid glue 703 are shown.

FIG. 7d-2 is a cross-sectional view from BB—BB of FIG. 7c, wherein, there is no pre-bonded interface on the cross-section BB—BB, and the flowing state of the liquid/fluid glue 703 flowing inside the gap 706 between the lid substrate 704 and the device-carrier substrate 705 are observed clearly. It is specially mentioned that the height (G) indicates the height of the gap 706. As the glue flows inside the gap 706 by means of the capillarity, while it is flowing into the cavity 707 of the package structure, since the height of the glue is much larger than the gap height (G), the liquid/fluid glue is pulled to stop because of the capillarity and it is not moved inwardly any more. Besides, it can also be designed to cooperate with the glue flowing path for the liquid/fluid glue around the device area, and the microstructures for preventing the liquid/fluid glue from flowing are fabricated by the aforementioned methods for fabricating the microstructures.

FIG. 7d-3 is a cross-sectional view from CC—CC of FIG. 7c, and FIG. 7d-4 is a cross-sectional view from DD—DD of FIG. 7c, wherein the cross-section CC—CC and DD—DD passes through the sealed annular structure 700B on the pre-bonded interface. Since the bonding structure is sealed-formed, so that the liquid/fluid glue is blocked outside the annular structure 700B.

In conclusion with the above figures, it are designed to be having a metallic layer fabricated onto the encapsulating position (the liquid/fluid glue flowing path or the encapsulant runner). The metallic layer is used as a Joule-Heating wire for heating the flowing path or runner during the Encapsulant process, so that the free energy on the chip surface is lowered, and thus the liquid/fluid glue is allowed to flow to the encapsulation position. Besides, in the example shown in FIG. 7d-5, a through-hole microstructure 708 can also be fabricated, and with the vacuum apparatus 709, the flowability of the liquid/fluid glue are enhanced, thus the encapsulation material is enabled to flow to the encapsulation position smoothly.

Figure 7E:
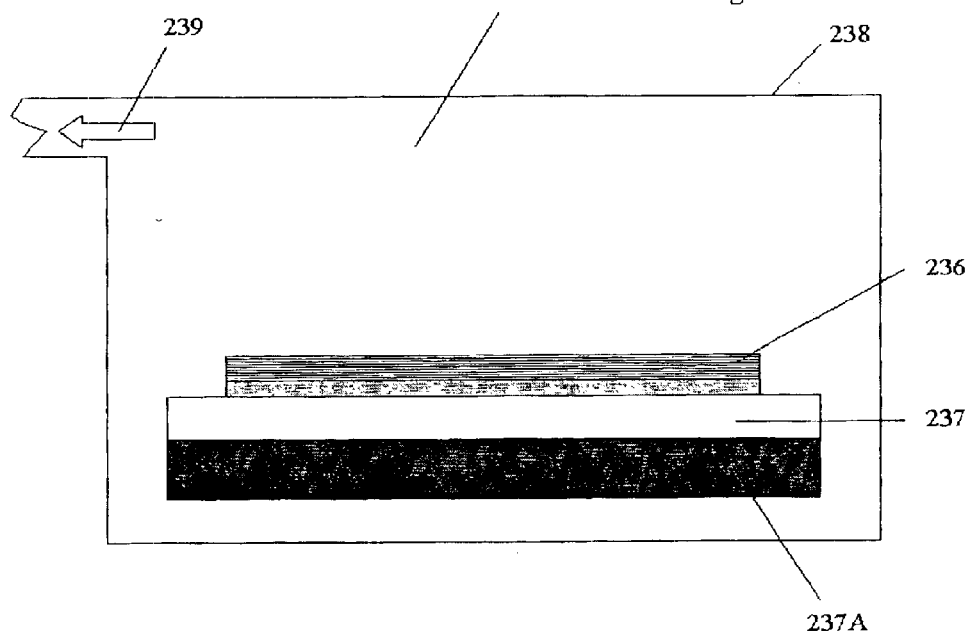

Then, FIG. 7e illustrates the stabilization baking process of the liquid/fluid glue on the combined substrate. This process is similar to the process shown in FIG. 2v, so it is not described here.

FIG. 7f is a timing-chart showing the vacuum packaging method accomplished with the stabilization baking process of the liquid/fluid glue. A liquid/fluid glue of the epoxy resin base is used as an example in the figure. The stabilization baking process is divided into five segments according to the timing-chart. The temperature is raised at the first segment. Then, the temperature of the first segment is kept constant at the second stage (the temperature at this segment is almost a half of the curing temperature, and the purpose is to make the viscosity of the encapsulation material lowered, and the flowability thereof is enhanced). The temperature is risen again to the curing temperature at the third segment, and then the temperature is kept at the curing temperature for a while. Finally, the hardening process is finished and the temperature begins to be cooled down at the fifth segment. In addition, with the vacuum apparatus shown in FIG. 7e, it is also divided into 5 segments. FIG. 7f-1 shows the situation including the first and the second segment. The first segment for raising the temperature and vacuuming is proceeded. Then, as the temperature reaches the set-value, it kept constant and vacuuming continuously. As the liquid/fluid glue is still capable of a higher flowability, the fill-in and re-flow process with the glue. As the direction of the arrowhead shown in FIG. 7f-1, since there is a difference between the inward and outward pressure, the gas inside the cavity passes through the liquid/fluid glue, which is still flowable, and then moves outwardly. FIG. 7f-2 shows the third segment that the temperature is raising again until the curing temperature is reached, and the vacuuming is proceeding continuously. As the gas inside the cavity is drawn-out completely, the liquid/fluid glue is hardened gradually. In FIG. 7f-3, the liquid/fluid glue is hardened completely, so the vacuuming apparatus are shut off, and it begins to be cooled-down; meanwhile, the scaled container is at a vacuumed stage. At the fourth stage, the combined substrate is taken out from the container, and at this time, the gas cannot get into the cavity by passing through the liquid/fluid glue that is already solidified, thus a vacuumed package is accomplished.

In this example, it are proceeded with either the vacuum packaging or the semi-vacuum packaging according to the requirement, or it are packaged within where is full of inert-gas (for example, nitrogen). In addition, being cooperated with the absorbent materials (it is mentioned in example 2, so it is not described here), the reliability of using the packaged device is enhanced, especially for packaging the tiny movable parts, like micro-optical scanning mirror . . . etc.

In this example, the wafer-level injection molding method can also be applied for proceeding depending on the requirements.

Reference Materials

[1] C. Faulkner, "RF modules enables an integrated approach to system design," Wireless Systems Design, December 2000, pp. 37–40.

[2] G. Ronald, "Thin-film passive integration yields tiny Bluetooth module," Wireless Systems Design, August 2000, pp. 23–30.

[3] U.S. Pat. No. 06,051,489, "Electronic component package with posts on the active side of the substrate".

[4] Dr. Ken Gilleo, "Cookson Electronics" & "Cookson Semiconductor Packaging Materials", and Steve Corbett, "The Classification of the Absorbents for Packaging and the Functions Thereof", The Electronic Engineering Periodical, July 2001.

(http://www.eettaiwan.com/ART 8800107293.HTM).

[5] Ken Gilleo, "Open forum: Photonics Challenge to Electronic Package", "IEEE Transactions On Components and Packaging Technologies", VOL.24, No.2, June 2001.

[6] U.S. Pat. No. 06,110,823, "Method of Modifying the Thickness of a Plating on a Member by Creating a Temperature Gradient on the Member, Applications for Employing such a Method, and Structures Resulting from such a Method".
[7] U.S. Pat. No. 05,962,921, "Interconnect Having Recessed Contact Members with Penetrating Blades for Testing Semiconductor Dice and Packages with Contact Bumps".
[8] U.S. Pat. No. 06,172,382, "Nitride Semiconductor Light-Emitting and Light-Receiving Devices".
[9] Martin Bartholomew, "An Engineer's Handbook of Encapsulation and Underfill Technology", ISBN: 0 901150 38 X.
[10] Harrie A. C. Tilmans, Myriam D. J. Van de Peer, Eric Beyne, "The Indent Reflow Sealing (IRS) Technique—A Method for the Fabrication of Sealed Cavities for MEMS Devices", Journal of Micro-electro-mechanical Systems, Vol.9, No.2, June 2000.
[11] F. Niklaus, P. Ennoksson, E. Kalvesten, and G. Stemme, "Low-Temperature Full Wafer Adhesive Bonding," Journal of Micro mechanics and Microengineering, 11, pp. 100–107, 2001.
[12] T. Nakakubo and I. Shimoyama, "Three-dimensional Micro Self-Assembly Using Bridging Flocculation", Sensors and Actuators 83 2000, pp. 161–166.

What is claimed is:

1. A method of making a package structure, comprising the steps of:
providing at least two substrates for composing the package structure;
making functional elements on at least one of the substrate;
assembling discrete elements, dies and devices onto at least one of the substrate;
forming part of electrical interconnection among the integrated elements and assembled discrete elements on one side or both sides of the said substrates;
making electrical conduction line and lead line on at least one of the substrate for further constructing electrical conduction and signal connection between two different substrates;
forming interposers, micro-joints and microstructures on a portion of surface of at least one of the substrate;
aligning and pre-bonding a substrate with the said interposers, micro-joints and microstructures to another substrate; thereafter, the appropriate spacing provided by the corresponding said interposers, micro-joints and microstructures between the pre-bonded substrates, may accommodate and protect the integrated and hybrid assembled elements on the substrates;
forming a completely sealed interface between the pre-bonded interfaces of substrates by encapsulating the interfaces via through-hole microstructures, therefore a completely sealed package interface of each packaged devices or apparatus in the form of the said package is done and
separating each packaged structures, devices or apparatus in the form of the said package.

2. A method of making a package structure as claimed in claim 1, wherein the said substrates are materials of semiconductors, compound semiconductor, metals, plastics, polymers, ceramics and glasses.

3. A method of making a package structure as claimed in claim 1, wherein the said substrates are substrates of wafer form.

4. A method of making a package structure as claimed in claim 1, wherein the said function elements are microelectronics such as passive elements of resistors, capacitors and inductors; optoelectronics of laser diodes, photo-detectors, photo-sensors; microelectromechanical systems of microfluidic systems, micro-total-analysis systems, bio-medical devices, bio-chips, bio-sensors and micro-opto-electro-mechanical systems.

5. A method of making a package structure as claimed in claim 1, wherein the said assembled and integrated functional elements, dies and devices inside the said package structure comprise plural functions, such as, computing, sensing, actuating, adjusting and controlling; then the said package structures are devices and apparatus in a format of system-in-a-package (SiP).

6. A method of making a package structure as claimed in claim 1, wherein the said assembled and integrated functional elements, dies and devices inside the said package structure comprise plural functions, such as, computing, sensing, actuating, adjusting and controlling; wherein the said substrates are substrates of wafer form, then the said package structures are devices and apparatus in a format of wafer-level-system-in-a-package (WLSiP).

7. A method of making a package structure as claimed in claim 1, wherein the technologies for assembling discrete elements or dies or devices onto at least one of the substrate are solder bonding, eutectic bonding, adhesive bonding, wire bonding and flip-chip bonding.

8. A method of making a package structure as claimed in claim 1, wherein the said interposers, micro-joints and microstructures between the pre-bonded substrates can make a spatial spacing of interface of appropriate height, therefore a space formed due to the microstructures of this height can offer a room to accommodate the protruding microstructures such as assembled elements, dies and devices; three dimensional micro-electro-mechanical structures of sensors, actuators, three dimensional opto-electronics elements and fluidic channels.

9. A method of making a package structure as claimed in claim 1, wherein cavities made on the substrates before the pre-bonding process can lead to a spatial room of appropriate height inside the said package structure after pre-bonding and encapsulating processes, therefore a space formed due to the cavities can offer a room to accommodate the protruding microstructures such as assembled elements, dies and devices; three dimensional micro-electro-mechanical structures of sensors, actuators, three dimensional opto-electronics elements and fluidic channels, wherein the said cavities in a said substrate can have various heights.

10. A method of making a package structure as claimed in claim 1, wherein the formed interposers, micro-joints and microstructures for forming pre-bonding interface and connection between two substrates are eutectic metal structures, solder structures, metal structures, polymer structures, ceramics structures, glass structures, rubber structures, plastic structures, adhesive structures, micro-spring structures, microstructures of stress and impact buffer effect and a combination structure of the above structures.

11. A method of making a package structure as claimed in claim 1, wherein the formed interposers, micro-joints and microstructures for forming pre-bonding interface and connection between two substrates are prepared on one side of substrate and both sides of substrate; wherein two of the substrates which are intended to be bonded together may have the said interposers, micro-joints and microstructures on one side of at least one of the substrates.

12. A method of making a package structure as claimed in claim 1, wherein the formed interposers, micro-joints and microstructures for forming pre-bonding interface and connection between two substrates are prepared on one side of substrate and both sides of substrate; wherein two of the substrates which are intended to be bonded together may have the said interposers, micro-joints and microstructures on both sides of at least one of the substrates.

13. A method of making a package structure as claimed in claim 1, wherein the said interposers, micro-joints and microstructures are any shapes and morphology in three dimensional.

14. A method of making a package structure as claimed in claim 1, wherein the pre-bonding process are conducted with the aids of precision alignment tools; wherein the pre-bonding process are conducted with the aids of additional energy coming from ultrasonic, heat, infrared radiation, or microwave source.

15. A method of making a package structure as claimed in claim 1, wherein the said interposers, micro-joints and microstructures structure for aligning and pre-bonding substrates can constitute an interface of enclosed-shape bonding ring, an interface of discrete bonding, contact area and the combination of these two formats on different locations of substrates.

16. A method of making a package structure as claimed in claim 1, wherein the materials used in the process of the said encapsulating interface process, in the other words, the said process of forming a completely sealed interface between the pre-bonded interfaces of substrates, are epoxy resin, polyimide, silicone, BCB (benzocy-clobutene), photo-resist, liquid crystal, polymers, rubbers, glasses, ceramics, metals and the combinations of these materials.

17. A method of making a package structure as claimed in claim 1, wherein a plural steps of the said aligning and pre-bonding process are done in order to make a bonded substrates which is a stack of multiple substrates.

18. A method of making a package structure as claimed in claim 1, wherein the materials used in the process of the said encapsulation process, in the other words, the said process of forming a completely sealed interface between the pre-bonded interfaces of substrates, are processes that liquid type encapsulating materials flows into the package structure through the through-hole microstructure when external extruding and pressing aids are used to accelerate the encapsulation process.

19. A method of making a package structure as claimed in claim 1, wherein the through-hole microstructures are made to be the inlet for encapsulating process.

20. A method of making a package structure as claimed in claim 1, wherein micro-channels and microstructures are made to lead the flow of encapsulating materials inside particular path and channel without overflowing to other area, then the said elements and three-dimensional structures are protected from damage during encapsulating process.

21. A method of making a package structure as claimed in claim 1, wherein the said package structure is provided with both fan-out and fan-in formats of electrical interconnections, electrical conductive lines, heat-transferring paths and heat dispatching paths; the pitch between each pair of I/O are designed, changed and made according to different application needs; the electrical signal are routed and arranged by making multilayer of electrical interconnections and insulating layers in order to make complex three-dimensional electrical interconnection structures thereof the said redistribution process.

22. A method of making a package structure as claimed in claim 1, wherein the electrical interconnection and signal I/O contacts inside the said package structure among different functional elements and dies are formed by bonding metal wires, depositing metal lines, plating metal lines, soldering, making conductive polymer and making bumping process of filp-chip technology.

23. A method of making a package structure as claimed in claim 1, wherein the optical interconnection and signal I/O contacts of the said package structure are formed by using optical waveguide elements, or adopting elements for enabling free space optical communications.

24. A method of making a package structure as claimed in claim 1, wherein the said package structure can consist of solder balls, solder bumps, solder lands and metal pads formed on the surface of one side and both sides of the said substrates.

25. A method of making a package structure as claimed in claim 1, wherein the signal I/O contacts of the said package structure to outside systems and other separate devices are metal pads for further wire bonding, UBM layers for further growing solder or gold bumps, a solder bumps, solder lands and metal pads for further surface mounting process.

26. A method of making a package structure as claimed in claim 1, wherein the said package structure, after pre-bonding and encapsulating steps, can have solder balls, solder bumps, solder lands and metal pads formed on the outside surface of one side and both sides of the said package structure.

27. A method of making a package structure as claimed in claim 1, wherein the said package structure can have heat-conductive pads to integrate or connect with heat-dispatching elements like fin, micro-fin, heat pipes, micro channels to enhance cooling performance.

28. A method of making a package structure as claimed in claim 1, wherein the said elements formed on substrate are made on a plurality of regions of substrate with spatial separation formed by lid or cover substrate for preventing the signal interference among the elements.

29. A method of making a package structure, comprising the steps of:

provinding at least two substrates for composing the package structure;

making functional elements on at least one of the substrate;

fabricating alignment aiding microstructures assembling discrete elements, dies and devices onto at least one of the substrate;

forming part of electrical interconnection among the integrated elements and assembled discrete elements on one side or both sides of the said substrates;

making electrical conduction line and lead line on at least one of the substrate for further constructing electrical conduction and signal connection between two different substrates;

forming interposers, micro-joints and microstructures on a portion of surface of at least one of the substrate aligning and pre-bonding a substrate with the said alignment aiding microstructures, interposers and micro-joints to another substrate; the process of alignment and bonding are done with the aids of alignment aiding microstructures which are formed on specific locations on upper side of a lower-substrate and on relative locations on backside of another upper-substrate, where the bonding interface is formed by connecting the aforementioned upper side to backside of two substrates; thus a substrate of a stack of two substrates having a pre-bonded interface is formed;

forming a completely sealed interface between the pre-bonded interfaces of substrates by encapsulating the interfaces via through-hole microstructures, therefore a completely sealed package interface of each packaged devices or apparatus in the form of the said package is done and separating each packaged structures, devices or apparatus in the form of the said package.

30. A method of making a package structure as claimed in claim 29, wherein the said substrates are materials of semiconductors, compound semiconductor, metals, plastics, polymers, ceramics and glasses.

31. A method of making a package structure as claimed in claim 29, wherein the said substrates are substrates of wafer form.

32. A method of making a package structure as claimed in claim 29, wherein the said function elements are microelectronics; passive elements of resistors, capacitors and inductors; optoelectronics; laser diodes; photo-detectors; photo-sensors; microelectromechanical systems, micro-fluidic systems, micro-total-analysis systems, bio-medical devices, bio-chips, bio-sensors and micro-opto-electro-mechanical systems.

33. A method of making a package structure as claimed in claim 29, wherein the said assembled and integrated functional elements, dies and devices inside the said package structure comprise plural functions, such as, computing, sensing, actuating, adjusting and controlling, then the said package structures are devices and apparatus in a format of system-in-a-package (SiP).

34. A method of making a package structure as claimed in claim 29, wherein the said assembled and integrated functional elements, dies and devices inside the said package structure comprise plural functions, such as, computing, sensing, actuating, adjusting and controlling; wherein the said substrates are substrates of wafer form. Then the said package structures are devices and apparatus in a format of wafer-level-system-in-a-package (WLSiP).

35. A method of making a package structure as claimed in claim 29, wherein the technologies for assembling discrete elements or dies or devices onto at least one of the substrate are solder bonding, eutectic bonding, adhesive bonding, wire bonding and flip-chip bonding.

36. A method of making a package structure as claimed in claim 29, wherein the said interposers, micro-joints and microstructures between the pre-bonded substrates can make a spatial spacing of interface of appropriate height, therefore a space formed due to the microstructures of this height can offer a room to accommodate the protruding microstructures such as assembled elements, dies and devices; three dimensional micro-electro-mechanical structures of sensors, actuators, three dimensional opto-electronics elements and fluidic channels.

37. A method of making a package structure as claimed in claim 29, wherein cavities made on the substrates before the pre-bonding process can lead to a spatial room of appropriate height inside the package structure after pre-bonding and encapsulating processes, therefore a space formed due to the cavities can offer a room to accommodate the protruding microstructures such as assembled elements, dies and devices; three dimensional micro-electro-mechanical structures of sensors, actuators, three dimensional opto-electronics elements and fluidic channels, wherein the said cavities can have various heights.

38. A method of making a package structure as claimed in claim 29, wherein the said alignment aiding microstructures, interposers and micro-joints are eutectic metal structures, solder structures, metal structures, polymer structures, ceramics structures, glass structures, rubber structures, plastic structures, adhesive structures, micro-spring structures, microstructures of stress and impact buffer effect and a combination structure of the above structures.

39. A method of making a package structure as claimed in claim 29, wherein the said alignment aiding microstructures, interposers and micro-joints are any shapes and morphology in three dimensional.

40. A method of making a package structure as claimed in claim 29, wherein the said alignment aiding microstructures, interposers and micro-joints, are three dimensional concave structures on one side of a substrate and be three dimensional convex structures on one side of another substrate, thereafter these said two sides will form the bonding interface.

41. A method of making a package structure as claimed in claim 29, wherein the said alignment aiding microstructures can enhance the bonding interface strength; wherein the said alignment aiding microstructures can enhance the mechanical strength of the contacting points for the electrical signal I/Os.

42. A method of making a package structure as claimed in claim 29, wherein the said alignment aiding microstructures can have function of interface stress buffer and buffer for releasing the impact during pre-bonding and encapsulating process.

43. A method of making a package structure as claimed in claim 29, wherein the said alignment aiding microstructures are three dimensional micro-spring structures in order to have function of interface stress buffer and buffer for releasing the impact during pre-bonding and encapsulating process.

44. A method of making a package structure as claimed in claim 29, wherein the pre-bonding process are conducted with the aids of precision alignment tools; wherein the pre-bonding process are conducted with the aids of additional energy coming from ultrasonic, heat, infrared radiation, or microwave source.

45. A method of making a package structure as claimed in claim 29, wherein the said interposers, micro-joints and microstructures structure for aligning and pre-bonding substrates can constitute an interface of enclosed-shape bonding ring, an interface of discrete bonding, contact area and the combination of these two formats on different locations of substrates.

46. A method of making a package structure as claimed in claim 29, wherein the materials used in the process of the said encapsulating interface process, in the other words, the said process of forming a completely sealed interface between the pre-bonded interfaces of substrates, are epoxy resin, polyimide, silicone, BCB (benzocy-clobutene), photoresist, liquid crystal, polymers, rubbers, glasses, ceramics, metals and the combinations of these materials.

47. A method of making a package structure as claimed in claim 29, wherein the materials used in the process of the said encapsulating interface process, in the other words, the said process of forming a completely sealed interface between the pre-bonded interfaces of substrates, are processes that liquid type encapsulating materials flows into the package structure via the through-hole microstructures when external extruding and pressing aids are used to accelerate the encapsulation process.

48. A method of making a package structure as claimed in claim 29, wherein the through-hole microstructures are made to be the inlet for encapsulating process.

49. A method of making a package structure as claimed in claim 29, wherein micro-channels and microstructures are made to lead the flow of encapsulating materials inside particular path and channel without overflowing to other area, then the said elements and three dimensional structures are protected from damage during encapsulating process.

50. A method of making a package structure as claimed in claim 29, wherein plural steps of the said aligning and pre-bonding process are done in order to make bonded substrate, which is a stack of multiple substrates.

51. A method of making a package structure as claimed in claim 29, wherein the said package structure is provided with both fan-out and fan-in formats of electrical interconnections, electrical conductive lines, heat-transferring paths and heat dispatching paths; the pitch between each pair of I/O are designed, changed and made according to different application needs; the electrical signal are routed and arranged by making multilayer of electrical interconnections and insulating layers in order to complex three dimensional electrical interconnection structures thereof the said redistribution process.

52. A method of making a package structure as claimed in claim 29, wherein the electric interconnection and signal I/O contacts inside the said package structure among different functional elements and dies are formed by bonding metal wires, depositing metal lines, plating metal lines, soldering, making conductive polymer and making bumping process of flip-chip technology.

53. A method of making a package structure as claimed in claim 29, wherein the optical interconnection and signal I/O contacts of the said package structure are formed by using optical waveguide elements, or adopting elements for enabling free space optical communications.

54. A method of making a package structure as claimed in claim 29, wherein the said package structure can consist of solder balls, solder bumps, solder lands and metal pads formed on the surface of one side and both sides of the said substrates.

55. A method of making a package structure as claimed in claim 29, wherein the signal I/O contacts of the said package structure to outside systems and other separate devices are metal pads for further wire bonding, UBM layers for further growing solder, gold bumps and a solder bumps, solder lands and metal pads for further surface mounting process.

56. A method of making a package structure as claimed in claim 29, wherein the said package structure, after pre-bonding and encapsulating steps, can have solder balls, solder bumps, solder lands and metal pads formed on the outside surface of one side and both sides of the said package structure.

57. A method of making a package structure as claimed in claim 29, wherein the said package structure can have heat-conductive pads to integrate or connect with heat-dispatching elements like fin, micro-fin, heat pipes and micro channels to enhance cooling performance.

58. A method of making a package structure as claimed in claim 29, wherein the said elements formed on substrate are made on a plurality of regions of substrate with spatial separation formed by lid substrate for preventing the signal interference among the elements.

59. The method for making package structure,
providing at least two substrates for composing the package structure;
making functional elements on at least one of the substrate;
assembling discrete elements, dies and devices onto at least one of the substrate;
forming part of electrical interconnection among the integrated elements and assembled discrete elements on one side or both sides of the said substrates;
making electrical conduction line and lead line on at least one of the substrate for further constructing electrical conduction and signal connection between two different substrates;
forming interposers, micro-joints and microstructures on a portion of surface of at least one of the substrate;
aligning and pre-bonding a substrate with the said interposers, micro-joints and microstructures to another substrate; thereafter, the appropriate spacing provided by the corresponding said interposers, micro-joints and microstructures between the pre-bonded substrates, may accommodate and protect the integrated and hybrid assembled elements on the substrates;
forming a completely sealed interface between the pre-bonded interfaces of substrates by applying fluidic encapsulating materials to seal the interfaces via through-hole microstructures, guiding the fluidic encapsulating materials inside the through-hole microstructures and package structures by making a difference of the internal and external pressure between the operating environment and the inner space of the said package structure; Therefore, the flowability of the fluid encapsulating materials will become better, thus the space needed to be filled up are fulfilled perfectly and the encapsulating process will be finished faster;
therefore a completely sealed package interface of each packaged devices or apparatus in the form of the said package is done and
separating each packaged structures, devices or apparatus in the form of the said package.

60. The method for making package structure,
providing at least two substrates for composing the package structure;
making functional elements on at least one of the substrate;
assembling discrete elements, dies and devices onto at least one of the substrate;
forming part of electrical interconnection among the integrated elements and assembled discrete elements on one side or both sides of the said substrates;
forming interposers, micro-joints and microstructures on a portion of surface of at least one of the substrate;
forming getter coating and adding getter materials on substrates; where the said getter are absorber and collector for various gases, liquids or solids;
aligning and pre-bonding a substrate with the said interposers micro-joints and microstructures to another substrate; thereafter, the appropriate spacing provided by the corresponding said interposers, micro-joints and microstructures between the pre-bonded substrates, in order to accommodate and protect the integrated and hybrid assembled elements on the substrates;
forming a completely scaled interface between the pre-bonded interfaces of substrates by applying fluidic encapsulating materials to seal the interfaces via through-hole microstructures;
therefore a completely scaled package interface of each packaged devices or apparatus in the form of the said package is done and
separating each packaged structures, devices or apparatus in the form of the said package.

61. A method of making a package structure comprising:
providing at least two wafers for composing the package structure;

making functional elements on at least one of the wafer;

assembling discrete elements, dies and devices onto at least one of the wafer;

forming part of electrical interconnection among the integrated elements and assembled discrete elements on one side or both sides of the said wafers;

making electrical conduction line and lead line on at least one of the wafer for further constructing electrical conduction and signal connection between two different wafers;

executing the wafer level testing for measurement of system level performance of the said system-in-a-package (SiP) are proceeded by using probes and probe card to contact the metal pads and conductive microstructures of the said package structures to form the electrical connection between the testing equipment and elements needed to be tested; then signals and bias are applied to measure and test the said elements;

during the wafer level testing process, the assembled elements and devices of malfunction are identified and replaced;

forming interposers, micro-joints and microstructures on a portion of surface of at least one of the wafer;

aligning and pre-bending a substrate with the said interposers, micro-joints and microstructures to another substrate; thereafter, the appropriate spacing provided by the corresponding said interposers, micro-joints and microstructures between the pre-bonded substrates, in order to accommodate and protect the integrated and hybrid assembled elements on the substrates;

forming a completely sealed interface between the pre-bonded interfaces of substrates by encapsulating the interfaces via through-hole microstructures, therefore a completely sealed package interface of each packaged devices or apparatus in the form of the said package is done;

executing the wafer level testing to identify the good packaged structures and devices of the said system-in-a-package (SiP) format are proceeded by using probes and probe card to contact the metal pads and conductive microstructures of the said package structures to form the electrical connection between the testing equipment and elements needed to be tested; then signals and bias are applied to measure and test the said elements and separating each packaged structures, devices or apparatus in the form of the said package.

62. A method of making a package structure comprising:

providing at least two wafers for composing the package structure;

making functional elements on at least one of the wafer;

assembling discrete elements, dies and devices onto at least one of the wafer;

forming part of electrical interconnection among the integrated elements and assembled discrete elements on one side or both sides of the said wafers;

making electrical conduction line and lead line on at least one of the wafer for further constructing electrical conduction and signal connection between two different wafers;

executing the wafer level testing for measurement of system level performance of the said system-in-a-package (SiP) are proceeded by using probes and probe card to contact the metal pads and conductive microstructures of the said package structures to form the electrical connection between the testing equipment and elements needed to be tested; then signals and bias are applied to measure and test the said elements;

during the wafer level testing process, the properties of the said passive elements and devices are trimmed to become better and precisely;

forming interposers, micro-joints and microstructures on a portion of surface of at least one of the wafer;

aligning and pre-bonding a substrate with the said interposes, micro-joints and microstructures to another substrate; thereafter, the appropriate spacing provided by the corresponding said interposers, micro-joints and microstructures between the pre-bonded substrates, in order to accommodate and protect the integrated and hybrid assembled elements on the substrates;

forming a completely sealed interface between the pre-bonded interfaces of substrates by encapsulating the interfaces via through-hole microstructures, therefore a completely scaled package interlace of each packaged devices or apparatus in the form of the said package is done;

executing the wafer level testing to identify the good packaged structures and devices of the said system-in-a-package (SiP) format are proceeded by using probes and probe card to contact the metal pads and conductive microstructures of the said package structures to form the electrical connection between the testing equipment and elements needed to be tested; then signals and bias are applied to measure and test the said elements and separating each packaged structures, devices or apparatus in the form of the said package.

63. A method of making a package structure comprising:

providing at least two wafers for composing the package structure;

making functional elements on at least one of the wafer;

assembling discrete elements, dies and devices onto at least one of the wafer;

forming part of electrical interconnection among the integrated elements and assembled discrete elements on one side or both sides of the said wafers;

making electrical conduction line and lead line on at least one of the wafer for further constructing electrical conduction and signal connection between two different wafers;

executing the wafer level testing for measurement of system level performance of the said system-in-a-package (SiP) are proceeded by using probes and probe card to contact the metal pads and conductive microstructures of the said package structures to form the electrical connection between the testing equipment and elements needed to be tested; then signals and bias are applied to measure and test the said elements;

forming interposers, micro-joints and microstructures on a portion of surface of at least one of the wafer;

aligning and pre-bonding a substrate with the said interposers, micro-joints and microstructures to another substrate; thereafter, the appropriate spacing provided by the corresponding said interposers, micro-joints and microstructures between the pre-bonded substrates, in order to accommodate and protect the integrated and hybrid assembled elements on the substrates;

forming a completely scaled interface between the pre-bonded interfaces of substrates by encapsulating the interfaces via through-hole microstructures, therefore a completely sealed package interface of each packaged devices or apparatus in the form of the said package is done;

executing the wafer level testing to identify the good packaged structures and devices of the said system-in-a-package (SiP) format are proceeded by using probes and probe card to contact the metal pads and conductive microstructures of the said package structures to form the electrical connection between the testing equipment and elements needed to be tested; then signals and bias are applied to measure and test the said elements;

the said package structure are put into the environmental testing oven, and with the probes or wafer-level probe card for applying external signals and bias, in order to proceed the reliability testing, such as, aging treatment tests, and the burn-in process and separating each packaged structures, devices or apparatus in the form of the said package.

* * * * *